US009412952B2

(12) United States Patent
Fukuzaki et al.

(10) Patent No.: US 9,412,952 B2
(45) Date of Patent: Aug. 9, 2016

(54) PHOTOELECTRIC CONVERSION ELEMENT AND METHOD OF USING THE SAME, IMAGE SENSOR, AND OPTICAL SENSOR

(71) Applicant: FUJIFILM CORPORATION, Tokyo (JP)

(72) Inventors: Eiji Fukuzaki, Ashigara-kami-gun (JP); Kimiatsu Nomura, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 185 days.

(21) Appl. No.: 14/181,308

(22) Filed: Feb. 14, 2014

(65) Prior Publication Data

US 2014/0158859 A1    Jun. 12, 2014

Related U.S. Application Data

(63) Continuation of application No. PCT/JP2012/069349, filed on Jul. 30, 2012.

(30) Foreign Application Priority Data

Aug. 16, 2011 (JP) ................................. 2011-178047

(51) Int. Cl.
*H01L 51/00* (2006.01)
*H01L 51/44* (2006.01)
(Continued)

(52) U.S. Cl.
CPC ............ *H01L 51/0056* (2013.01); *B82Y 10/00* (2013.01); *C09B 3/14* (2013.01); *C09B 3/78* (2013.01); *H01L 51/44* (2013.01); *H01L 51/0046* (2013.01); *H01L 51/4273* (2013.01)

(58) Field of Classification Search
None
See application file for complete search history.

(56) References Cited

U.S. PATENT DOCUMENTS 6,747,287 B1 * 6/2004 Toguchi .............. H01L 51/0056
257/40
7,675,057 B2    3/2010 Drechsel et al.
(Continued)

FOREIGN PATENT DOCUMENTS

JP    2006-520533 A    9/2006
JP    2007-335760 A    12/2007
(Continued)

OTHER PUBLICATIONS

An Office Action; "Notification of Reasons for Refusal," issued by the Japanese Patent Office on Dec. 2, 2014, which corresponds to Japanese Patent Application No. 2011-178047 and is related to U.S. Appl. No. 14/181,308; with English laguage translation.
(Continued)

*Primary Examiner* — Ling Choi
*Assistant Examiner* — Catherine S Branch
(74) *Attorney, Agent, or Firm* — Studebaker & Brackett PC

(57) ABSTRACT

A photoelectric conversion element includes a transparent conductive film, a conductive film, and a photoelectric conversion layer and an electron-blocking layer disposed between the transparent conductive film and the conductive film. The photoelectric conversion layer includes a condensed polycyclic hydrocarbon which contains at least 5 benzene rings, of which a total number of rings is 7 or more and which contains no carbonyl group. The electron-blocking layer includes a compound A having a residue after removal of at least one group of $R_{a1}$ to $R_{a9}$ from a compound represented by general formula (A) and having a glass transition point (Tg) of 200° C. or more. The photoelectric conversion element exhibits high photoelectric conversion efficiency and low dark current characteristics even after heating treatment, and can be manufactured with high productivity.

11 Claims, 2 Drawing Sheets

(51) Int. Cl.
*B82Y 10/00* (2011.01)
*C09B 3/14* (2006.01)
*C09B 3/78* (2006.01)
*H01L 51/42* (2006.01)

(56) References Cited

U.S. PATENT DOCUMENTS

| | | | |
|---|---|---|---|
| 2007/0090371 A1 | 4/2007 | Drechsel et al. | |
| 2011/0063485 A1* | 3/2011 | Nomura | B82Y 10/00 348/294 |
| 2011/0108821 A1 | 5/2011 | Kaiser et al. | |
| 2011/0194000 A1 | 8/2011 | Suzuki et al. | |
| 2011/0256422 A1 | 10/2011 | Reichelt et al. | |
| 2012/0048377 A1 | 3/2012 | Winzenberg et al. | |
| 2012/0080585 A1 | 4/2012 | Fukuzaki et al. | |
| 2012/0098079 A1 | 4/2012 | Suzuki | |

FOREIGN PATENT DOCUMENTS

| | | |
|---|---|---|
| JP | 2008-135540 A | 6/2008 |
| JP | 2009-235295 A | 10/2009 |
| JP | 2011-082507 A | 4/2011 |
| JP | 2011-082508 A | 4/2011 |
| JP | 2011-187918 A | 9/2011 |
| JP | 2012-094660 A | 5/2012 |
| WO | 2010/012328 A1 | 2/2010 |
| WO | 2010/049512 A1 | 5/2010 |
| WO | 2010/099583 A1 | 9/2010 |
| WO | 2010140645 A1 | 12/2010 |

OTHER PUBLICATIONS

Notification of Transmittal of Translation of the International Preliminary Report on Patentability (Chapter I of the Patent Cooperation Treaty) and Translation of Written Opinion of the International Searching Authority; PCT/JP2012/069349 issued on Feb. 27, 2014.
An Office Action; "Notification of Reasons for Refusal," issued by the Japanese Patent Office on Jun. 16, 2015, which corresponds to Japanese Patent Application No. 2011-178047 and is related to U.S. Appl. No. 14/181,308; with English language partial translation.
Inokuchi et al.; "The Photovoltaic Behavior in Organic Compounds"; Aug. 1961; pp. 1093-1096; vol. 34, No. 8; Bulletin of the Chemical Society of Japan.
Turak, et al.; "Nanoscale Engineering of Exciton Dissociating Interfaces in Organic Photovoltaics"; 2011; vol. 14; pp. 125-136; Jamal of Nano Research.
Wagner et al.; "High Fill Factor and Open Circuit Voltage in Organic Photovoltaic Cells with Diindenoperylene as Donor Material"; Nov. 11, 2010; pp. 4295-4303; vol. 20, Issue 24; Advanced Functional Materials.
International Search Report; PCT/JP2012/069349; Aug. 28, 2012.
An Office Action; "Notification of Reasons for Refusal," issued by the Korean Patent Office on Oct. 26, 2015, which corresponds to Korean Patent Application No. 10-2014-7003913 and is related to U.S. Appl. No. 14/181,308; with English language partial translation.

* cited by examiner

US 9,412,952 B2

PHOTOELECTRIC CONVERSION ELEMENT AND METHOD OF USING THE SAME, IMAGE SENSOR, AND OPTICAL SENSOR

CROSS REFERENCE TO RELATED APPLICATIONS

This application is a continuation application of International Application PCT/JP2012/069349 filed on Jul. 30, 2012, which claims priority under 35 U.S.C. 119(a) to Application No. 2011-178047 filed in Japan on Aug. 16, 2011, all of which are hereby expressly incorporated by reference into the present application.

BACKGROUND OF THE INVENTION

The present invention relates to a photoelectric conversion element and a method of using the same, an image sensor, and an optical sensor.

A conventional optical sensor is a device having photodiodes (PDs) formed in a semiconductor substrate made of, for example, silicon (Si) and a planar solid-state image sensor in which PDs are two-dimensionally arranged to read out signal charges generated in the respective PDs is widely used as the solid-state image sensor.

The structure in which color filters for transmitting light having specific wavelengths therethrough are disposed on the light incidence surface side of a planar solid-state image sensor is common in order to realize a color solid-state image sensor. At present, a single-plate solid-state image sensor which is widely used in a digital camera or other device and in which color filters for transmitting blue (B) light, green (G) light and red (R) light therethrough are regularly disposed on individual PDs in a two-dimensional array is well known.

The single-plate solid-state image sensor does not use light which did not pass through the color filters and hence suffers from poor light use efficiency. In recent years, the pixel size is decreasing with a view to increasing the number of pixels and there arise problems such as a decrease in aperture ratio and a decrease in light collection efficiency.

In order to solve these defects, a structure is known in which an amorphous silicon photoelectric conversion layer or an organic photoelectric conversion layer is formed on a substrate for reading out signals.

Several examples are known for the photoelectric conversion element, image sensor and optical sensor using the organic photoelectric conversion layer. Particularly in the photoelectric conversion element using the organic photoelectric conversion layer, the photoelectric conversion efficiency is to be improved while reducing the dark current. As the improvement methods, it is disclosed to introduce a p-n junction or a bulk heterojunction structure for the former purpose and to introduce a blocking layer for the latter purpose.

For instance, JP 2007-335760 A discloses a photoelectric conversion layer containing an acene compound which has high photoelectric conversion efficiency.

SUMMARY OF THE INVENTION

On the other hand, in cases where the photoelectric conversion element is applied to various uses such as an image sensor and a photoelectric cell, the photoelectric conversion element is required to exhibit high heat resistance in terms of processability. For instance, the process in the formation of an image sensor includes a lot of heating treatment steps including, for example, setting of color filters, formation of a protective film and soldering of the element, and the photoelectric conversion element is required to exhibit excellent characteristics (high photoelectric conversion efficiency and low dark current characteristics) even after these steps.

The material for use in the photoelectric conversion element is required to have heat resistance also in terms of improving the productivity of the photoelectric conversion element.

For instance, it is required to improve the vapor deposition rate during the formation of the photoelectric conversion layer in order to enhance the production efficiency of the photoelectric conversion element. On the other hand, in order to increase the vapor deposition rate, the material to be used must be heated to a higher temperature and hence withstand the temperature.

The vapor deposition time is also required to be prolonged in order to omit the material refilling time, but also in this case, the material to be used must withstand for a long time without decomposing at high temperatures.

The inventors of the invention have made a study on the heat resistance of the photoelectric conversion element described in JP 2007-335760 A and found that the photoelectric conversion efficiency significantly deteriorates after heating treatment compared to before heating treatment and occurrence of dark current increases, whereby a further improvement is required.

In view of the situation as described above, an object of the present invention is to provide a photoelectric conversion element which exhibits high photoelectric conversion efficiency and low dark current characteristics even in cases where heating treatment is performed, and which is capable of being manufactured with high productivity.

The present invention also aims at providing a method of using the photoelectric conversion element, and an image sensor and an optical sensor containing the photoelectric conversion element.

The inventors of the invention have made an intensive study on the above objects and as a result found that these objects can be achieved by using a photoelectric conversion layer containing a condensed polycyclic hydrocarbon having a predetermined number of benzene rings and an electron-blocking layer containing a compound having a predetermined structure, and the invention has been thus completed.

Specifically, the foregoing objects can be achieved by the means described below.

(1) A photoelectric conversion element comprising: a transparent conductive film, a conductive film, and a photoelectric conversion layer and an electron-blocking layer disposed between the transparent conductive film and the conductive film, wherein the photoelectric conversion layer comprises a condensed polycyclic hydrocarbon which contains at least 5 benzene rings, of which a total number of rings is 6 or more and which contains no carbonyl group, and wherein the electron-blocking layer comprises a compound A including a residue after removal of at least one group of $R_{a1}$ to $R_{a9}$ from a compound represented by general formula (A) to be described later and having a glass transition point (Tg) of 200° C. or more.

(2) The photoelectric conversion element according to (1), wherein the total number of rings of the condensed polycyclic hydrocarbon is 7 or more.

(3) The photoelectric conversion element according to (1) or (2), wherein the condensed polycyclic hydrocarbon comprises a condensed polycyclic hydrocarbon represented by any one of general formulae (1) to (17) to be described later.

(4) The photoelectric conversion element according to any one of (1) to (3), wherein the compound A comprises a compound represented by general formula (F-1), general formula (F-2) or general formula (F-5).
(5) The photoelectric conversion element according to any one of (1) to (4), wherein the photoelectric conversion layer further comprises a fullerene or a fullerene derivative.
(6) The photoelectric conversion element according to any one of (1) to (5), wherein the photoelectric conversion layer is formed by vacuum deposition.
(7) The photoelectric conversion element according to (6), wherein a vapor deposition rate of the condensed polycyclic hydrocarbon is 1.0 angstrom/s or more.
(8) The photoelectric conversion element according to any one of (1) to (7), wherein the transparent conductive film comprises a transparent conductive metal oxide.
(9) The photoelectric conversion element according to any one of (1) to (8), wherein light is allowed to enter the photoelectric conversion layer through the transparent conductive film.
(10) An image sensor comprising the photoelectric conversion element according to any one of (1) to (9).
(11) An optical sensor comprising the photoelectric conversion element according to any one of (1) to (9).
(12) A method of using the photoelectric conversion element according to any one of (1) to (9),
wherein the conductive film and the transparent conductive film form an electrode pair and an electric field of $1 \times 10^{-4}$ to $1 \times 10^{7}$ V/cm is applied across the electrode pair.

The invention can provide a photoelectric conversion element which exhibits high photoelectric conversion efficiency and low dark current characteristics even in cases where heating treatment is performed, and which is capable of being manufactured with high productivity.

The invention can also provide a method of using the photoelectric conversion element, and an image sensor and an optical sensor containing the photoelectric conversion element.

DETAILED DESCRIPTION OF THE INVENTION

Figure 1A:
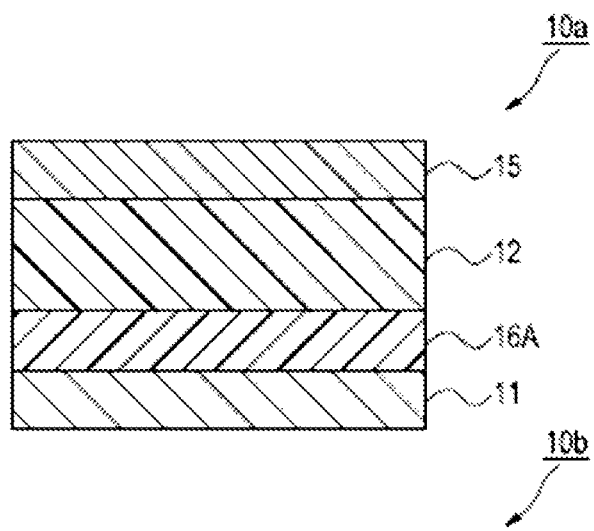
FIGS. 1A and 1B are schematic cross-sectional views each showing an exemplary configuration of a photoelectric conversion element.

The photoelectric conversion element of the invention is described below. The characteristic features of the invention compared to the prior art are first described in detail.

Conventional materials for use in photoelectric conversion elements (photoelectric conversion dyes, electron-blocking materials) had high charge collection efficiency and low dark current characteristics but the heat resistance was not sufficient. Possible means to improve the heat resistance include increasing the molecular weight of the compound to be used to enhance the interaction of the compound (intermolecular force) and introducing a lot of ring structures to lower the molecular degree of freedom.

However, in general, a π conjugated system extends widely in a compound having a large interaction and a compound having a ring structure. Therefore, if these materials are used as the photoelectric conversion dye and the material for the electron-blocking layer, the photoelectric conversion dye interacts with the material for the electron-blocking layer to form source charges and trapped charges at the interface, whereby the dark current is likely to increase, whereas the photoelectric conversion efficiency is likely to decrease.

At the interface between the electron-blocking layer and the photoelectric conversion layer, in cases where a compound having a ring structure is vapor-deposited on the electron-blocking layer different in properties such as dipole moment and surface energy, the compound having a ring structure is likely to associate to form aggregates, which may reduce the performance. In particular, heating of the photoelectric conversion element promotes molecular motion in the electron-blocking layer and the photoelectric conversion layer, thus causing further formation of aggregates and performance reduction.

In addition, a high-molecular-weight material having a high van der Waals force is generally selected as the material having high heat resistance. On the other hand, the temperature at which the high-molecular-weight material can be vapor-deposited is high and thermal decomposition of the material is likely to occur during vapor deposition. If the material is decomposed, the decomposed material is vapor-deposited in the photoelectric conversion layer and acts as an excitation quencher or a carrier trap site, which may deteriorate the performance of the element.

However, unlike the prior art as described above, this invention uses a predetermined photoelectric conversion dye and a predetermined electron-blocking layer material in combination, making it possible to improve the heat resistance without deteriorating the high charge collection efficiency and the low dark current characteristics. In particular, a compound A including a residue after removal of at least one group of $Ra_1$ to $Ra_9$ from a compound represented by general formula (A) for use as the material of the electron-blocking layer (condensed diaryl amine) is likely to have a planar molecular structure and is close in nature to the condensed polycyclic hydrocarbon for use in the invention (low dipole moment). Such a compound A is hereinafter also referred to simply as "compound A." Therefore, the use of the compound A as the material of the electron-blocking layer is supposed to suppress the aggregation of the condensed polycyclic hydrocarbon at the interface between the electron-blocking layer and the photoelectric conversion layer and the formation of aggregates to prevent performance deterioration. Furthermore, it is considered that, since the condensed polycyclic hydrocarbon has a condensed structure and the molecular motion is suppressed, aggregates are unlikely to be formed during heating of the photoelectric conversion element and the heat resistance of the photoelectric conversion element is also improved. In particular, film formation at a higher vapor deposition rate of the condensed polycyclic hydrocarbon hinders molecular rearrangement on the film and therefore further suppresses the formation of aggregates.

Figure 1B:
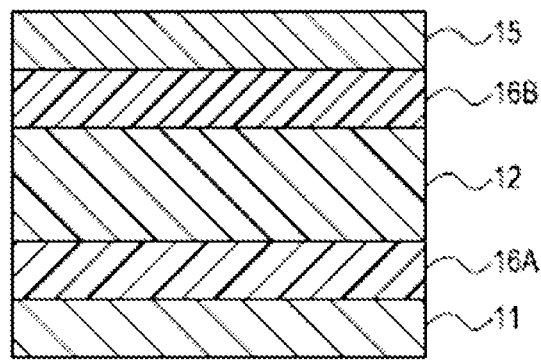

The photoelectric conversion element of the invention is described below with reference to the drawings. FIGS. 1A and 1B are schematic cross-sectional views showing embodiments of the photoelectric conversion element of the invention.

A photoelectric conversion element 10a shown in FIG. 1A has such a configuration that a conductive film serving as a lower electrode (hereinafter also referred to as "lower electrode") 11, an electron-blocking layer 16A formed on the lower electrode 11, a photoelectric conversion layer 12 formed on the electron-blocking layer 16A, and a transparent conductive film serving as an upper electrode (hereinafter also referred to as "upper electrode") 15 are laminated in this order.

Another exemplary configuration of the photoelectric conversion element is shown in FIG. 1B. A photoelectric conversion element 10b shown in FIG. 1B has such a configuration that an electron-blocking layer 16A, a photoelectric conversion layer 12, a hole-blocking layer 16B, and an upper electrode 15 are laminated in this order on a lower electrode 11. The electron-blocking layers 16A, the photoelectric conversion layers 12 and the hole-blocking layer 16B in FIGS. 1A and 1B may be formed in reverse order according to the intended use and characteristics. For instance, the electron-blocking layer 16A and the photoelectric conversion layer 12 may be at the opposite positions.

In the configuration of the photoelectric conversion element 10a (10b), light is preferably allowed to enter the photoelectric conversion layer 12 through the transparent conductive film 15.

In the case of using the photoelectric conversion element 10a (10b), an electric field may also be applied. In this case, an electric field of $1 \times 10^{-5}$ to $1 \times 10^7$ V/cm is preferably applied across an electrode pair formed with the conductive film 11 and the transparent conductive film 15. It is preferred to apply an electric field of $1 \times 10^{-4}$ to $1 \times 10^6$ V/cm and particularly $1 \times 10^{-3}$ to $5 \times 10^5$ V/cm in terms of performance and power consumption.

With regard to the voltage application method, it is preferred to apply a voltage so that the electron-blocking layer 16A side may be a cathode and the photoelectric conversion layer 12 side be an anode in FIGS. 1A and 1B. A voltage may also be applied in the same manner in both of a case in which the photoelectric conversion element 10a (10b) is used as an optical sensor and a case in which the photoelectric conversion element is incorporated in an image sensor.

Embodiments of the respective layers (photoelectric conversion layer 12, the electron-blocking layer 16A, the lower electrode 11, the upper electrode 15, the hole-blocking layer 16B) making up the photoelectric conversion element 10a (10b) are described below in detail.

The photoelectric conversion layer 12 is first described below in detail.

[Photoelectric Conversion Layer]

The photoelectric conversion layer 12 is a layer including, as the photoelectric conversion material, a condensed polycyclic hydrocarbon which contains at least 5 benzene rings, of which the total number of rings is 6 or more and which contains no carbonyl group. The photoelectric conversion element which exhibits high photoelectric conversion efficiency and low dark current characteristics and in which deterioration of these characteristics is suppressed even after heating treatment can be obtained by using this compound.

The photoelectric conversion layer 12 is usually a film made of a solid. By eliminating fluid portions from all the constituent portions of the photoelectric conversion element 10a (10b) including the photoelectric conversion layer 12, the conductive film 11 and the transparent conductive film 15, the resulting photoelectric conversion element has good resistance to heat deformation and high heat resistance of around 200° C. and as a result high reliability of the element itself is obtained.

The condensed polycyclic hydrocarbon that may be used in the photoelectric conversion layer 12 is first described in detail.

(Condensed Polycyclic Hydrocarbon (Condensed Polycyclic Hydrocarbon Compound))

The condensed polycyclic hydrocarbon contains at least 5 benzene rings. In particular, the number of contained benzene rings is preferably from 7 to 15, more preferably from 7 to 12, even more preferably from 7 to 10 and most preferably from 8 to 10. When the number of benzene rings is within the above-defined range, the photoelectric conversion layer 12 has excellent light-absorbing properties and the photoelectric conversion element also has excellent heat resistance.

When the number of benzene rings is less than 5, the photoelectric conversion element has poor heat resistance and is inferior in photoelectric conversion efficiency and dark current characteristics after heating.

The total number of rings in the condensed polycyclic hydrocarbon is 6 or more. In other words, the condensed polycyclic hydrocarbon has 6 or more ring structures. In particular, the total number of rings is preferably from 7 to 15, more preferably from 7 to 12, even more preferably from 7 to 10 and most preferably from 8 to 10 because the photoelectric conversion element has more excellent heat resistance and the deterioration of the photoelectric conversion efficiency and the dark current characteristics after heating is more suppressed. When the total number of rings is within the above-defined range, the photoelectric conversion layer 12 has excellent light-absorbing properties and the photoelectric conversion element also has excellent heat resistance.

When the total number of rings is less than 6, the photoelectric conversion element has poor heat resistance and is inferior in photoelectric conversion efficiency and dark current characteristics after heating.

The condensed polycyclic hydrocarbon contains no carbonyl group. If the condensed polycyclic hydrocarbon contains a carbonyl group, the photoelectric conversion element is inferior in dark current characteristics and photoelectric conversion characteristics and the photoelectric conversion element also has poor heat resistance.

The condensed polycyclic hydrocarbon may contain a ring structure other than the benzene ring. Examples of the other ring structure include cyclic aliphatic hydrocarbon groups such as cyclopentane ring, cyclohexane ring and cycloheptane ring, and aromatic rings other than the benzene ring such as an aromatic heterocyclic ring.

The molecular weight of the condensed polycyclic hydrocarbon is not particularly limited and is preferably from 300 to 1,500, more preferably from 500 to 1,000, and most preferably from 500 to 900 because the productivity using vacuum deposition is more excellent and the photoelectric conversion element has more excellent heat resistance. Too large a molecular weight increases the vapor deposition temperature to induce molecular decomposition. Too small a molecular weight lowers the glass transition point of the film formed by vapor deposition, which may deteriorate the heat resistance of the photoelectric conversion element.

The condensed polycyclic hydrocarbon preferably has absorption maximum at 400 nm or more but less than 720 nm in the ultraviolet-visible absorption spectrum. The peak wavelength of the absorption spectrum (absorption maximum wavelength) is preferably 450 nm or more but up to 700 nm, more preferably 480 nm or more but up to 700 nm and even more preferably 510 nm or more but up to 680 nm in terms of wide absorption of light in the visible region.

A solution of the condensed polycyclic hydrocarbon in chloroform can be used to measure the absorption maximum wavelength of the condensed polycyclic hydrocarbon in UV-2550 manufactured by Shimadzu Corporation. The chloroform solution preferably has a concentration of $5 \times 10^{-5}$ to $1 \times 10^{-7}$ mol/L, more preferably $3 \times 10^{-5}$ to $2 \times 10^{-6}$ mol/L and most preferably $2 \times 10^{-5}$ to $5 \times 10^{-6}$ mol/L.

The condensed polycyclic hydrocarbon preferably has a glass transition point (Tg) of 95° C. or more, more preferably 110° C. or more, even more preferably 135° C. or more, still even more preferably 150° C. or more, and most preferably 160° C. or more. A higher glass transition point is preferable because the heat resistance of the photoelectric conversion element is further improved.

The ionization potential (Ip) of the condensed polycyclic hydrocarbon is preferably smaller than that of the material assuming hole transport in the photoelectric conversion layer 12 in order to receive a hole without barriers from the material assuming hole transport in the photoelectric conversion layer 12.

The condensed polycyclic hydrocarbon preferably has an Ip of 5.8 eV or less. By adjusting the Ip to 5.8 eV or less, there is obtained the effect of exhibiting high charge collection efficiency and high responsiveness without causing barriers to charge transport.

The Ip is preferably 4.9 eV or more and more preferably 5.0 eV or more. A higher dark current suppressing effect is obtained by adjusting the Ip to 4.9 eV or more.

The Ip of the condensed polycyclic hydrocarbon can be measured by ultraviolet photoelectron spectroscopy (UPS) or using an atmospheric photoelectron spectrometer (e.g., AC-2 manufactured by Riken Keiki Co., Ltd.).

The Ip of the condensed polycyclic hydrocarbon can be adjusted in the above-defined range, for example, by changing the substituent to be attached to the skeleton.

The condensed polycyclic hydrocarbon is preferably a compound which has absorption maximum at 400 nm or more but less than 720 nm in the ultraviolet-visible absorption spectrum and in which the molar absorbance coefficient of the absorption maximum wavelength is 10,000 mol$^{-1}$·l·cm$^{-1}$ or more and the difference between the melting point and the vapor deposition temperature (melting point−vapor deposition temperature) is 31° C. or more.

The condensed polycyclic hydrocarbon is particularly useful as a material of the photoelectric conversion layer for use in an image sensor, an optical sensor or a photoelectric cell. The condensed polycyclic hydrocarbon usually functions as an organic p-type compound in the photoelectric conversion layer.

Specific examples of the condensed polycyclic hydrocarbon include rubicene, trinaphthylene, pyranthrene, octaphene, octacene, nonaphene, nonacene, ovalene, decaphene, decacene, violanthrene, isoviolanthrene, decacyclene, quaterrylene, corannulene, fulminene, anthanthrene, zethrene, peropyrene, circumanthracene, bisanthene, heptazethrene, isoviolanthene, circobiphenyl, dibenzocoronene, tetrabenzocoronene, hexabenzocoronene, benzodicoronene and dicoronylene.

PREFERRED EMBODIMENTS

In a preferred embodiment, the condensed polycyclic hydrocarbon is preferably a condensed polycyclic aromatic hydrocarbon (condensed polycyclic aromatic hydrocarbon compound). According to this embodiment, the photoelectric conversion element has more excellent heat resistance and the deterioration of the photoelectric conversion efficiency and the dark current characteristics after heating is further suppressed.

The "condensed polycyclic aromatic hydrocarbon" refers to a compound having aromaticity. In other words, this compound is a compound formed by condensation of aromatic rings (e.g., benzene rings).

In another preferred embodiment, the condensed polycyclic hydrocarbon preferably has a partial structure represented by general formula (X) shown below. According to this embodiment, the photoelectric conversion element has more excellent heat resistance and the deterioration of the photo-electric conversion efficiency and the dark current characteristics after heating is further suppressed.

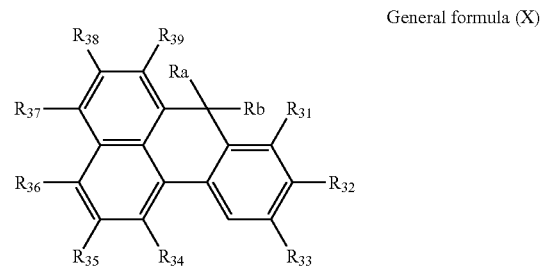

General formula (X)

In general formula (X), $R_{31}$ to $R_{39}$ each independently represent a hydrogen atom or a substituent; $R_a$ and $R_b$ each independently represent a hydrogen atom or a substituent.

For example, those to be illustrated later for a substituent W can be applied to the substituents represented by $R_{31}$ to $R_{39}$. The substituents represented by $R_{31}$ to $R_{39}$ are each preferably a halogen atom, an alkyl group, an aryl group, a heterocyclic group, a hydroxyl group, an amino group, a silyl group (e.g., trimethylsilyl group, triphenylsilyl group, triisopropylsilyl group) or a mercapto group, more preferably a halogen atom, an alkyl group, an aryl group, a heterocyclic group or a silyl group, even more preferably a fluorine atom, an alkyl group, an aryl group or a silyl group, still even more preferably an alkyl group or an aryl group, and most preferably an alkyl group because the chemical stability, the charge mobility and the heat resistance of the compound are more excellent and the photoelectric conversion element also has more excellent heat resistance.

These groups may further have a substituent. A specific example of the additional substituent includes the substituent W to be described later which may further have a substituent. The additional substituent is preferably a halogen atom, an alkyl group, an aryl group, a heterocyclic group, a hydroxyl group, an amino group or a mercapto group, more preferably a halogen atom, an alkyl group, an aryl group or a heterocyclic group, even more preferably a fluorine atom, an alkyl group or an aryl group, still even more preferably an alkyl group or an aryl group, and most preferably an alkyl group.

At least two of $R_{31}$ to $R_{39}$ may be taken together to form a ring.

Examples of the ring formed by at least two of $R_{31}$ to $R_{39}$ include a cycloalkyl ring having 5 to 18 carbon atoms, an aromatic hydrocarbon ring having 5 to 20 carbon atoms (benzene ring, naphthalene ring, indane ring, anthracene ring, pyrene ring, phenanthrene ring, perylene ring, tetracene ring, tetraphene ring, chrysene ring, triphenylene ring, fluoranthene ring, biphenylene ring, acenaphthylene ring, indacene ring, trindene ring, fluorene ring, pentacene ring, perylene ring, terrylene ring, coronene ring, violanthrene ring, picene ring, pentaphene ring, tetraphenylene ring, hexaphene ring, hexacene ring, rubicene ring, trinaphthylene ring, pentaphene ring, pyranthrene ring, octaphene ring, octacene ring, nonaphene ring, nonacene ring, ovalene ring, decaphene ring, decacene ring, violanthrene ring, decacyclene ring, quaterrylene ring, corannulene ring, fulminene ring, anthanthrene ring, zethrene ring, peropyrene ring, quoterylene ring, circumanthracene ring, bisanthene ring, zethrene ring, heptazethrene ring, pyranthrene ring, violanthene ring, isoviolanthene ring, circobiphenyl ring, dibenzocoronene ring, tetrabenzocoronene ring, hexabenzocoronene ring, benzodicoronene ring, isoviolanthrene ring, dicoronylene ring), pyridine ring, quinoline ring, isoquinoline ring, phenanthridine ring, pyrimidine ring, pyrazine ring, pyridazine ring, triazine ring, cinnoline ring, acridine ring, phthalazine ring, quinazoline ring, quinoxaline ring, naphthyridine ring, pteridine ring, pyrrole ring, pyrazole ring, triazole ring, indole ring, carbazole ring, indazole ring, benzimidazole ring, oxazole ring, thiazole ring, oxadiazole ring, thiadiazole ring, benzoxazole ring, benzothiazole ring, imidazopyridine ring, thiophene ring, benzothiophene ring, furan ring, benzofuran ring, phosphole ring, phosphinine ring, silole ring.

Of these, a cycloalkyl ring having 5 to 18 carbon atoms or an aromatic hydrocarbon ring having 5 to 20 carbon atoms is preferred, an aromatic hydrocarbon ring having 6 to 15 carbon atoms is more preferred, an aromatic hydrocarbon ring having 6 to 12 carbon atoms is even more preferred, and a benzene ring, a naphthalene ring, an indane ring or an anthracene ring is most preferred because the chemical stability, the charge mobility and the heat resistance of the compound are more excellent and the photoelectric conversion element also has excellent heat resistance. These rings may further have the substituent W to be described later.

$R_a$ and $R_b$ each independently represent a hydrogen atom or a substituent. For example, those to be illustrated later for the substituent W can be applied to the substituent. $R_a$ and $R_b$ may further have a substituent. A specific example of the substituent includes the substituent W to be referred to below and an alkyl group, an aryl group or an alkoxy group is preferred.

$R_a$ and $R_b$ are each preferably a hydrogen atom, a halogen atom, an alkyl group, an aryl group, a heterocyclic group, a hydroxyl group, an amino group or a mercapto group, more preferably a hydrogen atom, an alkyl group, an aryl group or a heterocyclic group, even more preferably a hydrogen atom, an alkyl group having 1 to 18 carbon atoms, an aryl group having 6 to 18 carbon atoms or a heterocyclic group having 4 to 16 carbon atoms, still even more preferably a hydrogen atom or an alkyl group having 1 to 18 carbon atoms, and most preferably an alkyl group having 1 to 18 carbon atoms because the chemical stability, the charge mobility and the heat resistance of the compound are more excellent and the photoelectric conversion element also has excellent heat resistance.

In still another embodiment, the condensed polycyclic hydrocarbon includes a condensed polycyclic hydrocarbon represented by any of general formulae (1) to (19). In this compound, the photoelectric conversion element has more excellent heat resistance and the deterioration of the photoelectric conversion efficiency and the dark current characteristics after heating is further suppressed.

General formula (1)

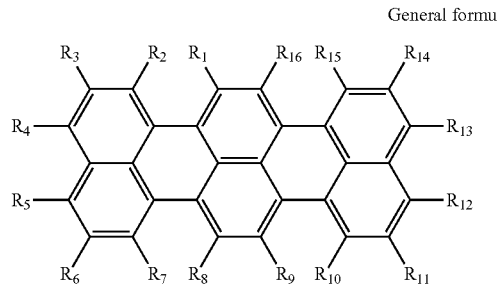

General formula (2)

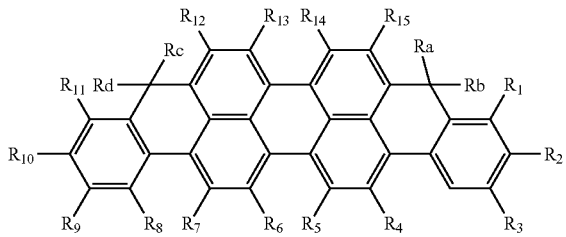

General formula (3)

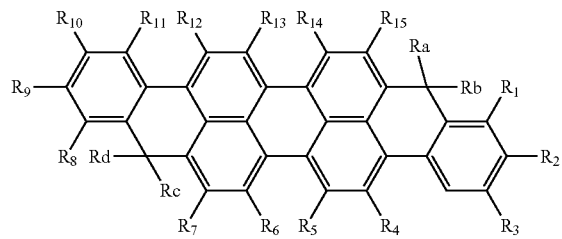

General formula (4)

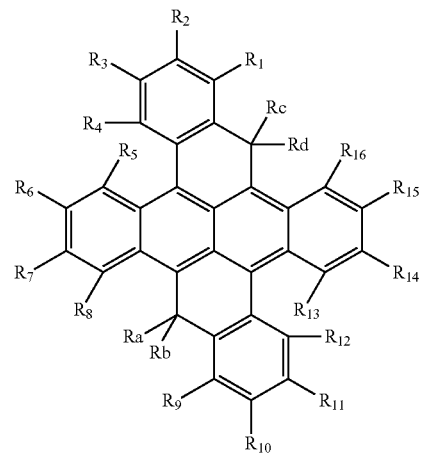

General formula (5)

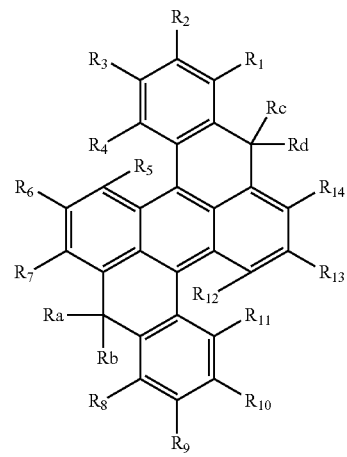

General formula (6)
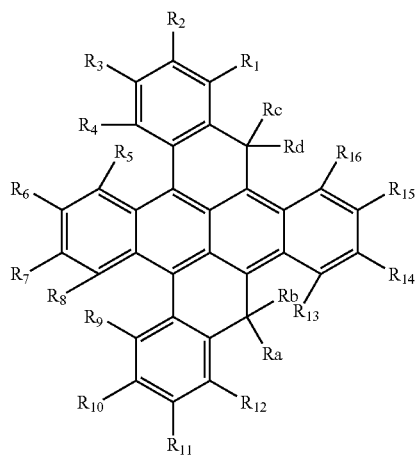
General formula (7)
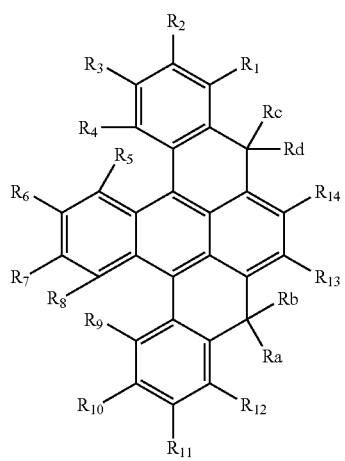
General formula (8)
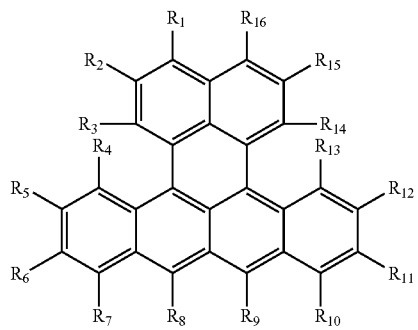
General formula (9)
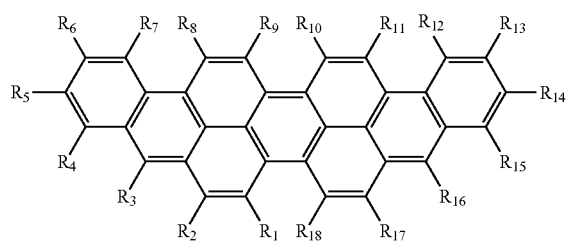
General formula (10)
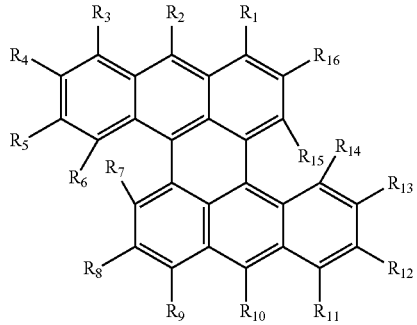
General formula (11)
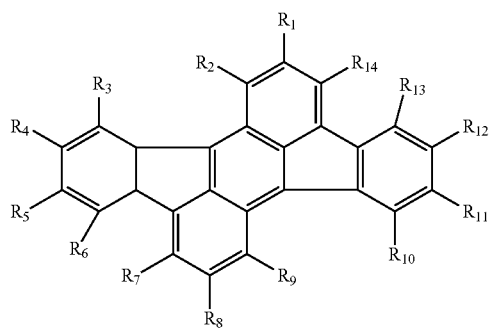
General formula (12)
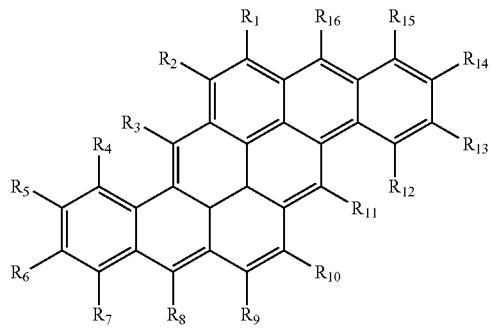
General formula (13)
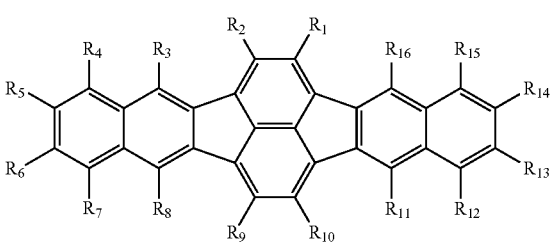

-continued

General formula (14)

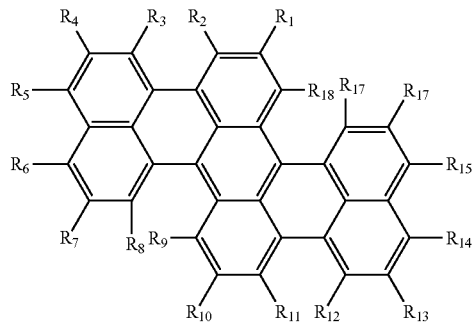

General formula (15)

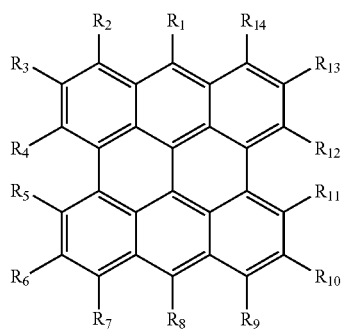

General formula (16)

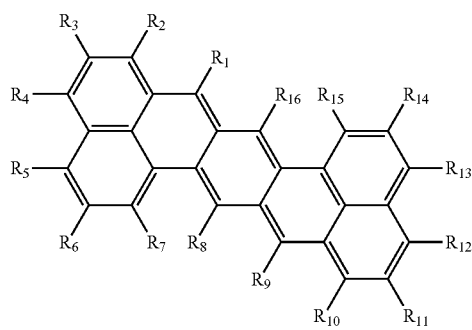

General formula (17)

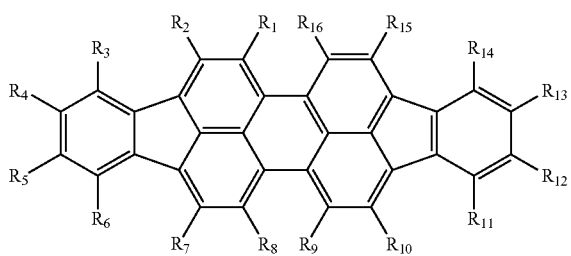

General formula (18)

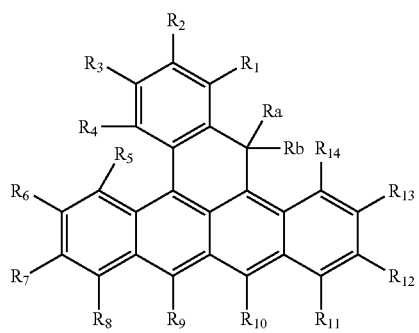

-continued

General formula (19)

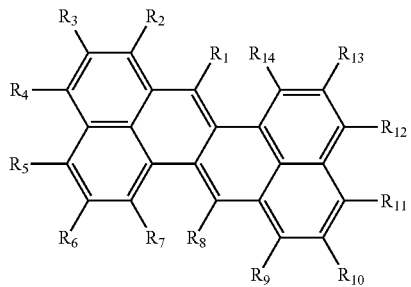

In general formulae (1), (8), (10), (12), (13), (16) and (17), $R_1$ to $R_{16}$ each independently represent a hydrogen atom or a substituent.

In general formulae (2) and (3), $R_1$ to $R_{15}$ and $R_a$ to $R_d$ each independently represent a hydrogen atom or a substituent.

In general formulae (4) and (6), $R_1$ to $R_{16}$ and $R_a$ to $R_d$ each independently represent a hydrogen atom or a substituent.

In general formulae (5) and (7), $R_1$ to $R_{14}$ and $R_a$ to $R_d$ each independently represent a hydrogen atom or a substituent.

In general formulae (9) and (14), $R_1$ to $R_{18}$ each independently represent a hydrogen atom or a substituent.

In general formulae (11), (15) and (19), $R_1$ to $R_{14}$ each independently represent a hydrogen atom or a substituent.

In general formula (18), $R_1$ to $R_{14}$ and $R_a$ to $R_b$ each independently represent a hydrogen atom or a substituent.

$R_1$ to $R_{16}$ in general formulae (1), (4), (6), (8), (10), (12), (13), (16) and (17), $R_1$ to $R_{15}$ in general formulae (2) and (3), $R_1$ to $R_{14}$ in general formulae (5), (7), (11), (15) and (19), $R_1$ to $R_{18}$ in general formulae (9) and (14), and $R_1$ to $R_{14}$ in general formula (18) each independently represent a hydrogen atom or a substituent. For example, those to be illustrated later for the substituent W can be applied to the substituents. Preferred embodiments of the substituents represented by $R_1$ to $R_{18}$ are the same as those of the substituents represented by $R_{31}$ to $R_{39}$ as described above.

These groups may further have a substituent. A specific example of the additional substituent includes the substituent W to be described later which may further have a substituent. The additional substituent is preferably a halogen atom, an alkyl group, an aryl group, a heterocyclic group, a hydroxyl group, an amino group or a mercapto group, more preferably a halogen atom, an alkyl group, an aryl group or a heterocyclic group, even more preferably a fluorine atom, an alkyl group or an aryl group, still even more preferably an alkyl group or an aryl group, and most preferably an alkyl group.

At least two of $R_1$ to $R_{18}$ may be taken together to form a ring.

Exemplary types of the ring formed by at least two of $R_1$ to $R_{18}$ include rings illustrated for the foregoing ring formed by at least two of $R_{31}$ to $R_{39}$.

$R_a$ to $R_d$ in general formulae (2) to (7) and $R_a$ to $R_b$ in general formula (18) each independently represent a hydrogen atom or a substituent (for example, the substituent W to be described later can be applied). $R_a$ to $R_d$ may further have a substituent, a specific example thereof including the substituent W, and an alkyl group, an aryl group or an alkoxy group is preferred.

$R_a$ to $R_d$ are each preferably a hydrogen atom, a halogen atom, an alkyl group, an aryl group, a heterocyclic group, a hydroxyl group, an amino group or a mercapto group, more preferably a hydrogen atom, an alkyl group, an aryl group or a heterocyclic group, even more preferably a hydrogen atom, an alkyl group having 1 to 18 carbon atoms, an aryl group having 6 to 18 carbon atoms or a heterocyclic group having 4 to 16 carbon atoms, still even more preferably a hydrogen atom or an alkyl group having 1 to 18 carbon atoms, and most preferably an alkyl group having 1 to 18 carbon atoms because the chemical stability, the charge mobility and the heat resistance of the compound are more excellent and the photoelectric conversion element also has more excellent heat resistance.

Of those condensed polycyclic hydrocarbons represented by any of general formulae (1) to (19), a condensed polycyclic hydrocarbon represented by any of general formulae (1) to (17) is preferred, a condensed polycyclic hydrocarbon represented by any of general formulae (2) to (8), (10) to (14), (15) and (17) is more preferred, a condensed polycyclic hydrocarbon represented by any of general formulae (2) to (8), (10), (11), (13), (14), (15) and (17) is even more preferred, a condensed polycyclic hydrocarbon represented by any of general formulae (2) to (8), (10), (11), (13), (15) and (17) is still more preferred, and a condensed polycyclic hydrocarbon represented by any of general formulae (2) to (7) is still even more preferred, and a condensed polycyclic hydrocarbon represented by any of general formulae (3) to (7) is most preferred because these condensed polycyclic hydrocarbons have a more suitable absorption wavelength, withstand higher vapor deposition temperatures and enable more excellent heat resistance of the resulting photoelectric conversion elements.

The condensed polycyclic hydrocarbon can be manufactured by implementing a partially modified known method.

Specific examples of the condensed polycyclic hydrocarbon are shown below but the invention is not limited thereto. The symbols used in Tables to be referred to below have the following meanings:

iPr: iso-propyl group, tBu: tert-butyl group, iBu: iso-butyl group, sBu: sec-butyl group, neoP: neopentyl group, CyPen: cyclopentyl group, CyHeX: cyclohexyl group, 1-Ad: 1-adamantyl group, 2-Ad: 2-adamantyl group, p-tol: p-toluoyl group, m-tol: m-toluoyl group, o-tol: o-toluoyl group, 1-Np: 1-naphthyl group, 2-Np: 2-naphthyl group, Mes: mesityl group.

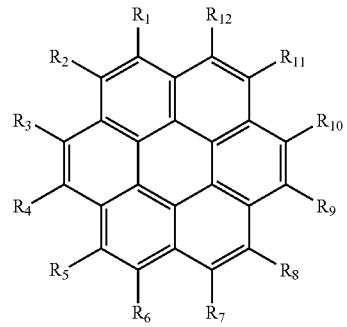

| Compound No. | $R_1$ | $R_2$ | $R_3$ | $R_4$ | $R_5$ | $R_6$ | $R_7$ | $R_8$ | $R_9$ | $R_{10}$ | $R_{11}$ | $R_{12}$ |
|---|---|---|---|---|---|---|---|---|---|---|---|---|
| E-1 | H | H | H | H | H | H | H | H | H | H | H | H |
| E-2 | Me | H | H | Me | H | Me | H | H | Me | H | H | H |
| E-3 | tBu | H | H | H | H | H | H | H | H | H | H | H |
| E-4 | Cl | H | H | H | H | H | H | H | H | H | H | H |
| E-5 | Ph | H | H | H | H | H | H | H | H | H | H | H |
| E-6 | tBu | H | H | H | H | tBu | H | H | H | H | H | H |
| E-7 | iPr | H | H | H | H | H | H | H | H | H | H | H |
| E-8 | OMe | H | H | H | H | H | H | H | H | H | H | H |
| E-9 | 2-Np | H | H | H | H | H | H | H | H | H | H | H |
| E-10 | Me | H | H | H | Me | H | H | H | Me | H | H | H |

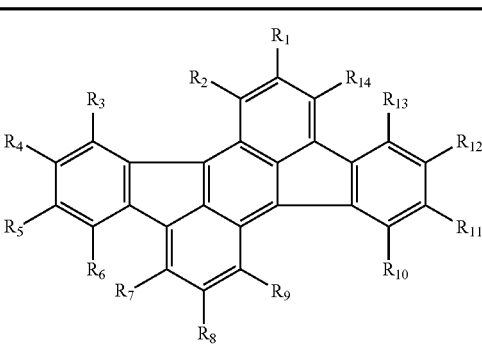

| Compound No. | $R_1$ | $R_2$ | $R_3$ | $R_4$ | $R_5$ | $R_6$ | $R_7$ | $R_8$ | $R_9$ | $R_{10}$ | $R_{11}$ | $R_{12}$ | $R_{13}$ | $R_{14}$ |
|---|---|---|---|---|---|---|---|---|---|---|---|---|---|---|
| I-1 | H | H | H | H | H | H | H | H | H | H | H | H | H | H |
| I-2 | H | H | H | Me | H | H | H | H | H | H | Me | H | H | H |
| I-3 | H | H | Ph | H | H | H | H | H | H | Ph | H | H | H | H |
| I-4 | H | H | H | H | H | H | H | tBu | H | H | H | H | H | H |
| I-5 | H | H | iPr | H | H | H | H | H | H | iPr | H | H | H | H |
| I-6 | H | H | H | H | H | H | Cl | H | H | H | H | H | H | Cl |
| I-7 | H | H | H | H | H | F | H | H | H | H | H | H | H | H |
| I-8 | H | H | H | H | Ad | H | H | H | H | H | H | H | H | H |
| I-9 | H | H | H | H | H | OMe | H | H | H | H | H | H | H | H |
| I-10 | H | H | H | H | H | H | H | H | H | H | $SiMe_3$ | H | H | H |

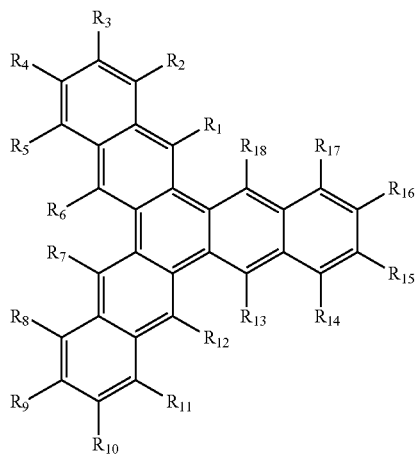

| Compound No. | R₁ | R₂ | R₃ | R₄ | R₅ | R₆ | R₇ | R₈ | R₉ | R₁₀ | R₁₁ | R₁₂ | R₁₃ | R₁₄ | R₁₅ | R₁₆ | R₁₇ | R₁₈ |
|---|---|---|---|---|---|---|---|---|---|---|---|---|---|---|---|---|---|---|
| J-1 | H | H | H | H | H | H | H | H | H | H | H | H | H | H | H | H | H | H |
| J-2 | H | H | Me | Me | H | H | H | H | Me | Me | H | H | H | H | Me | Me | H | H |
| J-3 | H | H | tBu | H | H | H | H | H | tBu | H | H | H | H | H | Tbu | H | H | H |
| J-4 | H | H | H | H | Et | H | H | H | H | H | H | H | Et | H | H | H | H | H |
| J-5 | H | H | H | H | nPr | H | H | H | H | H | H | H | nPr | H | H | H | H | H |
| J-6 | H | H | H | nBu | H | H | H | H | nBu | H | H | H | H | nBu | H | H | H | H |
| J-7 | H | H | OMe | H | H | H | H | H | OMe | H | H | H | H | H | OMe | H | H | H |
| J-8 | Me | H | H | H | H | H | H | H | H | H | H | H | H | H | H | H | H | H |
| J-9 | H | H | H | H | H | H | Ph | H | H | H | H | H | H | H | H | H | H | H |
| J-10 | H | H | SiMe₃ | H | H | H | H | H | SiMe₃ | H | H | H | H | H | H | SiMe₃ | H | H |

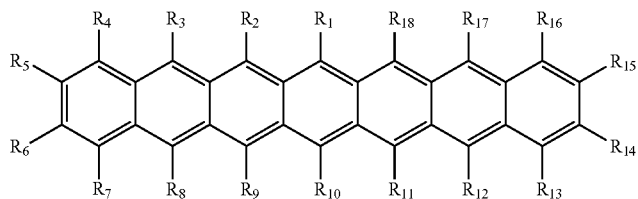

| Compound No. | R₁ | R₂ | R₃ | R₄ | R₅ | R₆ | R₇ | R₈ | R₉ | R₁₀ | R₁₁ | R₁₂ | R₁₃ | R₁₄ | R₁₅ | R₁₆ | R₁₇ | R₁₈ |
|---|---|---|---|---|---|---|---|---|---|---|---|---|---|---|---|---|---|---|
| K-1 | H | H | H | H | H | H | H | H | H | H | H | H | H | H | H | H | H | H |
| K-2 | Me | H | H | H | H | H | H | H | H | Me | H | H | H | H | H | H | H | H |
| K-3 | Ph | H | H | H | H | H | H | H | H | Ph | H | H | H | H | H | H | H | H |
| K-4 | H | H | H | H | tBu | H | H | H | H | H | H | H | H | H | H | H | H | H |
| K-5 | H | Et | H | H | iPr | H | H | Et | H | H | H | Et | H | H | H | Et | H | H |
| K-6 | Np | H | H | H | H | H | H | H | H | H | H | H | H | H | H | H | H | H |
| K-7 | H | H | H | OMe | H | H | H | H | H | H | H | H | H | H | H | H | H | H |
| K-8 | H | Cl | H | H | H | H | H | H | H | H | H | H | H | H | H | Cl | H | H |
| K-9 | 1-Ad | H | H | H | H | H | H | H | H | H | H | H | H | H | H | H | H | H |
| K-10 | H | H | H | H | H | H | H | NMe₃ | H | H | H | H | H | H | H | H | H | H |

| Compound No. | R₁ | R₂ | R₃ | R₄ | R₅ | R₆ | R₇ | R₈ | R₉ | R₁₀ | R₁₁ | R₁₂ | R₁₃ | R₁₄ | R₁₅ | R₁₆ | R₁₇ | R₁₈ |
|---|---|---|---|---|---|---|---|---|---|---|---|---|---|---|---|---|---|---|
| L-1 | H | H | H | H | H | H | H | H | H | H | H | H | H | H | H | H | H | H |
| L-2 | Me | H | H | H | H | H | H | H | H | H | H | H | H | H | H | H | H | Me |
| L-3 | H | H | H | H | H | H | H | H | Me | Me | H | H | H | H | H | H | H | H |
| L-4 | H | H | H | H | Ph | H | H | H | H | H | H | H | Ph | H | H | H | H | H |
| L-5 | H | H | H | H | H | H | F | H | H | H | H | H | H | F | H | H | H | H |
| L-6 | H | H | H | H | H | H | H | Cl | H | H | H | H | H | H | H | H | H | H |
| L-7 | H | tBu | H | H | H | H | H | H | H | H | H | H | H | H | H | H | tBu | H |
| L-8 | H | Hex | H | H | H | H | H | H | H | H | H | H | H | H | H | H | H | H |
| L-9 | H | H | H | H | H | H | H | H | H | H | H | H | H | nPr | H | H | H | H |
| L-10 | H | H | H | H | OMe | H | H | H | H | H | H | H | H | H | H | H | H | H |

| Compound No. | R₁ | R₂ | R₃ | R₄ | R₅ | R₆ | R₇ | R₈ | R₉ | R₁₀ | R₁₁ | R₁₂ | R₁₃ | R₁₄ | R₁₅ | R₁₆ |
|---|---|---|---|---|---|---|---|---|---|---|---|---|---|---|---|---|
| M-1 | H | H | H | H | H | H | H | H | H | H | H | H | H | H | H | H |
| M-2 | H | H | Me | Me | H | H | H | H | H | H | Me | Me | H | H | H | H |
| M-3 | Ph | H | H | H | H | H | H | H | H | H | H | H | H | H | H | H |
| M-4 | H | tBu | H | H | H | H | H | H | H | H | H | H | H | H | H | H |
| M-5 | H | H | H | H | tBu | H | H | H | H | H | H | H | H | H | H | H |
| M-6 | H | H | H | H | iPr | H | H | H | H | H | H | H | iPr | H | H | H |
| M-7 | H | H | H | H | H | H | CyPe | H | H | H | H | H | H | H | H | H |
| M-8 | H | H | SiMe₃ | H | H | H | H | H | H | SiMe₃ | H | H | H | H | H | H |
| M-9 | H | H | H | H | H | H | Cl | H | Cl | H | H | H | H | H | H | H |
| M-10 | H | H | H | H | H | H | H | Br | H | H | H | H | H | H | H | H |

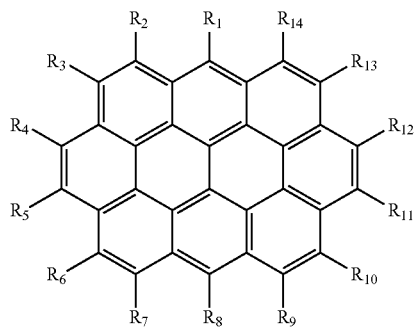

| Compound No. | $R_1$ | $R_2$ | $R_3$ | $R_4$ | $R_5$ | $R_6$ | $R_7$ | $R_8$ | $R_9$ | $R_{10}$ | $R_{11}$ | $R_{12}$ | $R_{13}$ | $R_{14}$ |
|---|---|---|---|---|---|---|---|---|---|---|---|---|---|---|
| N-1 | H | H | H | H | H | H | H | H | H | H | H | H | H | H |
| N-2 | tBu | H | H | H | H | H | H | tBu | H | H | H | H | H | H |
| N-3 | Me | H | H | H | H | H | H | Me | H | H | H | H | H | H |
| N-4 | OMe | H | H | H | H | H | H | H | H | H | H | H | H | H |
| N-5 | H | H | Et | H | H | Et | H | H | H | Et | H | H | Et | H |
| N-6 | H | H | iPr | H | H | iPr | H | H | H | iPr | H | H | iPr | H |
| N-7 | H | H | Cl | H | H | H | H | H | H | Cl | H | H | H | H |
| N-8 | H | H | H | H | H | F | H | H | H | H | H | H | F | H |
| N-9 | H | H | H | Ph | H | H | H | H | H | Ph | H | H | H | H |
| N-10 | NEt$_2$ | H | H | H | H | H | H | H | H | H | H | H | H | H |

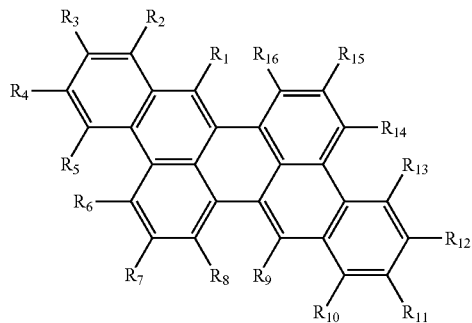

| Compound No. | $R_1$ | $R_2$ | $R_3$ | $R_4$ | $R_5$ | $R_6$ | $R_7$ | $R_8$ | $R_9$ | $R_{10}$ | $R_{11}$ | $R_{12}$ | $R_{13}$ | $R_{14}$ | $R_{15}$ | $R_{16}$ |
|---|---|---|---|---|---|---|---|---|---|---|---|---|---|---|---|---|
| Q-1 | H | H | H | H | H | H | H | H | H | H | H | H | H | H | H | H |
| Q-2 | H | H | Me | Me | H | H | H | H | H | H | Me | Me | H | H | H | H |
| Q-3 | Ph | H | H | H | H | H | H | H | H | H | H | H | H | H | H | H |
| Q-4 | H | tBu | H | H | H | H | H | H | H | H | H | H | H | H | H | H |
| Q-5 | H | H | H | H | tBu | H | H | H | H | H | H | H | H | H | H | H |
| Q-6 | H | H | H | H | iPr | H | H | H | H | H | H | H | iPr | H | H | H |
| Q-7 | H | H | H | H | H | CyPen | H | H | H | H | H | H | H | H | H | H |
| Q-8 | H | H | SiMe$_3$ | H | H | H | H | H | H | SiMe$_3$ | H | H | H | H | H | H |
| Q-9 | H | H | H | H | H | H | H | Cl | H | Cl | H | H | H | H | H | H |
| Q-10 | H | H | H | H | H | H | H | H | Br | H | H | H | H | H | H | H |

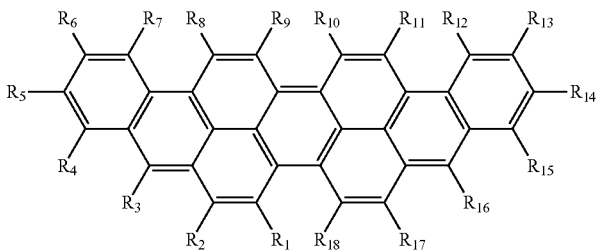

| Compound No. | $R_1$ | $R_2$ | $R_3$ | $R_4$ | $R_5$ | $R_6$ | $R_7$ | $R_8$ | $R_9$ | $R_{10}$ | $R_{11}$ | $R_{12}$ | $R_{13}$ | $R_{14}$ | $R_{15}$ | $R_{16}$ | $R_{17}$ | $R_{18}$ |
|---|---|---|---|---|---|---|---|---|---|---|---|---|---|---|---|---|---|---|
| R-1 | H | H | H | H | H | H | H | H | H | H | H | H | H | H | H | H | H | H |
| R-2 | Me | H | H | H | H | H | H | H | H | H | H | H | H | H | H | H | H | Me |
| R-3 | H | H | H | H | H | Ph | H | H | H | H | H | H | H | H | H | H | H | H |
| R-4 | H | H | H | H | H | p-tol | H | H | H | H | H | H | p-tol | H | H | H | H | H |
| R-5 | H | H | H | H | H | tBu | H | H | H | H | H | H | H | tBu | H | H | H | H |
| R-6 | H | H | H | OMe | H | H | H | Et | H | Et | H | H | H | H | H | H | H | H |
| R-7 | H | H | Cl | H | H | H | H | H | H | H | H | H | H | Cl | H | H | H | H |
| R-8 | H | H | H | H | H | F | H | H | H | H | H | F | H | H | H | H | H | H |
| R-9 | H | H | H | H | H | H | H | Br | H | H | H | H | H | H | H | H | H | H |
| R-10 | H | H | H | H | iPr | H | H | H | H | H | H | H | H | H | H | H | H | H |

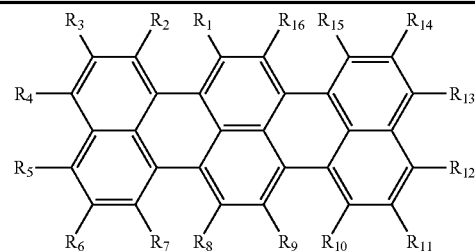

| Compound No. | $R_1$ | $R_2$ | $R_3$ | $R_4$ | $R_5$ | $R_6$ | $R_7$ | $R_8$ | $R_9$ | $R_{10}$ | $R_{11}$ | $R_{12}$ | $R_{13}$ | $R_{14}$ | $R_{15}$ | $R_{16}$ |
|---|---|---|---|---|---|---|---|---|---|---|---|---|---|---|---|---|
| S-1 | H | H | H | H | H | H | H | H | H | H | H | H | H | H | H | H |
| S-2 | H | H | Ph | H | H | H | H | H | H | Ph | H | H | H | H | H | H |
| S-3 | H | H | 1-Np | H | H | H | H | H | H | H | H | H | H | H | H | H |
| S-4 | H | H | Me | H | Me | H | H | H | H | Me | H | H | Me | H | H | H |
| S-5 | H | H | tBu | H | H | H | H | H | H | tBu | H | H | H | H | H | H |
| S-6 | H | H | H | iPr | H | H | H | H | H | H | iPr | H | H | H | H | H |
| S-7 | H | H | OMe | H | H | H | H | H | H | H | H | H | H | H | H | H |
| S-8 | H | H | $NMe_2$ | H | H | H | H | H | H | H | H | H | H | H | H | H |
| S-9 | H | H | H | Cl | H | H | H | H | H | H | H | Cl | H | H | H | H |
| S-10 | H | H | H | $SiEt_3$ | H | H | H | H | H | H | H | H | H | H | H | H |

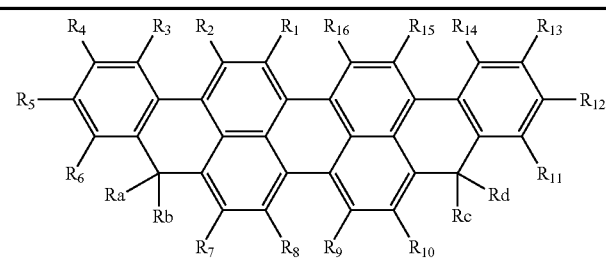

| Compound No. | $R_1$ | $R_2$ | $R_3$ | $R_4$ | $R_5$ | $R_6$ | $R_7$ | $R_8$ | $R_9$ | $R_{10}$ | $R_{11}$ | $R_{12}$ | $R_{13}$ | $R_{14}$ | $R_{15}$ | $R_{16}$ | $R_a$ | $R_b$ | $R_c$ | $R_d$ |
|---|---|---|---|---|---|---|---|---|---|---|---|---|---|---|---|---|---|---|---|---|
| T-1 | H | H | H | H | H | H | H | H | H | H | H | H | H | H | H | H | Me | Me | Me | Me |
| T-2 | H | H | H | H | H | H | H | H | H | H | H | H | H | H | H | H | H | H | H | H |
| T-3 | H | H | H | H | Me | H | H | H | H | Me | H | H | H | H | H | H | Me | Me | Me | Me |
| T-4 | H | H | H | Ph | H | H | H | H | H | H | H | Ph | H | H | H | H | Me | Me | Me | Me |
| T-5 | H | Cl | H | H | H | H | H | H | H | H | H | H | H | Cl | H | H | Me | Me | Me | Me |
| T-6 | H | H | H | H | H | H | Et | H | H | Et | H | H | H | H | H | H | Et | Et | Et | Et |

-continued

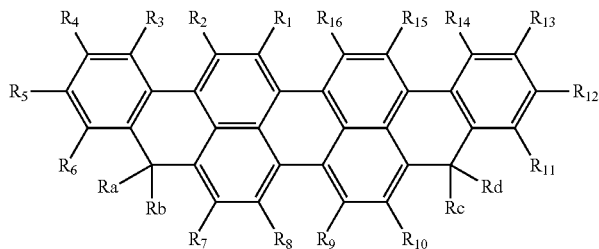

| Compound No. | $R_1$ | $R_2$ | $R_3$ | $R_4$ | $R_5$ | $R_6$ | $R_7$ | $R_8$ | $R_9$ | $R_{10}$ | $R_{11}$ | $R_{12}$ | $R_{13}$ | $R_{14}$ | $R_{15}$ | $R_{16}$ | $R_a$ | $R_b$ | $R_c$ | $R_d$ |
|---|---|---|---|---|---|---|---|---|---|---|---|---|---|---|---|---|---|---|---|---|
| T-7  | H | H | H | Me  | Me | H | H | H | H | H | H | Me  | Me  | H | H | H | Me | Me | Me | Me |
| T-8  | H | H | H | H   | H  | H | H | H | H | H | H | H   | H   | H | H | H | nPr | Me | nPr | Me |
| T-9  | H | H | H | tBu | H  | H | H | H | H | H | H | tBu | H   | H | H | H | Me | Me | Me | Me |
| T-10 | H | H | H | H   | H  | H | H | H | H | H | H | H   | H   | H | H | H | H | Me | H | Me |

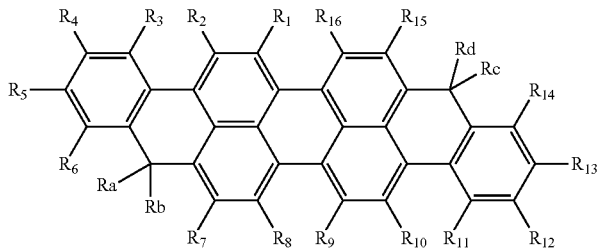

| Compound No. | $R_1$ | $R_2$ | $R_3$ | $R_4$ | $R_5$ | $R_6$ | $R_7$ | $R_8$ | $R_9$ | $R_{10}$ | $R_{11}$ | $R_{12}$ | $R_{13}$ | $R_{14}$ | $R_{15}$ | $R_{16}$ | $R_a$ | $R_b$ | $R_c$ | $R_d$ |
|---|---|---|---|---|---|---|---|---|---|---|---|---|---|---|---|---|---|---|---|---|
| U-1  | H | H | H  | H     | H    | H     | H | H | H | H | H     | H | H  | H  | H | H | Me | Me | Me | Me |
| U-2  | H | H | H  | H     | Me   | H     | H | H | H | H | H     | H | H  | H  | H | H | H  | H  | H  | H  |
| U-3  | H | H | H  | H     | Me   | H     | H | H | H | H | H     | H | Me | H  | H | H | Me | Me | Me | Me |
| U-4  | H | H | H  | p-tol | H    | H     | H | H | H | H | p-tol | H | H  | H  | H | H | Me | Me | Me | Me |
| U-5  | H | H | Et | H     | H    | H     | H | H | H | H | H     | H | H  | H  | H | H | Me | Me | Me | Me |
| U-6  | H | tBu | H | H     | H    | H     | H | H | H | H | H     | H | H  | H  | H | H | Et | Et | Et | Et |
| U-7  | H | H | Me | Me    | Me   | H     | H | H | Me | Me | Me   | Me | H  | H  | H | H | Me | Me | Me | Me |
| U-8  | H | Cl | H | H     | H    | H     | H | H | H | H | Cl    | H | H  | H  | H | H | nPr | Me | nPr | Me |
| U-9  | H | H | H  | H     | H    | SiMe3 | H | H | H | H | H     | H | H  | H  | H | H | Me | Me | Me | Me |
| U-10 | H | H | H  | H     | H    | OMe   | H | H | H | H | H     | H | H  | H  | H | H | Me | H | Me | H |

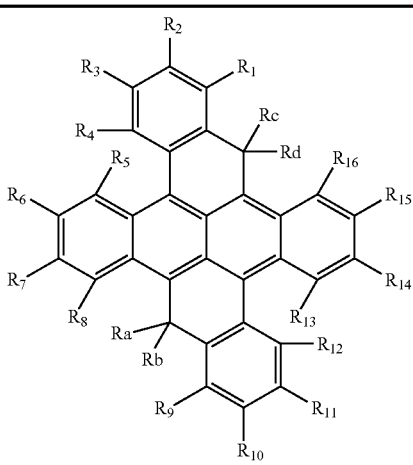

| Compound No. | $R_1$ | $R_2$ | $R_3$ | $R_4$ | $R_5$ | $R_6$ | $R_7$ | $R_8$ | $R_9$ | $R_{10}$ | $R_{11}$ | $R_{12}$ | $R_{13}$ | $R_{14}$ | $R_{15}$ | $R_{16}$ | $R_a$ | $R_b$ | $R_c$ | $R_d$ |
|---|---|---|---|---|---|---|---|---|---|---|---|---|---|---|---|---|---|---|---|---|
| V-1 | H | H  | H | H | H | H | H | H | H | H  | H  | H | H | H | H | H | Me | Me | Me | Me |
| V-2 | H | Me | H | H | H | H | H | H | H | Me | H  | H | H | H | H | H | H  | H  | H  | H  |

-continued

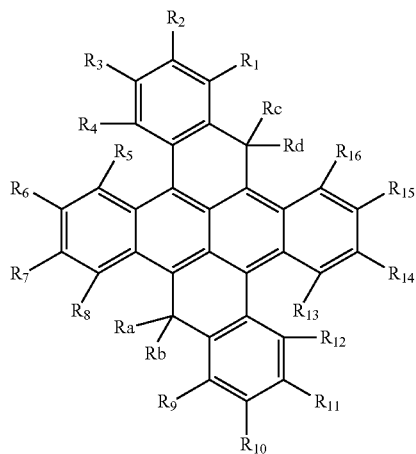

| Compound No. | R₁ | R₂ | R₃ | R₄ | R₅ | R₆ | R₇ | R₈ | R₉ | R₁₀ | R₁₁ | R₁₂ | R₁₃ | R₁₄ | R₁₅ | R₁₆ | Rₐ | R_b | R_c | R_d |
|---|---|---|---|---|---|---|---|---|---|---|---|---|---|---|---|---|---|---|---|---|
| V-3 | H | H | Ph | H | H | H | H | H | H | H | Ph | H | H | H | H | H | Me | Me | Me | Me |
| V-4 | H | H | H | H | H | Et | Et | H | H | H | H | H | Et | Et | H | Me | Me | Me | Me |
| V-5 | H | H | H | H | H | Br | H | H | H | H | H | H | H | H | H | H | Me | Me | Me | Me |
| V-6 | H | H | tBu | H | H | H | H | H | H | H | H | H | H | H | H | H | Et | Et | Et | Et |
| V-7 | H | H | H | H | H | iPr | H | H | H | H | H | H | iPr | H | H | Me | Me | Me | Me |
| V-8 | H | H | H | H | H | H | OMe | H | H | H | H | H | H | H | H | nPr | Me | nPr | Me |
| V-9 | H | H | m-tol | H | H | H | H | H | H | H | H | H | H | H | H | H | Me | Me | Me | Me |
| V-10 | H | H | H | H | F | H | H | H | H | H | H | H | F | H | H | H | H | Me | H | Me |

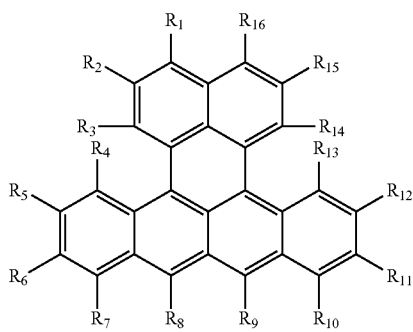

| Compound No. | R₁ | R₂ | R₃ | R₄ | R₅ | R₆ | R₇ | R₈ | R₉ | R₁₀ | R₁₁ | R₁₂ | R₁₃ | R₁₄ | R₁₅ | R₁₆ |
|---|---|---|---|---|---|---|---|---|---|---|---|---|---|---|---|---|
| X-1 | H | H | H | H | H | H | H | H | H | H | H | H | H | H | H | H |
| X-2 | H | Me | H | H | Me | H | H | H | H | H | Me | H | H | H | Me | H |
| X-3 | tbu | H | H | H | H | H | H | H | H | H | H | H | H | H | H | H |
| X-4 | NeoP | H | H | H | H | H | H | H | H | H | H | H | H | H | H | H |
| X-5 | H | H | H | H | H | H | iPr | H | H | H | H | H | H | H | H | H |
| X-6 | H | H | H | H | Et | H | H | H | H | H | Et | H | H | H | H | H |
| X-7 | H | H | H | H | NMe₂ | H | H | H | H | H | H | H | H | H | H | H |
| X-8 | H | H | H | H | H | H | H | Me | Me | H | H | H | H | H | H | H |
| X-9 | H | H | SiMe₂ | H | H | H | H | H | H | H | H | H | H | H | H | H |
| X-10 | H | H | H | H | H | H | H | H | H | Cl | H | H | H | H | H | H |

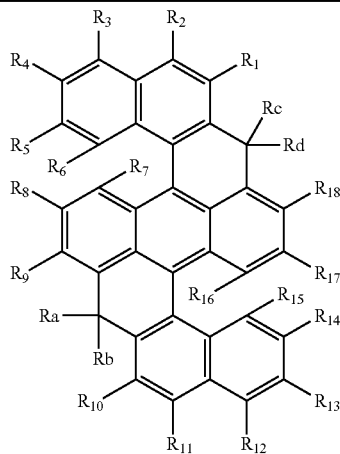

| Compound No. | R₁ | R₂ | R₃ | R₄ | R₅ | R₆ | R₇ | R₈ | R₉ | R₁₀ | R₁₁ | R₁₂ | R₁₃ | R₁₄ | R₁₅ | R₁₆ | R₁₇ | R₁₈ | Rₐ | R_b | R_c | R_d |
|---|---|---|---|---|---|---|---|---|---|---|---|---|---|---|---|---|---|---|---|---|---|---|
| Y-1 | H | H | H | H | H | H | H | H | H | H | H | H | H | H | H | H | H | H | Me | Me | Me | Me |
| Y-2 | H | Me | H | Me | H | H | H | H | H | H | Me | H | Me | H | H | H | H | H | Me | H | H | H |
| Y-3 | H | H | H | H | H | H | H | Et | H | H | H | H | H | H | H | H | Et | H | Me | Me | Me | Me |
| Y-4 | H | H | H | H | H | H | H | OEt | H | H | H | H | H | H | H | H | H | H | Me | Me | Me | Me |
| Y-5 | H | H | H | sBu | H | H | H | H | H | H | H | H | H | H | H | H | H | H | Me | Me | Me | Me |
| Y-6 | H | H | tBu | H | H | H | H | H | H | H | tBu | H | H | H | H | H | H | H | Et | Et | Et | Et |
| Y-7 | H | H | H | tBu | H | H | H | H | H | H | H | tBu | H | H | H | H | H | H | Me | Me | Me | Me |
| Y-8 | H | H | H | Ph | H | H | H | H | H | H | H | Ph | H | H | H | H | H | H | nPr | Me | nPr | Me |
| Y-9 | H | H | H | H | H | Me | H | H | H | H | H | H | H | Me | H | H | H | H | Me | Me | Me | Me |
| Y-10 | H | H | H | H | H | H | H | SiMe₃ | H | H | H | H | H | H | H | H | H | H | Me | Me | H | Me |

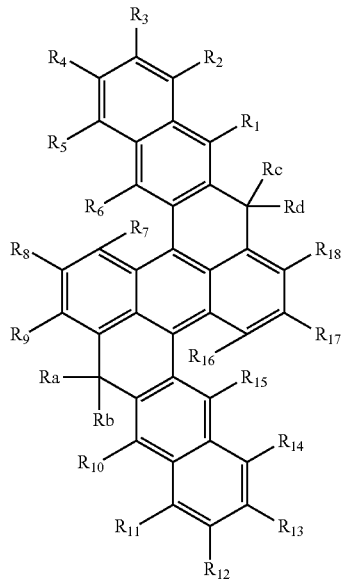

| Compound No. | R₁ | R₂ | R₃ | R₄ | R₅ | R₆ | R₇ | R₈ | R₉ | R₁₀ | R₁₁ | R₁₂ | R₁₃ | R₁₄ | R₁₅ | R₁₆ | R₁₇ | R₁₈ | Rₐ | R_b | R_c | R_d |
|---|---|---|---|---|---|---|---|---|---|---|---|---|---|---|---|---|---|---|---|---|---|---|
| Z-1 | H | H | H | H | H | H | H | H | H | H | H | H | H | H | H | H | H | H | Me | Me | Me | Me |
| Z-2 | H | H | H | tBu | H | H | H | H | H | H | H | tBu | H | H | H | H | H | H | H | H | H | H |
| Z-3 | H | H | H | H | H | H | H | tBu | H | H | H | H | H | H | H | tBu | H | Me | Me | Me | Me |
| Z-4 | H | H | Me | Me | H | H | H | H | H | H | Me | Me | H | H | H | H | H | H | Me | Me | Me | Me |
| Z-5 | H | F | H | H | H | H | H | H | H | H | F | H | H | H | H | H | H | H | Me | Me | Me | Me |
| Z-6 | H | H | H | H | H | H | p-tol | H | H | H | H | H | H | H | H | p-tol | H | Et | Et | Et | Et |
| Z-7 | H | H | 2-Ad | H | H | H | H | H | H | H | H | H | H | H | H | H | H | H | Me | Me | Me | Me |
| Z-8 | H | H | Cl | H | H | H | H | H | H | H | Cl | H | H | H | H | H | H | H | nPr | Me | nPr | Me |
| Z-9 | H | H | H | H | H | Me | H | H | H | H | H | H | H | Me | H | H | H | H | Me | Me | Me | Me |
| Z-10 | H | H | H | iPr | H | H | H | H | H | H | H | H | H | H | H | H | H | H | Me | H | Me | |

-continued

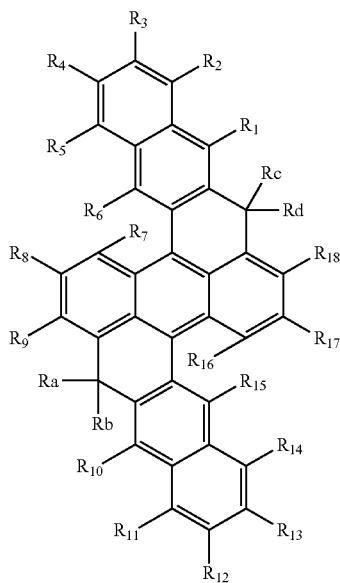

| Compound No. | $R_1$ | $R_2$ | $R_3$ | $R_4$ | $R_5$ | $R_6$ | $R_7$ | $R_8$ | $R_9$ | $R_{10}$ | $R_{11}$ | $R_{12}$ | $R_{13}$ | $R_{14}$ | $R_{15}$ | $R_{16}$ | $R_{17}$ | $R_{18}$ | $R_a$ | $R_b$ | $R_c$ | $R_d$ |
|---|---|---|---|---|---|---|---|---|---|---|---|---|---|---|---|---|---|---|---|---|---|---|

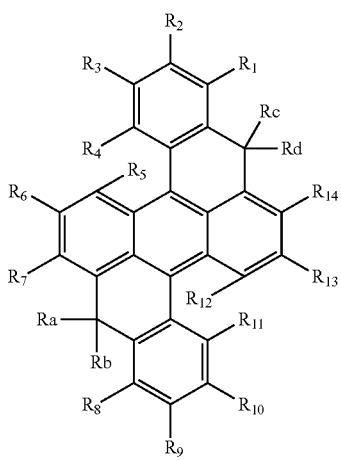

| Compound No. | $R_1$ | $R_2$ | $R_3$ | $R_4$ | $R_5$ | $R_6$ | $R_7$ | $R_8$ | $R_9$ | $R_{10}$ | $R_{11}$ | $R_{12}$ | $R_{13}$ | $R_{14}$ | $R_a$ | $R_b$ |
|---|---|---|---|---|---|---|---|---|---|---|---|---|---|---|---|---|
| AA-1 | H | H | H | H | H | H | H | H | H | H | H | H | H | H | Me | Me |
| AA-2 | H | H | H | H | H | Me | Me | H | H | H | H | H | Me | Me | H | H |
| AA-3 | H | H | tBu | H | H | H | H | H | H | H | H | H | H | H | Me | Me |
| AA-4 | H | H | NeoP | H | H | H | H | H | H | H | H | H | H | H | Me | Me |
| AA-5 | H | H | H | H | H | H | Cl | H | H | H | H | H | H | Cl | Me | Me |
| AA-6 | H | H | H | H | H | Et | H | H | H | H | H | H | Et | H | Et | Et |
| AA-7 | H | Me | Me | H | H | H | H | H | H | H | H | H | H | H | Me | Me |
| AA-8 | H | o-tol | H | H | H | H | H | H | H | H | H | H | H | H | nPr | Me |
| AA-9 | H | H | iBu | H | H | H | H | H | H | H | H | H | H | H | Me | Me |
| AA-10 | H | H | H | H | H | H | H | H | H | CyHex | H | H | H | H | H | Me |

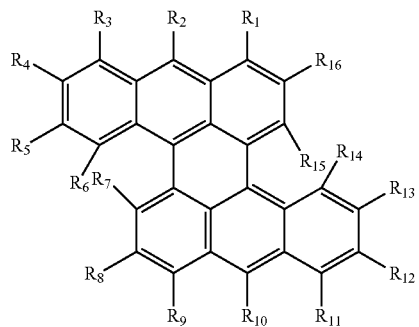

| Compound No. | $R_1$ | $R_2$ | $R_3$ | $R_4$ | $R_5$ | $R_6$ | $R_7$ | $R_8$ | $R_9$ | $R_{10}$ | $R_{11}$ | $R_{12}$ | $R_{13}$ | $R_{14}$ | $R_{15}$ | $R_{16}$ |
|---|---|---|---|---|---|---|---|---|---|---|---|---|---|---|---|---|
| AB-1 | H | H | H | H | H | H | H | H | H | H | H | H | H | H | H | H |
| AB-2 | H | Me | H | H | H | H | H | H | Me | H | H | H | H | H | H | H |
| AB-3 | H | H | H | tBu | H | H | H | tBu | H | H | H | tBu | H | H | H | tBu |
| AB-4 | H | H | H | Me | H | H | H | Me | H | H | H | Me | H | H | H | Me |
| AB-5 | H | H | H | Cl | H | H | H | H | H | H | H | Cl | H | H | H | H |
| AB-6 | H | H | OMe | H | H | H | H | H | H | OMe | H | H | H | H | H | H |
| AB-7 | H | H | iPr | H | H | H | H | H | H | iPr | H | H | H | H | H | H |
| AB-8 | Ph | H | H | H | H | H | H | H | Ph | H | H | H | H | H | H | H |
| AB-9 | H | H | H | o-tol | H | H | H | H | H | H | H | H | H | H | H | H |
| AB-10 | H | H | H | H | H | H | H | H | SiEt$_3$ | H | H | H | H | H | H | H |

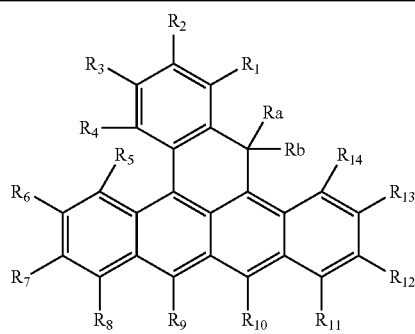

| Compound No. | $R_1$ | $R_2$ | $R_3$ | $R_4$ | $R_5$ | $R_6$ | $R_7$ | $R_8$ | $R_9$ | $R_{10}$ | $R_{11}$ | $R_{12}$ | $R_{13}$ | $R_{14}$ | $R_a$ | $R_b$ |
|---|---|---|---|---|---|---|---|---|---|---|---|---|---|---|---|---|
| W-1 | H | H | H | H | H | H | H | H | H | H | H | H | H | H | Me | Me |
| W-2 | H | H | H | H | H | Me | Me | H | H | H | H | Me | Me | H | H | H |
| W-3 | H | H | tBu | H | H | H | H | H | H | H | H | H | H | H | Me | Me |
| W-4 | H | H | NeoP | H | H | H | H | H | H | H | H | H | H | H | Me | Me |
| W-5 | H | H | H | H | H | H | Cl | H | H | H | H | Cl | H | H | Me | Me |
| W-6 | H | H | H | H | H | Et | H | H | H | H | H | H | Et | H | Et | Et |
| W-7 | H | Me | Me | H | H | H | H | H | H | H | H | H | H | H | Me | Me |
| W-8 | H | o-tol | H | H | H | H | H | H | H | H | H | H | H | H | nPr | Me |
| W-9 | H | H | iBu | H | H | H | H | H | H | H | H | H | H | H | Me | Me |
| W-10 | H | H | H | H | H | H | H | H | CyHex | H | H | H | H | H | H | Me |

AD
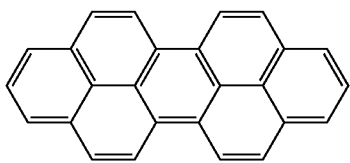
AE
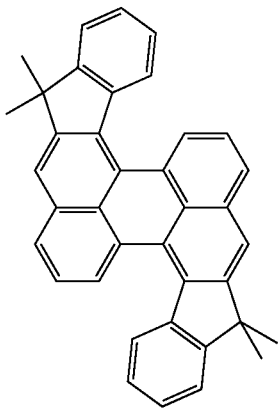
AF
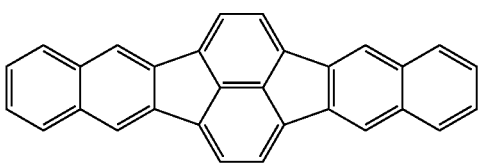
AG
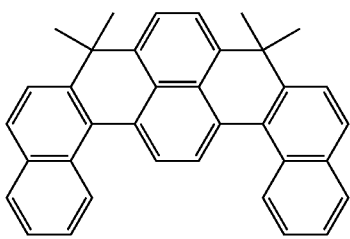
AH
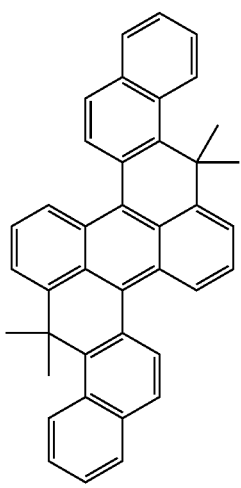
AI
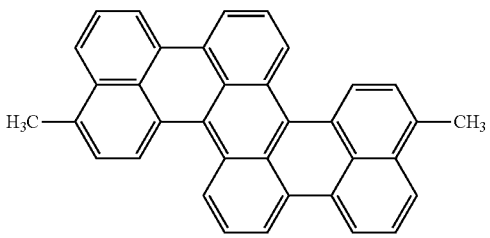
AJ
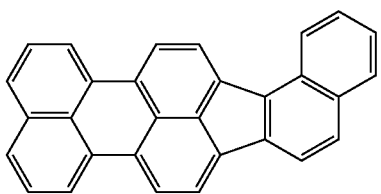
AM
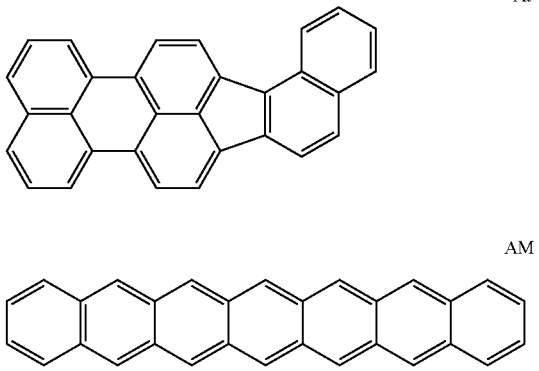
AN
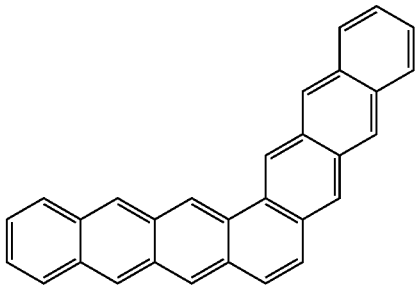
AO
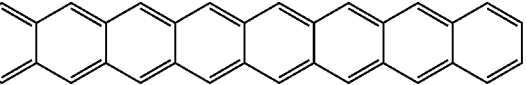
AP
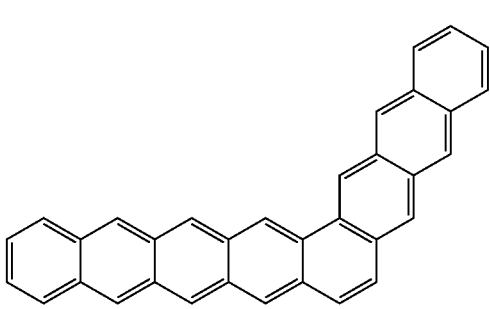
AQ
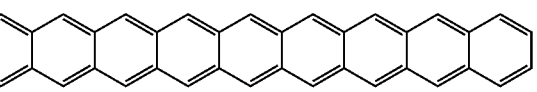

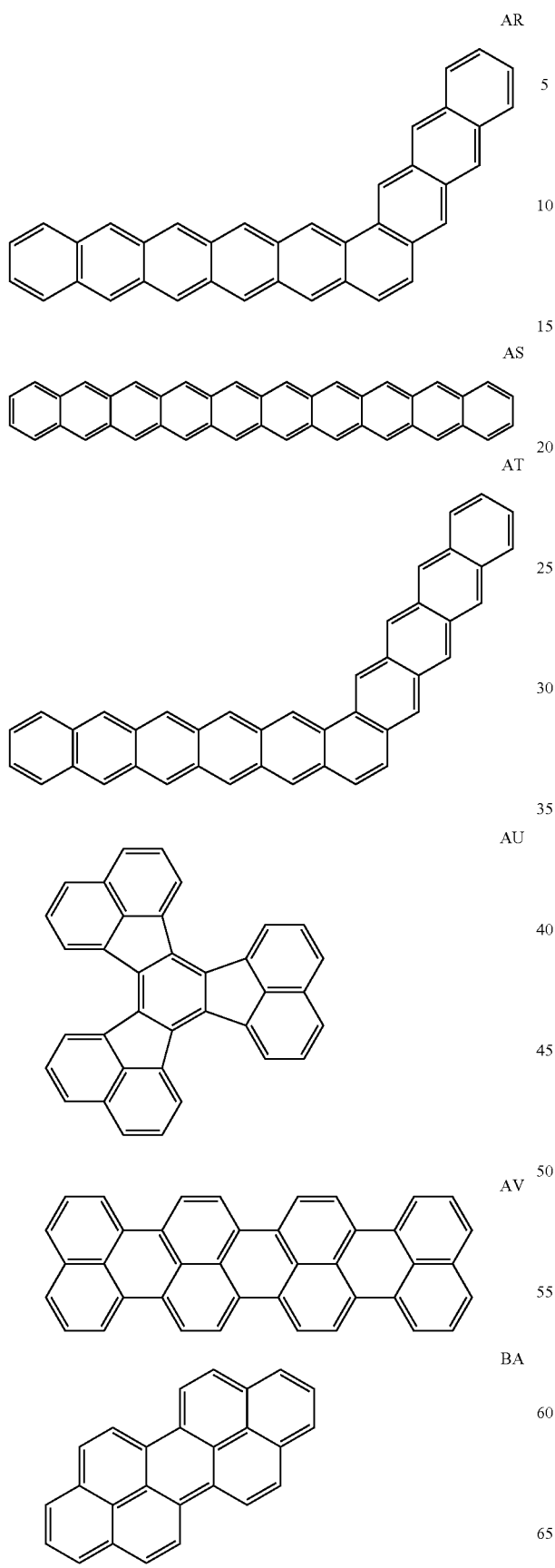
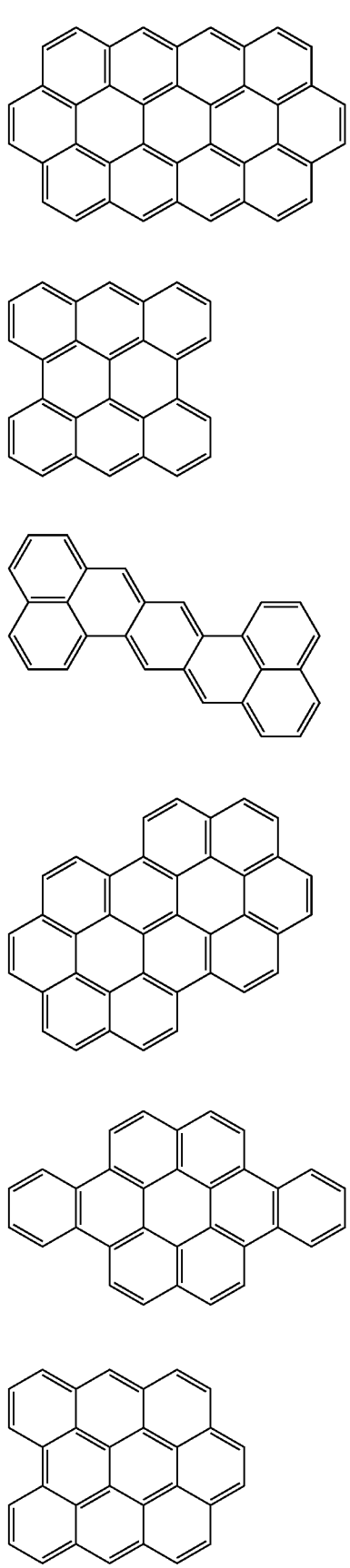

BH 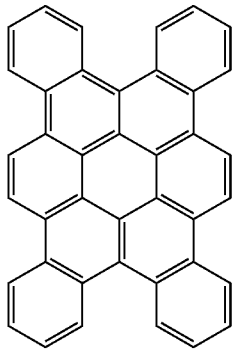

BI 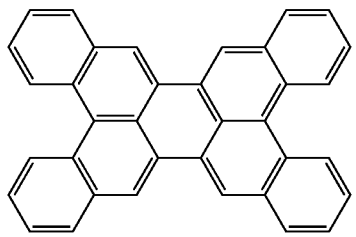

BJ 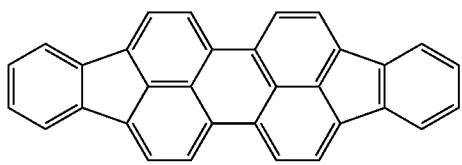

BK 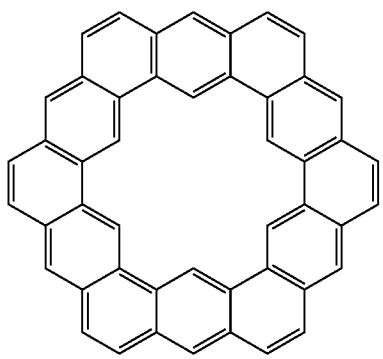

BO 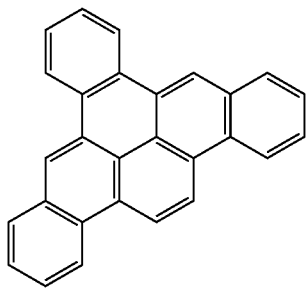

BQ 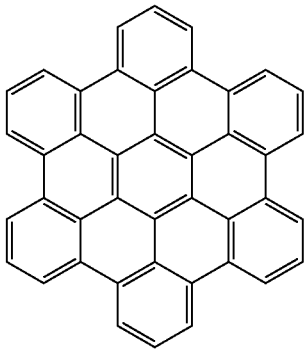

[Substituent W]

The substituent W in the specification is now described.

Examples of the substituent W include halogen atoms, alkyl groups (including cycloalkyl groups, bicycloalkyl groups and tricycloalkyl groups), alkenyl groups (including cycloalkenyl groups and bicycloalkenyl groups), alkynyl groups, aryl groups, heterocyclic groups, cyano group, hydroxy group, nitro group, carboxy group, alkoxy groups, aryloxy groups, silyloxy group, heterocyclic oxy groups, acyloxy groups, carbamoyloxy group, alkoxycarbonyloxy groups, aryloxycarbonyloxy groups, amino groups (including anilino group), ammonio group, acylamino groups, aminocarbonylamino groups, alkoxycarbonylamino groups, aryloxycarbonylamino groups, sulfamoylamino groups, alkyl or arylsulfonylamino groups, mercapto group, alkylthio groups, arylthio groups, heterocyclic thio groups, sulfamoyl group, sulfo group, alkyl or arylsulfinyl groups, alkyl or arylsulfonyl groups, acyl groups, aryloxycarbonyl groups, alkoxycarbonyl groups, carbamoyl group, aryl or heterocyclic azo groups, imido group, phosphino group, phosphinyl group, phosphinyloxy group, phosphinylamino groups, phosphono group, silyl group, hydrazino group, ureido group, boronic acid group (—B(OH)$_2$), phosphato group (—OPO(OH)$_2$), sulphato group (—OSO$_3$H) and other known substituents.

The substituent W is described in detail in paragraph of JP 2007-234651 A.

Two substituents W may be taken together to form a ring. Exemplary such rings include aromatic or non-aromatic hydrocarbon rings, aromatic or non-aromatic heterocyclic rings, and condensed polycyclic rings formed by further combinations thereof. Specific examples of the ring type include those to be described for the ring R.

Of the foregoing substituents W, those having a hydrogen atom may be further substituted with any of the foregoing groups after removal of the hydrogen atom. Exemplary such substituents include —CONHSO$_2$— group (sulfonylcarbamoyl group, carbonylsulfamoyl group), —CONHCO— group (carbonylcarbamoyl group) and —SO$_2$NHSO$_2$— group (sulfonylsulfamoyl group). More specific examples include an alkylcarbonylaminosulfonyl group (e.g., acetylaminosulfonyl), an arylcarbonylaminosulfonyl group (e.g., benzoylaminosulfonyl group), an alkylsulfonylaminocarbonyl group (e.g., methylsulfonylaminocarbonyl), and an arylsulfonylaminocarbonyl group (e.g., p-methylphenylsulfonylaminocarbonyl).

[Ring R]

Exemplary rings R in the specification include aromatic or non-aromatic hydrocarbon rings, heterocyclic rings, and condensed polycyclic rings formed by further combinations thereof. Examples of the ring include benzene ring, naphthalene ring, anthracene ring, phenanthrene ring, fluorene ring, triphenylene ring, naphthacene ring, biphenyl ring, pyrrole ring, furan ring, thiophene ring, imidazole ring, oxazole ring, thiazole ring, pyridine ring, pyrazine ring, pyrimidine ring, pyridazine ring, indolizine ring, indole ring, benzofuran ring, benzothiophene ring, isobenzofuran ring, quinolizine ring, quinoline ring, phthalazine ring, naphthyridine ring, quinoxaline ring, quinoxazoline ring, isoquinoline ring, carbazole ring, phenanthridine ring, acridine ring, phenanthroline ring, thianthrene ring, chromene ring, xanthene ring, phenoxathiin ring, phenothiazine ring, and phenazine ring.

(Other Materials)

The photoelectric conversion layer 12 may further contain an organic p-type compound or an organic n-type compound as the photoelectric conversion material.

The organic p-type semiconductor (compound) is a donor organic semiconductor (compound) mainly typified by a hole transport organic compound and refers to an organic compound having electron-donating properties. More specifically, when two organic materials are used in contact with each other, an organic compound having a smaller ionization potential is the organic p-type semiconductor. Therefore, any organic compound can be used as the donor organic compound if it is an electron-donating organic compound. For example, a triarylamine compound, a benzidine compound, a pyrazoline compound, a styrylamine compound, a hydrazone compound, a triphenylmethane compound and a carbazole compound can be used.

The organic n-type semiconductor (compound) is an acceptor organic semiconductor mainly typified by an electron transport organic compound and refers to an organic compound having electron-accepting properties. Since this compound is a semiconductor, conductors such as nanotubes, graphite and conductive polymers are not included. More specifically, when two organic compounds are used in contact with each other, an organic compound having a larger electron affinity is the organic n-type semiconductor. Therefore, any organic compound can be used as the acceptor organic compound if it is an electron-accepting organic compound. Preferred examples include fullerenes or fullerene derivatives, condensed aromatic carbocyclic compounds (naphthalene derivatives, anthracene derivatives, phenanthrene derivatives, tetracene derivatives, pyrene derivatives, perylene derivatives, fluoranthene derivatives), 5- to 7-membered heterocyclic compounds containing nitrogen atom, oxygen atom or sulfur atom (e.g., pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyraridine, pyrrolopyridine, thiadiazolopyridine, dibenzazepine, tribenzazepine), polyarylene compounds, fluorene compounds, cyclopentadiene compounds, silyl compounds, and metal complexes having a nitrogen-containing heterocyclic compound as a ligand.

Fullerenes or fullerene derivatives are preferable organic n-type semiconductors. Fullerenes include fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$ and mixed fullerenes, and fullerene derivatives refer to compounds obtained by adding a substituent to these fullerenes. The substituent is preferably an alkyl group, an aryl group or a heterocyclic group. The compounds described in JP 2007-123707 A are preferred fullerene derivatives.

The photoelectric conversion layer 12 preferably has a bulk heterojunction structure formed in such a state that the condensed polycyclic hydrocarbon is mixed with a fullerene or a fullerene derivative. The bulk heterojunction structure refers to a film in which a p-type organic semiconductor (condensed polycyclic hydrocarbon) and an n-type organic semiconductor are mixed and dispersed in the photoelectric conversion layer 12. The bulk heterojunction structure can be formed by any of a wet process and a dry process but is preferably formed by a codeposition process. By incorporating the heterojunction structure, the photoelectric conversion efficiency of the photoelectric conversion layer can be improved while compensating for the short carrier diffusion length of the photoelectric conversion layer. The bulk heterojunction structure is described in detail, for example, in paragraphs [0013] to [0014] of JP 2005-303266 A.

The molar ratio of the organic n-type compound to the condensed polycyclic hydrocarbon in the photoelectric conversion layer 12 (organic n-type compound/condensed polycyclic hydrocarbon described above) is preferably 0.5 or more, more preferably 1 or more but 10 or less, and even more preferably 2 or more but 5 or less because the effects of the invention are more excellent.

The photoelectric conversion layer 12 containing the condensed polycyclic hydrocarbon according to the invention (and optionally containing the organic n-type compound) is a non-luminescent layer and has characteristics different from the organic electroluminescence device (OLED). The non-luminescent layer is a layer having luminescent quantum efficiency of 10 or less, and the luminescent quantum efficiency is more preferably 0.5% or less and even more preferably 0.1% or less.

(Film Forming Method)

The photoelectric conversion layer 12 can be formed by a dry film forming process or a wet film forming process. Specific examples of the dry film forming process include physical vapor deposition processes including vacuum deposition, sputtering, ion plating and molecular beam epitaxy (MBE), and chemical vapor deposition (CVD) processes such as plasma polymerization. Examples of the wet film forming process that may be used include casting, spin coating, dipping and Langmuir-Blodgett (LB) process. Dry film forming processes are preferable and vacuum deposition is more preferable. In cases where a film is formed by vacuum deposition, the manufacturing conditions such as the degree of vacuum and vapor deposition temperature can be set according to a common method.

The condensed polycyclic hydrocarbon is preferably used in the photoelectric conversion layer 12 in an amount, in terms of a single layer, of 10 to 300 nm, more preferably 30 to 150 nm and most preferably 50 to 120 nm because the photoelectric conversion element has more excellent heat resistance.

The photoelectric conversion layer 12 preferably has a thickness of 10 to 1,000 nm, more preferably 50 to 800 nm and most preferably 100 to 500 nm. An appropriate dark current suppressing effect is obtained by adjusting the thickness to 10 nm or more and an appropriate photoelectric conversion efficiency is obtained by adjusting the thickness to 1,000 nm or less.

The thin-film absorption maximum wavelength of the condensed polycyclic hydrocarbon preferably has absorption maximum at 400 nm or more but less than 720 nm in order to reduce the thickness of the photoelectric conversion layer 12 to thereby obtain an element having high charge collection efficiency and high responsiveness. The thin-film absorption maximum wavelength is preferably 450 nm or more but 700 nm or less and more preferably 480 nm or more but 700 nm or less in terms of broad absorption of light in the visible region. The thin-film absorption maximum wavelength is even more preferably 500 nm or more, still even more preferably 500 nm or more but 680 nm or less and most preferably 550 nm or more but 680 nm or less in terms of more excellent photoelectric conversion efficiency of the element.

A thin film of the condensed polycyclic hydrocarbon with a thickness of about 100 nm is formed on a glass substrate by vacuum heating vapor deposition, and from its transmission spectrum, the thin-film absorption maximum wavelength of the condensed polycyclic hydrocarbon which is the longest wavelength in the transmission spectrum is determined.

In cases where the photoelectric conversion layer 12 is prepared by vacuum deposition, the vapor deposition rate of the condensed polycyclic hydrocarbon is preferably 1.0 angstrom/s (angstrom/second) or more and more preferably 2.0 angstroms/s or more because the photoelectric conversion element has more excellent photoelectric conversion efficiency and dark current characteristics. The upper limit is not particularly limited and is usually 5.0 angstroms/s or less in many cases.

In cases where the photoelectric conversion layer 12 contains the organic n-type semiconductor (in particular a fullerene or a fullerene derivative), the vapor deposition rate of the organic n-type semiconductor is also preferably in the above-defined range.

[Electron-Blocking Layer]

The photoelectric conversion element of the invention includes the electron-blocking layer 16A which contains the compound A including a residue after removal of at least one group of $Ra_1$ to $Ra_9$ from the compound represented by general formula (A) to be described later and having a glass transition point (Tg) of 200° C. or more. The photoelectric conversion element which exhibits high photoelectric conversion efficiency and low dark current characteristics and in which the deterioration of these characteristics is suppressed even after heating treatment can be obtained by using this compound.

In general, the material making up the electron-blocking layer should often be designed so as to have a comparatively small ionization potential (Ip) for the following reasons:
(1) A portion of the electron-blocking layer in contact with the electrode preferably has a sufficiently small electron affinity (Ea) to suppress the electronic injection from the electrode and as a result tends to have a comparatively small Ip.
(2) A portion of the electron-blocking layer in contact with the photoelectric conversion layer must be designed so as to have a smaller Ip than that of the hole transport portion in the photoelectric conversion layer for hole migration from the photoelectric conversion layer to the electron-blocking layer without energy barrier.

On the other hand, with the use of the compound A (preferably the compound represented by general formula (F-1)), source charges can be used in a more suppressed form even at the same Ip when the compound A comes in contact with a material having a large Ea in the photoelectric conversion layer.

The compound represented by general formula (A) is first described below in detail.

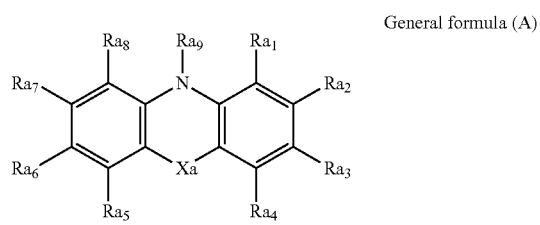

General formula (A)

$Ra_1$ to $Ra_8$ in general formula (A) each independently represent a hydrogen atom, a halogen atom, an alkyl group, an aryl group, a heterocyclic group, a hydroxyl group, an amino group or a mercapto group.

These groups may further have a substituent, a specific example thereof including the substituent W. Two or more of these substituents may be taken together to form a ring.

In terms of more excellent heat resistance of the photoelectric conversion element, $Ra_1$ to $Ra_8$ each represent preferably a hydrogen atom, a halogen atom, an alkyl group having 1 to 18 carbon atoms, an aryl group having 6 to 18 carbon atoms or a heterocyclic group having 4 to 16 carbon atoms, more preferably a hydrogen atom, an alkyl group having 1 to 12 carbon atoms, an aryl group having 6 to 14 carbon atoms or a heterocyclic group having 6 to 14 carbon atoms, and even more preferably a hydrogen atom, an alkyl group having 1 to 6 carbon atoms, an aryl group having 6 to 10 carbon atoms or a heterocyclic group having 6 to 12 carbon atoms. The alkyl group may be branched.

$Ra_9$ in general formula (A) represents an alkyl group, an aryl group or a heterocyclic group. These groups may further have a substituent, a specific example thereof including the substituent W. Two or more of these substituents may be taken together to form a ring.

In terms of more excellent heat resistance of the photoelectric conversion element, $Ra_9$ is preferably an aryl group having 6 to 18 carbon atoms or a heterocyclic group having 4 to 16 carbon atoms, more preferably an aryl group having 6 to 14 carbon atoms or a heterocyclic group having 6 to 14 carbon atoms, and even more preferably an aryl group having 6 to 10 carbon atoms or a heterocyclic group having 6 to 12 carbon atoms.

Xa represents a single bond, an oxygen atom, a sulfur atom, an alkylene group, a dialkylsilylene group, an alkenylene group, a cycloalkylene group, a cycloalkenylene group, an arylene group, a divalent heterocyclic group or an imino group, which may further have a substituent (e.g., the substituent W).

In terms of more excellent heat resistance of the photoelectric conversion element, Xa preferably represents a single bond, an alkylene group having 1 to 12 carbon atoms, an alkenylene group having 2 to 12 carbon atoms, an arylene group having 6 to 14 carbon atoms, a heterocyclic group having 4 to 13 carbon atoms, an oxygen atom, a sulfur atom, an imino group having a hydrocarbon group having 1 to 12 carbon atoms (preferably an aryl group or an alkyl group) (e.g., phenylimino group, methylimino group, t-butylimino group), or a dialkylsilylene group, more preferably a single bond, an oxygen atom, an alkylene group having 1 to 6 carbon atoms (e.g., methylene group, 1,2-ethylene group, 1,1-dimethylmethylene group), an alkenylene group having 2 carbon atoms (e.g., $-CH_2=CH_2-$), an arylene group having 6 to 10 carbon atoms (e.g., 1,2-phenylene group, 2,3-naphthylene group) or a dialkylsilylene group, even more preferably a single bond, an oxygen atom or an alkylene group having 1 to 6 carbon atoms (e.g., methylene group, 1,2-ethylene group, 1,1-dimethylmethylene group), and most preferably a single bond, an oxygen atom or a methylene group.

The compound A has a residue (this residue is hereinafter also referred to simply as "residue A") after removal of at least one group of $Ra_1$ to $Ra_9$ from the compound represented by general formula (A). In other words, any one of $Ra_1$ to $Ra_9$ is removed and the compound represented by general formula (A) binds to the compound A through the portion where the group was removed.

The number of groups to be removed is not particularly limited and is usually from 1 to 4 and preferably 1.

It is particularly preferred for at least $Ra_9$ to be removed so that the compound represented by general formula (A) binds to the compound A through this portion. More specifically, the compound A preferably has a group represented by general formula (A-1) to be described later or a group represented by general formula (A-2) shown below. In general formula (A-2), * represents a bonding position. According to this embodiment, the photoelectric conversion element has more excellent heat resistance.

General formula (A-2)

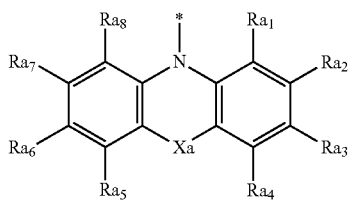

The compound A has a glass transition point (Tg) of 200° C. or more and most preferably 230° C. or more. The photoelectric conversion element has excellent heat resistance at a glass transition temperature within the above-defined range. The upper limit is not particularly limited and is usually 300° C. or less in many cases.

The photoelectric conversion element has poor heat resistance when the glass transition point of the compound A is less than 200° C.

The glass transition point of the compound A can be measured with a known device (e.g., DSC6200 manufactured by SII NanoTechnology Inc.).

Preferred Embodiment of Compound A

A preferred embodiment of the compound A includes a compound represented by general formula (F-1) shown below. By using this compound, the deterioration of the photoelectric conversion efficiency and the dark current performance after heating treatment can be further suppressed.

(F-1)

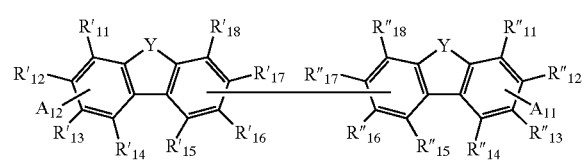

(In general formula (F-1), $R''_{11}$ to $R''_{18}$ and $R'_{11}$ to $R'_{18}$ each independently represent a hydrogen atom, a halogen atom, an alkyl group, an aryl group, a heterocyclic group, a hydroxyl group, an amino group or a mercapto group, which may further have a substituent; any one of $R''_{15}$ to $R''_{18}$ is combined with any one of $R'_{15}$ to $R'_{18}$ to form a single bond; $A_{11}$ and $A_{12}$ each independently represent a group represented by general formula (A-1) and are substituted for any one of $R''_{11}$ to $R''_{14}$ and any one of $R'_{11}$ to $R'_{14}$, respectively; and each Y independently represents a carbon atom, a nitrogen atom, an oxygen atom, a sulfur atom or a silicon atom, which may further have a substituent.)

General formula (A-1)

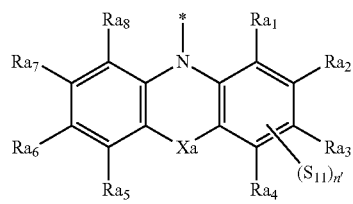

(In general formula (A-1), $Ra_1$ to $Ra_9$ each independently represent a hydrogen atom, a halogen atom, an alkyl group, an aryl group or a heterocyclic group, which may further have a substituent; * represents a bonding position; Xa represents a single bond, an oxygen atom, a sulfur atom, an alkylene group, a dialkylsilylene group, an alkenylene group, a cycloalkylene group, a cycloalkenylene group, an arylene group, a divalent heterocyclic group or an imino group, which may further have a substituent; each $S_{11}$ independently represents a substituent ($S_{11}$) shown below and is substituted for any one of $Ra_1$ to $Ra_8$; and n' represents an integer of 0 to 4.)

Substituent ($S_{11}$)

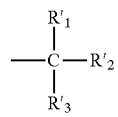

($R'_1$ to $R'_3$ each independently represent a hydrogen atom or an alkyl group.)

In general formula (F-1), $R''_{11}$ to $R''_{18}$ and $R'_{11}$ to $R'_{18}$ each independently represent a hydrogen atom, a halogen atom, an alkyl group, an aryl group, a heterocyclic group, a hydroxyl group, an amino group or a mercapto group, which may further have a substituent.

A specific example of the additional substituent includes the substituent W. The substituent is preferably a halogen atom, an alkyl group, an aryl group, a heterocyclic group, a hydroxyl group, an amino group or a mercapto group, more preferably a halogen atom, an alkyl group, an aryl group or a heterocyclic group, even more preferably a fluorine atom, an alkyl group or an aryl group, still even more preferably an alkyl group or an aryl group, and most preferably an alkyl group because the effects of the invention are more excellent.

In terms of more excellent heat resistance of the photoelectric conversion element, $R''_{11}$ to $R''_{18}$ and $R'_{11}$ to $R'_{18}$ are each preferably a hydrogen atom, an alkyl group, an aryl group or a heterocyclic group, and more preferably a hydrogen atom, an alkyl group having 1 to 18 carbon atoms, an aryl group having 6 to 18 carbon atoms or a heterocyclic group having 4 to 16 carbon atoms. Of these, it is preferred for $R''_{12}$ and $R'_{12}$ to be each independently substituted with the substituent represented by general formula (A-1); it is more preferred for $R''_{12}$ and $R'_{12}$ to be each independently substituted with the substituent represented by general formula (A-1) and for $R''_{11}$, $R''_{13}$ to $R''_{18}$, $R'_{11}$ and $R'_{13}$ to $R'_{18}$ to be each a hydrogen atom or an alkyl group having 1 to 18 carbon atoms, and it is particularly preferred for $R''_{12}$ and $R'_{12}$ to be each independently substituted with the substituent represented by general formula (A-1) and for $R''_{11}$, $R''_{13}$ to $R''_{18}$, $R'_{11}$ and $R'_{13}$ to $R'_{18}$ to be each a hydrogen atom.

Each Y independently represents a carbon atom, a nitrogen atom, an oxygen atom, a sulfur atom or a silicon atom, which may further have a substituent. In other words, Y represents a divalent linkage group including a carbon atom, a nitrogen atom, an oxygen atom, a sulfur atom or a silicon atom. Of these, $-C(R'_{21})(R'_{22})-$, $-Si(R'_{23})(R'_{24})-$ and $-N(R'_{20})-$ are preferred and $-C(R'_{21})(R'_{22})-$ and $-N(R'_{20})-$ are more preferred, and $-C(R'_{21})(R'_{22})-$ is most preferred.

$R'_{21}$ to $R'_{24}$ each independently represent a hydrogen atom, a halogen atom, an alkyl group, an aryl group, a heterocyclic group, a hydroxyl group, an amino group or a mercapto group. These groups may have a substituent, a specific example thereof including the substituent W.

In terms of more excellent heat resistance of the photoelectric conversion element, $R'_{21}$ to $R'_{24}$ each represent preferably a hydrogen atom, an alkyl group, an aryl group or a heterocyclic group, more preferably a hydrogen atom, an alkyl group having 1 to 18 carbon atoms, an aryl group having 6 to 18 carbon atoms or a heterocyclic group having 4 to 16 carbon atoms, even more preferably a hydrogen atom or an alkyl group having 1 to 18 carbon atoms, and most preferably an alkyl group having 1 to 18 carbon atoms.

$R'_{20}$ represents an alkyl group, an aryl group or a heterocyclic group. These groups may have a substituent, a specific example thereof including the substituent W.

In terms of more excellent heat resistance of the photoelectric conversion element, $R'_{20}$ preferably represents a hydrogen atom, an alkyl group having 1 to 18 carbon atoms, an aryl group having 6 to 18 carbon atoms or a heterocyclic group having 4 to 16 carbon atoms, more preferably a hydrogen atom or an alkyl group having 1 to 18 carbon atoms, and most preferably an alkyl group having 1 to 18 carbon atoms.

$Ra_1$ to $Ra_8$ in general formula (A-1) each independently represent a hydrogen atom, a halogen atom, an alkyl group, an aryl group, a heterocyclic group, a hydroxyl group, an amino group or a mercapto group. These groups may have a substituent, a specific example thereof including the substituent W. Two or more of these substituents may be taken together to form a ring.

In terms of more excellent heat resistance of the photoelectric conversion element, $Ra_1$ to $Ra_8$ each represent preferably a hydrogen atom, a halogen atom, an alkyl group having 1 to 18 carbon atoms, an aryl group having 6 to 18 carbon atoms or a heterocyclic group having 4 to 16 carbon atoms, more preferably a hydrogen atom, an alkyl group having 1 to 12 carbon atoms or an aryl group having 6 to 14 carbon atoms, and even more preferably a hydrogen atom, an alkyl group having 1 to 6 carbon atoms or an aryl group having 6 to 10 carbon atoms. The alkyl group may be branched.

Preferred specific examples thereof include hydrogen atom, methyl group, ethyl group, propyl group, butyl group, hexyl group, cyclohexyl group, phenyl group and naphthyl group.

The case in which $Ra_3$ and $Ra_6$ are each a hydrogen atom or an alkyl group having 1 to 6 carbon atoms and $Ra_1$, $Ra_2$, $Ra_4$, $Ra_5$, $Ra_7$ and $Ra_8$ are each a hydrogen atom is particularly preferred.

Xa represents a single bond, an oxygen atom, a sulfur atom, an alkylene group, a dialkylsilylene group, an alkenylene group, a cycloalkylene group, a cycloalkenylene group, an arylene group, a divalent heterocyclic group or an imino group, which may further have a substituent.

In terms of more excellent heat resistance of the photoelectric conversion element, Xa preferably represents a single bond, an alkylene group having 1 to 12 carbon atoms, an alkenylene group having 2 to 12 carbon atoms, an arylene group having 6 to 14 carbon atoms, a heterocyclic group having 4 to 13 carbon atoms, an oxygen atom, a sulfur atom, an imino group having a hydrocarbon group having 1 to 12 carbon atoms (preferably an aryl group or an alkyl group) (e.g., phenylimino group, methylimino group, t-butylimino group), or a dialkylsilylene group, more preferably a single bond, an oxygen atom, an alkylene group having 1 to 6 carbon atoms (e.g., methylene group, 1,2-ethylene group, 1,1-dimethylmethylene group), an alkenylene group having 2 carbon atoms (e.g., $-CH_2=CH_2-$), an arylene group having 6 to 10 carbon atoms (e.g., 1,2-phenylene group, 2,3-naphthylene group) or a dialkylsilylene group, and even more preferably a single bond, an oxygen atom or an alkylene group having 1 to 6 carbon atoms (e.g., methylene group, 1,2-ethylene group, 1,1-dimethylmethylene group). These substituents may further have the substituent W.

Specific examples of the group represented by general formula (A-1) include groups illustrated below as N1 to N11. However, the group represented by general formula (A-1) is not limited to these groups. The group represented by general formula (A-1) is preferably N-1 to N-7, more preferably N-1 to N-6, even more preferably N-1 to N-3, still even more preferably N-1 to N-2 and most preferably N-1.

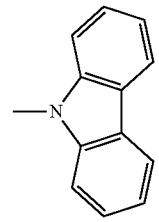

N-1

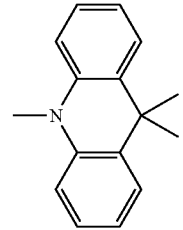

N-2

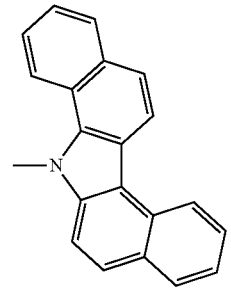

N-3

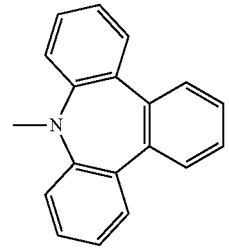

N-4

N-5 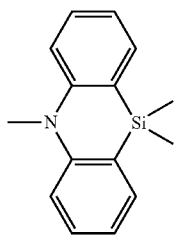

N-6 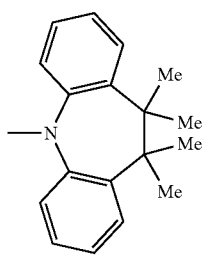

N-7 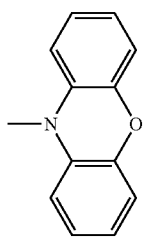

N-8 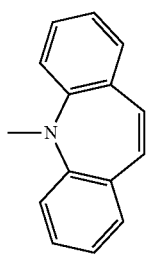

N-9 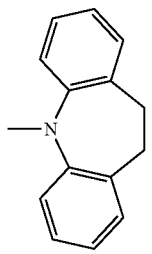

N-10 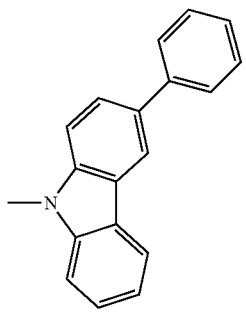

N-11 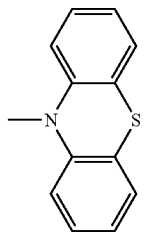

In the substituent ($S_{11}$), $R'_1$ represents a hydrogen atom or an alkyl group; $R'_1$ preferably represents a methyl group, an ethyl group, a propyl group, an iso-propyl group, a butyl group or a tert-butyl group, more preferably a methyl group, an ethyl group, a propyl group, an iso-propyl group or a tert-butyl group, even more preferably a methyl group, an ethyl group, an iso-propyl group or a tert-butyl group, and most preferably a methyl group, an ethyl group or a tert-butyl group.

$R'_2$ represents a hydrogen atom or an alkyl group. $R'_2$ preferably represents a hydrogen atom, a methyl group, an ethyl group, a propyl group, an iso-propyl group, a butyl group or a tert-butyl group, more preferably a hydrogen atom, a methyl group, an ethyl group or a propyl group, even more preferably a hydrogen atom or a methyl group, and most preferably a methyl group.

$R'_3$ represents a hydrogen atom or an alkyl group. $R'_3$ preferably represents a hydrogen atom or a methyl group and more preferably a methyl group.

Two or more of $R'_1$ to $R'_3$ may be taken together to form a ring. When a ring is formed, the number of atoms in the ring is not particularly limited and a 5- or 6-membered ring is preferred and a 6-membered ring is more preferred.

$S_{11}$ represents the substituent ($S_{11}$) and is substituted for any one of $Ra_1$ to $Ra_8$. It is preferred for at least one of $Ra_3$ and $Ra_6$ in general formula (A-1) to each independently represent the substituent ($S_{11}$).

Preferred examples of the substituent ($S_{11}$) include (a) to (x) shown below. (a) to (j) are more preferred, (a) to (h) are even more preferred, (a) to (f) are still more preferred, (a) to (c) are still even more preferred, and (a) is most preferred.

 (a)

 (b)

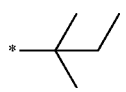 (c)

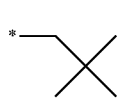 (d)

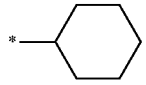 (e)

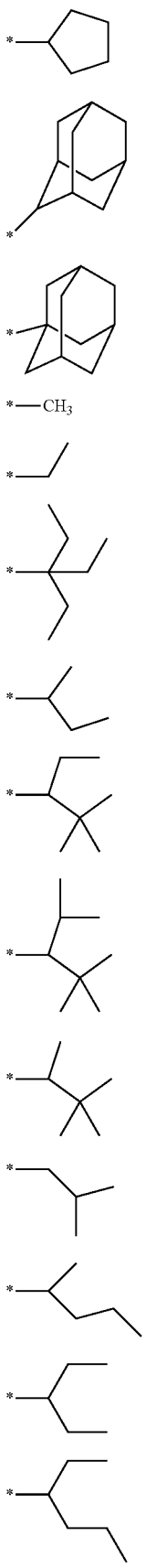

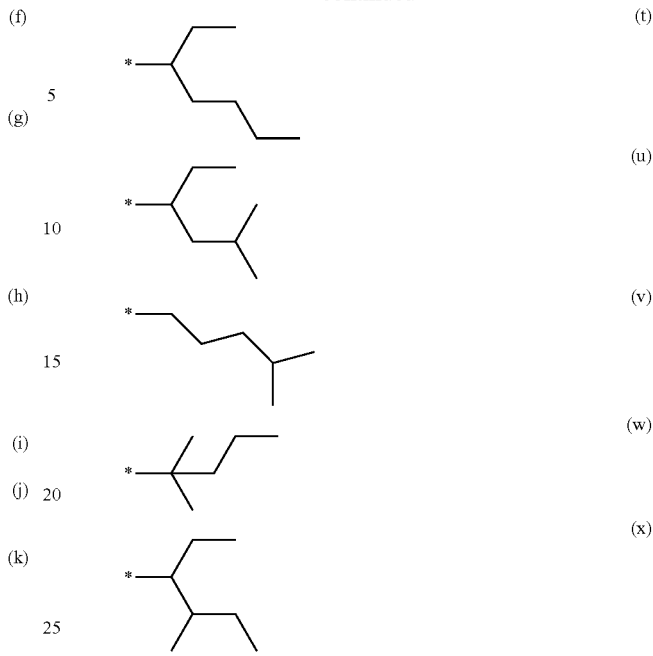

Each n' independently represents an integer of 0 to 4, preferably 0 to 3, more preferably 0 to 2, even more preferably 1 to 2, and most preferably 2.

The group represented by general formula (A-1) shown above may be a group represented by general formula (A-3) shown below, a group represented by general formula (A-4) shown below or a group represented by general formula (A-5) shown below.

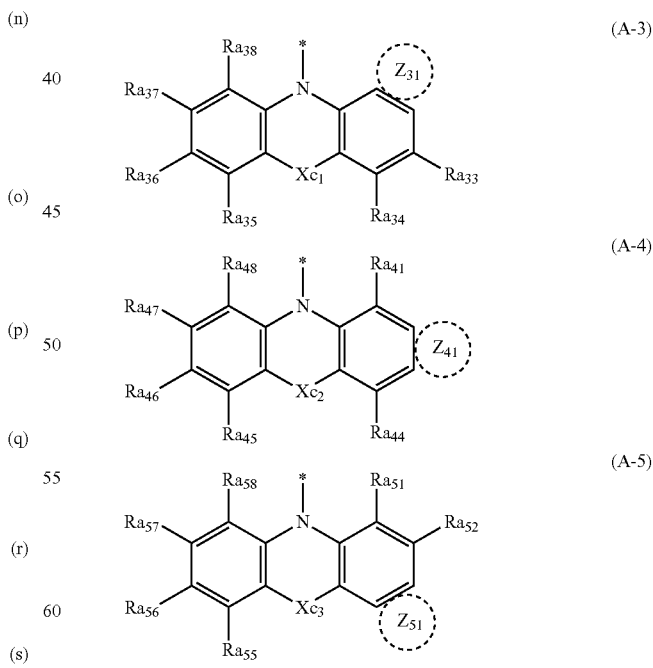

(In general formulae (A-3) to (A-5), $Ra_{33}$ to $Ra_{38}$, $Ra_{41}$, $Ra_{44}$ to $Ra_{48}$, $Ra_{51}$, $Ra_{52}$ and $Ra_{55}$ to $Ra_{58}$ each independently represent a hydrogen atom, a halogen atom or an alkyl group, which may further have a substituent; * represents a bonding position; $Xc_1$, $Xc_2$ and $Xc_3$ each independently represent a single bond, an oxygen atom, a sulfur atom, an alkylene group, a dialkylsilylene group, an alkenylene group, a cycloalkylene group, a cycloalkenylene group, an arylene group, a divalent heterocyclic group or an imino group, which may further have a substituent; and $Z_{31}$, $Z_{41}$ and $Z_{51}$ each independently represent a cycloalkyl ring, an aromatic hydrocarbon ring or an aromatic heterocyclic ring, which may further have a substituent.)

In general formulae (A-3) to (A-5), $Ra_{33}$ to $Ra_{38}$, $Ra_{41}$, $Ra_{44}$ to $Ra_{48}$, $Ra_{51}$, $Ra_{52}$ and $Ra_{55}$ to $Ra_{58}$ each independently represent a hydrogen atom, a halogen atom (preferably a fluorine atom, a chlorine atom, a bromine atom or an iodine atom), or an alkyl group. A hydrogen atom or an alkyl group is preferred and a hydrogen atom is more preferred because a substituent having low polarity is advantageous for hole transport.

When $Ra_{33}$ to $Ra_{38}$, $Ra_{41}$, $Ra_{44}$ to $Ra_{48}$, $Ra_{51}$, $Ra_{52}$ and $Ra_{55}$ to $Ra_{58}$ are each an alkyl group, the alkyl group is preferably one having 1 to 18 carbon atoms, more preferably one having 1 to 12 carbon atoms, and even more preferably one having 1 to 6 carbon atoms. More specifically, methyl group, ethyl group, propyl group, butyl group, hexyl group or cyclohexyl group is preferred.

In general formulae (A-3) to (A-5), any adjacent two of $Ra_{33}$ to $Ra_{38}$, $Ra_{41}$, $Ra_{44}$ to $Ra_{48}$, $Ra_{51}$, $Ra_{52}$ and $Ra_{55}$ to $Ra_{58}$ may be taken together to form a ring. The above-described ring R is used as the ring. Preferred examples of the ring include a benzene ring, a naphthalene ring, an anthracene ring, a pyridine ring and a pyrimidine ring.

$Xc_1$, $Xc_2$ and $Xc_3$ each independently represent a single bond, an oxygen atom, a sulfur atom, an alkylene group, a dialkylsilylene group, an alkenylene group, a cycloalkylene group, a cycloalkenylene group, an arylene group, a divalent heterocyclic group or an imino group. When $Xc_1$, $Xc_2$ and $Xc_3$ each represent an alkylene group, a dialkylsilylene group, an alkenylene group, a cycloalkylene group, a cycloalkenylene group, an arylene group, a divalent heterocyclic group or an imino group, these groups may further have a substituent. A specific example of the further substituent includes the substituent W.

In terms of more excellent heat resistance of the photoelectric conversion element, $Xc_1$, $Xc_2$ and $Xc_3$ each represent preferably a single bond, an alkylene group having 1 to 12 carbon atoms, an alkenylene group having 2 to 12 carbon atoms, an arylene group having 6 to 14 carbon atoms, a heterocyclic group having 4 to 13 carbon atoms, an oxygen atom, a sulfur atom, an imino group having a hydrocarbon group having 1 to 12 carbon atoms (preferably an aryl group or an alkyl group) (e.g., phenylimino group, methylimino group, t-butylimino group), and more preferably a single bond, an alkylene group having 1 to 6 carbon atoms (e.g., methylene group, 1,2-ethylene group, 1,1-dimethylmethylene group), an alkenylene group having 2 carbon atoms (e.g., —CH$_2$=CH$_2$—), an arylene group having 6 to 10 carbon atoms (e.g., 1,2-phenylene group, 2,3-naphthylene group).

$Z_{31}$, $Z_{41}$ and $Z_{51}$ each independently represent a cycloalkyl ring, an aromatic hydrocarbon ring or an aromatic heterocyclic ring. In general formulae (A-3) to (A-5), $Z_{31}$, $Z_{41}$ and $Z_{51}$ are condensed with a benzene ring. $Z_{31}$, $Z_{41}$ and $Z_{51}$ are each preferably an aromatic hydrocarbon ring because high heat resistance and high hole transport properties of the photoelectric conversion element can be expected.

Another preferred embodiment of the compound A includes a compound represented by general formula (F-2) shown below. By using this compound, the deterioration of the photoelectric conversion efficiency and the dark current performance after heating treatment can be further suppressed.

General formula (F-2)

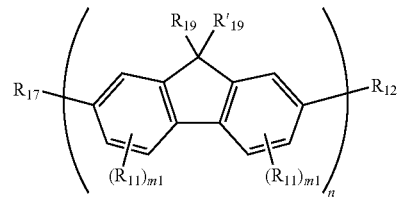

In general formula (F-2), each $R_{11}$ independently represents a halogen atom, an alkyl group, an aryl group, a heterocyclic group, a hydroxyl group, an amino group or a mercapto group; $R_{12}$, $R_{17}$, $R_{19}$ and $R'_{19}$ each independently represent a hydrogen atom, a halogen atom, an alkyl group, an aryl group, a heterocyclic group, a hydroxyl group, an amino group or a mercapto group, provided that at least one of $R_{12}$ and $R_{17}$ represents the residue A (preferably the group represented by general formula (A-1)); and $m_1$ represents an integer of 0 to 3. In cases where there are a plurality of $R_{11}$ groups, the $R_{11}$ groups may be different from each other.

n represents the number of recurring units in the parentheses. n represents an integer of 1 to 4.

The groups represented by $R_{11}$, $R_{12}$, $R_{17}$, $R_{19}$ and $R'_{19}$ may further have a substituent, a specific example thereof including the substituent W.

In general formula (F-2), n represents an integer of 1 to 4, preferably 1 to 3, and most preferably 1 or 2.

Still another preferred embodiment of the compound A includes a compound represented by general formula (F-3) shown below. By using this compound, the deterioration of the photoelectric conversion efficiency and the dark current performance after heating treatment can be further suppressed.

General formula (F-3)

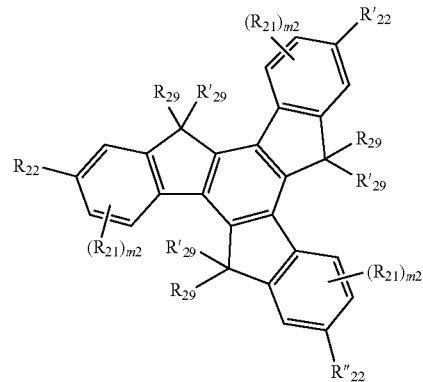

In general formula (F-3), $R_{21}$ represents a halogen atom, an alkyl group, an aryl group, a heterocyclic group, a hydroxyl group, an amino group or a mercapto group; $R_{22}$, $R'_{22}$, $R''_{22}$, $R_{29}$ and $R'_{29}$ each independently represent a hydrogen atom, a halogen atom, an alkyl group, an aryl group, a heterocyclic group, a hydroxyl group, an amino group or a mercapto group, provided that at least one of $R_{22}$, $R'_{22}$ and $R''_{22}$ represents the residue A (preferably the group represented by general formula (A-1)); and $m_2$ represents an integer of 0 to 3. In cases where there are a plurality of $R_{21}$ groups, the $R_{21}$ groups may be different from each other. In cases where there are a plurality of $R_{29}$ groups and a plurality of $R'_{29}$ groups, they may be the same or different.

The group represented by $R_{21}$, $R_{22}$, $R'_{22}$, $R''_{22}$, $R_{29}$ or $R'_{29}$ may further have a substituent, a specific example thereof including the substituent W.

Yet another preferred embodiment of the compound A includes a compound represented by general formula (F-4) shown below. By using this compound, the deterioration of the photoelectric conversion efficiency and the dark current performance after heating treatment can be further suppressed.

General formula (F-4)

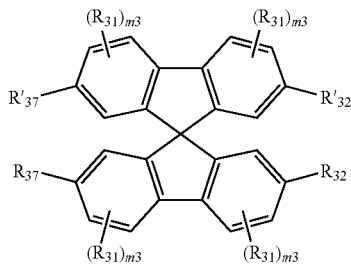

In general formula (F-4), $R_{31}$ represents a halogen atom, an alkyl group, an aryl group, a heterocyclic group, a hydroxyl group, an amino group or a mercapto group; $R_{32}$, $R_{37}$, $R'_{32}$ and $R'_{37}$ each independently represent a hydrogen atom, a halogen atom, an alkyl group, an aryl group, a heterocyclic group, a hydroxyl group, an amino group or a mercapto group, provided that at least one of $R_{32}$, $R'_{32}$, $R_{37}$ and $R'_{37}$ represents the residue A (preferably the group represented by general formula (A-1)); and $m_3$ represents an integer of 0 to 3. In cases where there are a plurality of $R_{31}$ groups, the $R_{31}$ groups may be different from each other.

The groups represented by $R_{31}$, $R_{32}$, $R_{37}$, $R'_{32}$ and $R'_{37}$ may further have a substituent, a specific example thereof including the substituent W.

$R_{11}$, $R_{21}$ and $R_{31}$ in general formulae (F-2) to (F-4) each independently represent preferably an alkyl group having 1 to 18 carbon atoms, an aryl group having 6 to 18 carbon atoms or a heterocyclic group having 4 to 16 carbon atoms, more preferably an alkyl group having 1 to 12 carbon atoms or an aryl group having 6 to 14 carbon atoms, and most preferably an alkyl group having 1 to 6 carbon atoms or an aryl group having 6 to 10 carbon atoms. The alkyl group may be branched. These groups may have a substituent.

Preferred specific examples thereof include methyl group, ethyl group, propyl group, butyl group, hexyl group, cyclohexyl group, phenyl group and naphthyl group.

$m_1$, $m_2$ or $m_3$ is preferably 0.

In terms of more excellent heat resistance of the photoelectric conversion element, $R_{12}$, $R_{17}$, $R_{22}$, $R'_{22}$, $R''_{22}$, $R_{32}$, $R_{37}$, $R'_{32}$ and $R'_{37}$ each independently represent preferably a hydrogen atom, an alkyl group having 1 to 18 carbon atoms, an aryl group having 6 to 100 carbon atoms, a heterocyclic group having 4 to 16 carbon atoms, a substituted amino group having 2 to 80 carbon atoms (e.g., a secondary amino group or a tertiary amino group; more specifically a dialkylamino group or a diphenylamino group), or a substituted mercapto group having 1 to 18 carbon atoms (e.g., $-SCH_3$, $-SC_2H_5$ and $-SPh$); more preferably a hydrogen atom, an alkyl group having 1 to 12 carbon atoms, an aryl group having 6 to 80 carbon atoms or a substituted amino group having 6 to 60 carbon atoms; and most preferably a hydrogen atom, an alkyl group having 1 to 6 carbon atoms, an aryl group having 1 to 60 carbon atoms or a substituted amino group having 10 to 50 carbon atoms.

Preferred specific examples of $R_{12}$, $R_{17}$, $R_{22}$, $R'_{22}$, $R''_{22}$, $R_{32}$, $R_{37}$, $R'_{32}$ and $R'_{37}$ include hydrogen atom, methyl group, ethyl group, propyl group, butyl group, hexyl group, cyclohexyl group, phenyl group, naphthyl group, fluorenyl group and the groups illustrated in the description of the residue A.

$R_{12}$ and $R_{17}$, or $R_{22}$, $R'_{22}$ and $R'_{22}$, or $R_{32}$, $R_{37}$, $R'_{32}$ and $R'_{37}$ may be the same or different but are preferably the same because of easy synthesis.

In terms of more excellent heat resistance of the photoelectric conversion element, $R_{19}$, $R'_{19}$, $R_{29}$ and $R'_{29}$ each independently represent preferably a hydrogen atom, an alkyl group having 1 to 18 carbon atoms, an aryl group having 6 to 18 carbon atoms or a heterocyclic group having 4 to 16 carbon atoms, more preferably a hydrogen atom, an alkyl group having 1 to 12 carbon atoms or an aryl group having 6 to 14 carbon atoms, and most preferably an alkyl group having 1 to 6 carbon atoms or an aryl group having 6 to 10 carbon atoms. Preferred specific examples thereof include methyl group, ethyl group, propyl group, hexyl group, cyclohexyl group, phenyl group and naphthyl group. These groups may have a substituent.

A further preferred embodiment of the compound A includes a compound represented by general formula (F-5) shown below. By using this compound, the deterioration of the photoelectric conversion efficiency and the dark current performance after heating treatment can be further suppressed.

General formula (F-5)

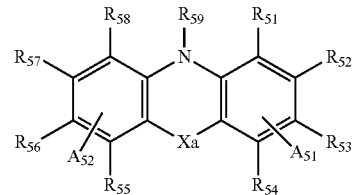

In general formula (F-5), $R_{51}$ to $R_{58}$ each independently represent a hydrogen atom, a halogen atom, an alkyl group, an aryl group, a heterocyclic group, a hydroxyl group, an amino group or a mercapto group, which may further have a substituent. A specific example of the additional substituent includes the substituent W. Two or more of these substituents may be taken together to form a ring. $R_{59}$ represents an alkyl group, an aryl group or a heterocyclic group, which may further have a substituent. A specific example of the additional substituent includes the substituent W. Two or more of the groups represented by $R_{51}$ to $R_{59}$ may be taken together to form a ring. Xa represents a single bond, an oxygen atom, a sulfur atom, an alkylene group, a dialkylsilylene group, an alkenylene group, a cycloalkylene group, a cycloalkenylene group, an arylene group, a divalent heterocyclic group or an imino group, which may further have a substituent. $A_{51}$ and $A_{52}$ each represent the residue A (preferably the group represented by general formula (A-1)) and are substituted for any one of $R_{51}$ to $R_{54}$ and any one of $R_{55}$ to $R_{58}$, respectively.

The preferable ranges of $R_{51}$ to $R_{58}$, $R_{59}$ and Xa are the same as those of $Ra_1$ to $Ra_8$, $Ra_9$ and Xa in general formula (A), respectively.

$A_{51}$ is preferably substituted for any one of $R_{52}$ and $R_{53}$ and is more preferably substituted for $R_{52}$. $A_{52}$ is preferably substituted for any one of $R_{56}$ and $R_{57}$ and is more preferably substituted for $R_{57}$.

The compound A preferably has a molecular weight of 500 to 2,000, more preferably 500 to 1,500 and most preferably 500 to 1,000. When the molecular weight is within the above-defined range, the decomposition of the compound is suppressed even at a high vapor deposition temperature and the photoelectric conversion element also has excellent heat resistance.

The ionization potential (Ip) of the compound A is preferably smaller than that of the material assuming hole transport in the photoelectric conversion layer in order to receive a hole without barriers from the material assuming hole transport in the photoelectric conversion layer. Particularly in cases where such an absorbing material as to have sensitivity in the visible region is selected, the compound A preferably has an Ip of 5.8 eV or less in order to become adapted to more materials. By adjusting the Ip to 5.8 eV or less, there is obtained the effect of exhibiting high charge collection efficiency and high responsiveness without causing barriers to charge transport.

The Ip is preferably 4.9 eV or more and more preferably 5.0 eV or more. A higher dark current suppressing effect is obtained by adjusting the Ip to 4.9 eV or more.

The Ip of the compound A can be measured by ultraviolet photoelectron spectroscopy (UPS) or using an atmospheric photoelectron spectrometer (e.g., AC-2 manufactured by Riken Keiki Co., Ltd.).

The Ip of the compound A can be adjusted in the above-defined range, for example, by changing the substituent to be attached to the skeleton.

(Manufacturing Method}

The method of manufacturing the electron-blocking layer 16A is not particularly limited and the electron-blocking layer 16A may be formed by a dry film forming process or a wet film forming process. Examples of the dry film forming process that can be used include vapor deposition and sputtering. Vapor deposition may be performed by physical vapor deposition (PVD) or chemical vapor deposition (CVD) but physical vapor deposition such as vacuum deposition is preferable. Examples of the wet film forming process that can be used include an ink-jet process, a spraying process, a nozzle printing process, a spin coating process, a dip coating process, a casting process, a die coating process, a roll coating process, a bar coating process and gravure coating process, and an ink-jet process is preferable in terms of high precision patterning.

The content of the compound A in the electron-blocking layer 16A is preferably 10 wt % or more but up to 100 wt %, more preferably 20 wt % or more but up to 100 wt %, and even more preferably 30 wt % or more but up to 100 wt % based on the total weight of the compound forming the electron-blocking layer 16A in terms of more excellent heat resistance, response speed and photoelectric conversion efficiency.

The compound A is preferably used in an amount of 10 to 300 nm, more preferably 30 to 150 nm and most preferably 50 to 120 nm in terms of the single layer because the photoelectric conversion element has more excellent heat resistance.

The electron-blocking layer 16A preferably has a thickness of 10 to 300 nm, more preferably 30 to 150 nm and most preferably 50 to 100 nm in terms of the single layer.

In cases where the electron-blocking layer 16A is used as the layer to be inserted between the photoelectric conversion layer and the hole-blocking layer, the electron-blocking layer 16A preferably has a thickness of up to 100 nm, more preferably up to 50 nm and even more preferably up to 20 nm in terms of the single layer.

The electron-blocking layer 16A may be of a multi-layered structure.

An inorganic material may also be used for the electron-blocking layer 16A. Since the inorganic material has generally a higher dielectric constant than the organic material, when the inorganic material is used in the electron-blocking layer 16A, a large amount of voltage is applied to the photoelectric conversion layer to enable an increase in the photoelectric conversion efficiency. Exemplary materials that may be used to form the electron-blocking layer 16A include calcium oxide, chromium oxide, chromium copper oxide, manganese oxide, cobalt oxide, nickel oxide, copper oxide, gallium copper oxide, strontium copper oxide, niobium oxide, molybdenum oxide, indium copper oxide, indium silver oxide and iridium oxide.

[Electrode]

The electrodes (upper electrode (transparent conductive film) 15 and the lower electrode (conductive film) 11) are formed of conductive materials. Exemplary conductive materials that may be used include metals, alloys, metal oxides, electrically conductive compounds, and mixtures thereof.

Since light enters from the upper electrode 15, the upper electrode 15 is to be sufficiently transparent with respect to light to be detected. More specifically, the upper electrode is formed of conductive metal oxides such as tin oxide doped with antimony or fluorine (ATO, FTO), tin oxide, zinc oxide, indium oxide, indium tin oxide (ITO), indium zinc oxide (IZO); thin films of metals such as gold, silver, chromium and nickel; mixtures or laminates of these metals and the conductive metal oxides; inorganic conductive substances such as copper iodide and copper sulfide; organic conductive materials such as polyaniline, polythiophene and polypyrrole; and laminates of these materials and ITO. Of these, transparent conductive metal oxides are preferred in terms of high electrical conductivity and transparency.

When the transparent conductive film made of s transparent conducting oxide (TCO) is used as the upper electrode 15, DC short circuit or an increase in leakage current may occur. One of the causes is considered to be as follows: fine cracks introduced into the photoelectric conversion layer 12 are covered with a compact TCO or other film to increase the conduction between the upper electrode 15 and the lower electrode 11 on the opposite side. Therefore, in the case of an aluminum electrode having poorer film quality, the leakage current is unlikely to increase. The increase in the leakage current can be considerably suppressed by controlling the film thickness of the upper electrode 15 with respect to the film thickness (i.e., crack depth) of the photoelectric conversion layer 12. It is desirable to adjust the thickness of the upper electrode 15 to one-fifth or less and preferably one-tenth or less of the thickness of the photoelectric conversion layer 12.

Generally, the resistance value is abruptly increased by reducing the thickness of the conductive film below a certain range. However, the solid-state image sensor into which the photoelectric conversion element according to this embodiment is incorporated need only have a sheet resistance of preferably 100 to 10,000 Ω/square, and the film thickness has a high degree of freedom for thin film formation. The amount of absorbed light decreases with decreasing thickness of the upper electrode (transparent conductive film) 15 and the light transmission rate increases in general. The increase in the light transmission rate increases light absorption in the photoelectric conversion layer 12 and hence the photoelectric conversion capacity, and is therefore very preferable. In consideration of the suppressed leakage current, increased thin film resistance value and increased transmission rate as a result of the reduction in film thickness, the thickness of the upper electrode 15 is preferably from 5 to 100 nm and more preferably from 5 to 20 nm.

Depending on the intended use, the lower electrode 11 may have transparency or be formed of such a material as to reflect light instead of having transparency. More specifically, the lower electrode is formed of conductive metal oxides such as tin oxide doped with antimony or fluorine (ATO, FTO), tin oxide, zinc oxide, indium oxide, indium tin oxide (ITO), indium zinc oxide (IZO); metals such as gold, silver, chromium, nickel, titanium, tungsten and aluminum; conductive compounds such as oxides and nitrides of the illustrated metals (e.g., titanium nitride (TiN)); mixtures or laminates of these metals and the conductive metal oxides; inorganic conductive substances such as copper iodide and copper sulfide; organic conductive materials such as polyaniline, polythiophene and polypyrrole; and laminates of these materials and ITO or titanium nitride.

The method of forming the electrodes is not particularly limited and a suitable method can be selected in consideration of the suitability for the electrode material. More specifically, the electrodes can be formed by wet processes such as a printing process and a coating process, physical processes such as a vacuum deposition process, a sputtering process and an ion plating process, and chemical processes such as CVD and plasma CVD.

When the material of the electrodes is ITO, the electrodes can be formed by processes such as an electron beam process, a sputtering process, a resistance heating vapor deposition process, a chemical reaction process (e.g., sol-gel process) and application of a dispersion of indium tin oxide. The film formed with ITO can be further subjected to UV-ozone treatment or plasma treatment. When the material of the electrodes is TiN, various processes including a reactive sputtering process are used and UV-ozone treatment or plasma treatment may be further performed.

[Hole-Blocking Layer]

An electron-accepting organic material can be used for the hole-blocking layer.

Examples of the electron-accepting material that may be used include an oxadiazole derivative such as 1,3-bis(4-tert-butylphenyl-1,3,4-oxadiazolyl)phenylene (OXD-7), an anthraquinodimethane derivative, a diphenylquinone derivative, bathocuproine, bathophenanthroline and derivatives thereof, a triazole compound, a tris(8-hydroxyquinolinato) aluminum complex, a bis(4-methyl-8-quinolinato)aluminum complex, a distyrylarylene derivative and a silole compound. A material other than the electron-accepting organic material can be used, if the material has sufficient electron transport property. Use may be made of a porphyrin compound, a styryl compound such as DCM (4-dicyanomethylene-2-methyl-6-(4-dimethylaminostyryl))-4H pyran and a 4H pyran compound. More specifically, compounds described in paragraphs [0073] to [0078] of JP 2008-72090 A are preferable.

The method of manufacturing the hole-blocking layer is not particularly limited and the hole-blocking layer may be formed by a dry film forming process or a wet film forming process. Examples of the dry film forming process that can be used include a vapor deposition process and a sputtering process. Vapor deposition may be performed by physical vapor deposition (PVD) or chemical vapor deposition (CVD) but physical vapor deposition such as vacuum deposition is preferable. Examples of the wet film forming process that can be used include an ink-jet process, a spraying process, a nozzle printing process, a spin coating process, a dip coating process, a casting process, a die coating process, a roll coating process, a bar coating process and gravure coating process, and an ink-jet process is preferable in terms of high precision patterning.

The hole-blocking layer preferably has a thickness of 10 to 200 nm, more preferably 30 to 150 nm and most preferably 50 to 100 nm because too small a thickness reduces the effect of suppressing the dark current and too large a thickness reduces the photoelectric conversion efficiency.

[Substrate]

The photoelectric conversion element of the invention may further include a substrate. The type of the substrate used is not particularly limited and a semiconductor substrate, a glass substrate or a plastic substrate may be used.

Although the position of the substrate is not particularly limited, the conductive film 11, the photoelectric conversion film including the photoelectric conversion layer 12 and the electron-blocking layer 16A, and the transparent conductive film 15 are usually formed on the substrate in this order.

[Sealing Layer]

The photoelectric conversion element of the invention may further include a sealing layer. The performance of the photoelectric conversion material may be considerably deteriorated by the presence of deterioration factors such as water molecules and such deterioration can be prevented by coating and sealing the whole of the photoelectric conversion layer 12 with a sealing layer made of a compact material which is impermeable to water molecules, as exemplified by a ceramic material such as a metal oxide, a metal nitride or a metal oxynitride, or diamond-like carbon (DLC).

The selection of a suitable material and the manufacture of the sealing layer may be performed according to the description in paragraphs [0210] to [0215] of JP 2011-082508 A.

[Optical Sensor]

Exemplary uses of the photoelectric conversion element include an optical sensor and a photoelectric cell, and the photoelectric conversion element of the invention is preferably used as an optical sensor. The photoelectric conversion element may be singly used for the optical sensor, and a line sensor having the photoelectric conversion elements in a linear arrangement or a two-dimensional sensor having the photoelectric conversion elements arranged on a plane are preferable. The photoelectric conversion element of the invention functions as an image sensor, in the line sensor by converting light image information to electric signals using an optical system and a drive portion as in a scanner and in the two-dimensional sensor by converting light image information to electric signals through imaging on a sensor with an optical system as in an imaging module.

Since the photoelectric cell is a power generating device, the efficiency of conversion of light energy to electrical energy is important performance but the dark current which is the current in a dark place does not cause any problem in a functional point of view. The photoelectric cell does not need a subsequent heating step for disposing color filters or other operation. Since converting a light and dark signal to an electric signal with a high degree of accuracy is important performance of the optical sensor, the efficiency of conversion of quantity of light to current is also important performance. However, output of a signal in a dark place causes a noise and therefore a low dark current is required. In addition, the resistance to the subsequent step is also important.

[Image Sensor]

Next, an exemplary configuration of an image sensor including the photoelectric conversion element 10a is described.

In the exemplary configuration to be described below, the description is simplified or omitted by using the same or corresponding numerals to show the members of which the configuration and the operation are equivalent to those of the members already described above.

The image sensor is a device for converting light information of an image to electric signals and refers to a device in which a plurality of photoelectric conversion elements are disposed in a matrix on the same plane and an electric signal obtained by conversion of a light signal in each of the photoelectric conversion elements (pixels) can be sequentially outputted for each pixel outside the image sensor. Therefore, each pixel is composed of one photoelectric conversion element and one or more transistors.

Figure 2:
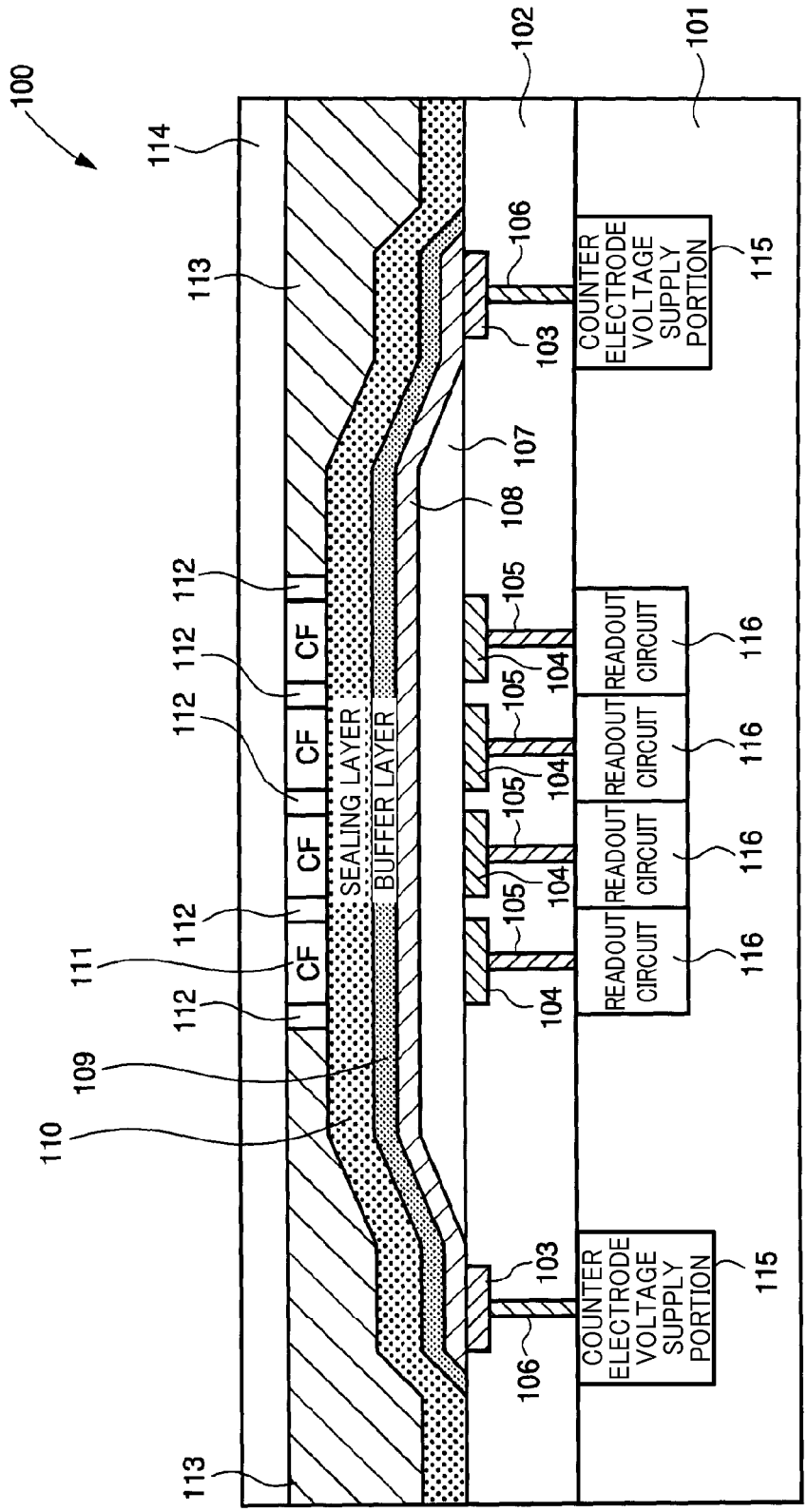
FIG. 2 is a schematic cross-sectional view of one-pixel portion of an image sensor.

FIG. 2 is a schematic cross-sectional view showing a schematic configuration of an image sensor for illustrating an embodiment of the invention. This image sensor is used by being mounted on an imaging module of an imaging device such as a digital camera or a digital video camera, an electronic endoscope or a mobile phone.

The image sensor includes a plurality of photoelectric conversion elements configured as shown in FIG. 1A or 1B and a circuit board having formed therein a readout circuit for reading out a signal corresponding to a charge generated in the photoelectric conversion layer of each of the photoelectric conversion elements, and has such a configuration that the photoelectric conversion elements are in a one-dimensional or two-dimensional array on the same plane above the circuit board.

An image sensor 100 shown in FIG. 2 includes a substrate 101, an insulating layer 102, connection electrodes 103, pixel electrodes (lower electrodes) 104, connecting portions 105, connecting portions 106, a photoelectric conversion film 107, a counter electrode (upper electrode) 108, a buffer layer 109, a sealing layer 110, color filters (CFs) 111, partition walls 112, a light-shielding layer 113, a protective layer 114, counter electrode voltage supply portions 115 and readout circuits 116.

The photoelectric conversion film 107 is a film including the above-described photoelectric conversion layer and electron-blocking layer.

The pixel electrodes 104 have the same function as the electrode 11 of the photoelectric conversion element 10a shown in FIG. 1A. The counter electrode 108 has the same function as the electrode 15 of the photoelectric conversion element 10a shown in FIG. 1A. The photoelectric conversion film 107 has the same configuration as the layer provided between the electrodes 11 and 15 of the photoelectric conversion element 10a shown in FIG. 1A.

The substrate 101 is a glass substrate or a semiconductor substrate made of, for example, silicon. The insulating layer 102 is formed on the substrate 101. The pixel electrodes 104 and the connection electrodes 103 are formed at a surface of the insulating layer 102.

The photoelectric conversion film 107 is a layer which is formed so as to cover the pixel electrodes 104 and is common for all the photoelectric conversion elements.

The counter electrode 108 is an electrode which is formed on the photoelectric conversion film 107 and is common for all the photoelectric conversion elements. The counter electrode 108 is also formed on the connection electrodes 103 disposed outside the photoelectric conversion film 107 and is electrically connected to the connection electrodes 103.

The connecting portions 106 are plugs or other parts buried in the insulating layer 102 to electrically connect the connection electrodes 103 with the counter electrode voltage supply portions 115. The counter electrode voltage supply portions 115 are formed in the substrate 101 and apply a predetermined voltage to the counter electrode 108 through the connecting portions 106 and the connection electrodes 103. In cases where the voltage to be applied to the counter electrode 108 is higher than the power supply voltage of the image sensor, the predetermined voltage is supplied by increasing the power supply voltage with a booster circuit such as a charge pump.

The readout circuits 116 are formed in the substrate 101 so as to correspond to the respective pixel electrodes 104 to read out signals corresponding to the charges collected by the corresponding pixel electrodes 104. The readout circuits 116 are configured using, for example, CCDs, CMOS circuits or TFT circuits, and are shielded by a light-shielding layer (not shown) disposed in the insulating layer 102. The readout circuits 116 are electrically connected to the corresponding pixel electrodes 104 through the connecting portions 105.

The buffer layer 109 is formed on the counter electrode 108 so as to cover the counter electrode 108. The sealing layer 110 is formed on the buffer layer 109 so as to cover the buffer layer 109. The color filters 111 are formed on the sealing layer 110 at such positions as to face the respective pixel electrodes 104. The partition walls 112 are formed between the adjacent color filters 111 to improve the light transmission efficiency of the color filters 111.

The light-shielding layer 113 is formed on the sealing layer 110 in the region other than the color filters 111 and the partition walls 112 and prevents light from entering the photoelectric conversion film 107 formed in the region other than the effective pixel regions. The protective layer 114 is formed on the color filters 111, the partition walls 112 and the light-shielding layer 113 and protects the whole of the image sensor 100.

When light enters the thus configured image sensor 100, the light enters the photoelectric conversion film 107 to generate charges. Of the generated charges, the holes are collected by the pixel electrodes 104 and the voltage signals corresponding to the amounts of the collected holes are outputted outside the image sensor 100 by the readout circuits 116.

The method of manufacturing the image sensor 100 is as follows:

On the circuit board having the counter electrode voltage supply portions 115 and the readout circuits 116 formed therein, the connecting portions 105 and 106, the connection electrodes 103, the pixel electrodes 104 and the insulating layer 102 are formed. The pixel electrodes 104 are formed at a surface of the insulating layer 102 in a, for example, square grid shape.

Next, the photoelectric conversion film 107 is formed on the pixel electrodes 104, for example, by vacuum heating vapor deposition. Next, the counter electrode 108 is formed on the photoelectric conversion film 107 under vacuum, for example, by sputtering. Next, the buffer layer 109 and the sealing layer 110 are formed in succession on the counter electrode 108, for example, by vacuum heating vapor deposition. Next, the color filters 111, the partition walls 112 and the light-shielding layer 113 are formed, and the protective layer 114 is then formed to complete the image sensor 100.

The photoelectric conversion elements can also be prevented from deteriorating in performance by adding a step of putting the image sensor 100 under manufacture into a non-vacuum state between the step of forming the photoelectric conversion film 107 and the step of forming the sealing layer 110. The manufacturing cost can be suppressed while preventing the image sensor 100 from deteriorating in performance by adding this step.

EXAMPLES

Examples are shown below but the invention should not be construed as being limited to these examples.

Synthesis of Illustrative Compounds A-1 to A-3 and A-5

Illustrative Compounds A-1 to A-3 and A-5 were synthesized according to a known method by reference to, for example, Mater. Chem., 2006, 16, 1053; Angew. Chem., Int. Ed. Angl., 1990, 29, 525; Chem. Ber., 1991, 124, 2091; Chem. Eur. J., 2010, 16, 9736; and J. Mater. Chem., 2002, 12, 1307.

Synthesis of Illustrative Compound A-4

3-Bromo-7H-benzo[a]phenalene (20.0 g, 67.8 mol) was dissolved in 1 L of THF and cooled to 0° C., and to the solution was added sodium hydride (4.07 g, 0.170 mol). Then, the reaction solution was adjusted to 0° C. and to the reaction solution was added dropwise methyl iodide (106 mL, 0.170 mol). After the dropwise addition, the mixture was stirred at room temperature for 5 hours to obtain 3-bromo-7,7-dimethylbenzo[a]phenalene at a yield of 80%.

After addition of magnesium powder (659 mg, 27.1 mmol) to 200 mL of THF in a nitrogen atmosphere, the mixture was refluxed at the boiling point and thereafter a solution of the 3-bromo-7,7-dimethylbenzo[a]phenalene (17.5 g, 54.2 mmol) in 800 mL of THF was added dropwise and the mixture was stirred for 1 hour. Then, tetrakis(triphenylphosphine)palladium (624 mg, 0.542 mmol) was added to the reaction solution and the mixture was refluxed at the boiling point for 2 hours to obtain 3-(7,7-dimethylbenzo[a]phenalen-3-yl)7,7-dimethylbenzo[a]phenalene at a yield of 56%. The 3-(7,7-dimethylbenzo[a]phenalen-3-yl)7,7-dimethylbenzo[a]phenalene (3.00 g, 6.16 mmol) and anhydrous aluminum chloride (4.11 g, 30.8 mmol) were dispersed in 400 mL of chlorobenzene and the dispersion was heated to 80° C. and stirred for 5 hours to synthesize Illustrative Compound A-4 at a yield of 33%.

Synthesis of Illustrative Compound A-6

Anthracene-9,10-diboronic acid (15.0 g, 56.4 mmol), palladium acetate (633 mg, 2.82 mmol), tri(t-butyl)phosphine (1.71 g, 8.46 mmol), methyl-1-bromonaphthalene-2-carboxylate (31.4 g, 118 mmol) and cesium carbonate (73.5 g, 226 mmol) were dissolved in 200 mL of xylene and the solution was reacted under reflux at the boiling point for 5 hours in a nitrogen atmosphere to obtain dimethyl-1,1'-(anthracene-9,10-diyl)bis(2-naphthoate) at a yield of 78%. Concentrated sulfuric acid (400 mL) was added to the dimethyl-1,1'-(anthracene-9,10-diyl)bis(2-naphthoate) (24.0 g, 44.0 mmol) to react at 180° C. for 4 hours. Thereafter, chloroform and water were added to the reaction mixture to separate the organic phase. The organic phase was washed with water and a saturated sodium chloride solution, and concentrated under reduced pressure. The resulting reaction mixture was purified by silica gel column chromatography (chloroform) to obtain dinaphtho[1,2-a:1',2'-j]perylene-10,20-dione (yield: 28%) and dibenzo[a,o]naphtho[1,2,3,4-rst]pentaphene-7,10-dione (22%).

Lithium aluminum hydride (2.62 g, 69.1 mmol) was added to 700 mL of diethyl ether and the mixture was cooled to 0° C. After adding anhydrous aluminum chloride (32.4 g, 243 mmol) little by little in a nitrogen atmosphere, the dinaphtho[1,2-a:1',2'-j]perylene-10,20-dione (5.94 g, 12.3 mmol) was added little by little and the mixture was reacted at room temperature for 20 hours to synthesize 10,20-dihydrodinaphtho[1,2-a:1',2'-j]perylene at a yield of 37%. The 10,20-dihydrodinaphtho[1,2-a:1',2'-j]perylene (2.07 g, 4.55 mmol) was added to 100 mL of THF. The mixture was cooled to 0° C. and potassium tert-butoxide (2.56 g, 22.8 mmol) was added. Methyl iodide (1.42 mL, 22.8 mmol) was added dropwise at 0° C. and the mixture was reacted at room temperature for 5 hours and then reacted at 40° C. for 5 hours to synthesize Illustrative Compound A-6 at a yield of 49%.

Synthesis of Illustrative Compound A-7

Lithium aluminum hydride (2.06 g, 54.4 mmol) was added to 550 mL of diethyl ether and the mixture was cooled to 0° C. After adding anhydrous aluminum chloride (25.5 g, 191 mmol) little by little in a nitrogen atmosphere, dibenzo[a,o]naphtho[1,2,3,4-rst]pentaphene-7,10-dione (4.67 g, 9.68 mmol) was further added little by little and the mixture was reacted at room temperature for 20 hours to synthesize 7,10-dihydrodibenzo[a,o]naphtho[1,2,3,4-rst]pentaphene at a yield of 33%. The 7,10-dihydrodibenzo[a,o]naphtho[1,2,3,4-rst]pentaphene (1.45 g, 3.19 mmol) was added to 70 mL of THF. The mixture was cooled to 0° C. and potassium tert-butoxide (1.80 g, 16.0 mmol) was added. The reaction solution was adjusted to 0° C. To the reaction solution was added dropwise methyl iodide (1.00 mL, 16.0 mmol) and the mixture was reacted at room temperature for 5 hours and then reacted at 40° C. for 5 hours to synthesize Illustrative Compound A-7 at a yield of 52%.

Synthesis of Illustrative Compound A-8

5-Bromotetracene (3.0 g, 9.77 mmol), tris(dibenzylideneacetone)dipalladium (448 mg, 0.489 mmol), (bis(2-diphenylphosphinophenyl)ether (1.05 g, 1.95 mmol), (2-(methoxycarbonyl)phenyl)boronic acid (3.52 g, 19.5 mmol) and potassium carbonate (5.40 g, 39.1 mmol) were added to a solvent mixture containing 200 mL of toluene, 12 mL of ethanol and 24 mL of water. The mixture was reacted under reflux at the boiling point for 24 hours in a nitrogen atmosphere to obtain methyl-2-(tetracen-5-yl)benzoate at a yield of 73%.

The methyl-2-(tetracen-5-yl)benzoate (2.58 g, 7.13 mmol) was dissolved in 200 mL of THF. A 3M methyl magnesium bromide-diethyl ether solution (7.84 mL, 23.5 mmol) was added dropwise in a nitrogen atmosphere under reflux at the boiling point and the mixture was reacted for 2 hours to obtain 2-(2-(tetracen-5-yl)phenyl)propan-2-ol at a yield of 81%. The 2-(2-(tetracen-5-yl)phenyl)propan-2-ol (2.09 g, 5.78 mmol) was added to a solvent mixture containing 100 mL of acetic acid and 20 mL of 37% hydrochloric acid and the mixture was reacted for 5 hours under reflux at the boiling point to synthesize Illustrative Compound A-8 at a yield of 36%.

Illustrative Compound A-9 was purchased from Acros Organics.

Synthesis of Illustrative Compound A-10

Illustrative Compound A-10 was synthesized by reference to the method described in Chemische Berichte, 1937, 70, 1603-1610.

Synthesis of Illustrative Compound A-11

Illustrative Compound A-11 was synthesized by reference to the method described in Chemische Berichte, 1971, 104, 1436-1454.

Synthesis of Illustrative Compound B-1

2-Bromofluorene (89.0 g, 0.363 mol) was dissolved in 1.3 L of THF. The solution was cooled to 5° C. and potassium tert-butoxide (102 g, 0.908 mol) was added. Thereafter, methyl iodide (565 mL, 0.908 mol) was added dropwise at 5° C. After the dropwise addition, the mixture was stirred at room temperature for 5 hours to obtain 2-bromo-9,9-dimethylfluorene at a yield of 87%.

After addition of magnesium powder (3.51 g, 0.144 mol) to 50 mL of THF in a nitrogen atmosphere, the mixture was refluxed at the boiling point. A solution of the 2-bromo-9,9-dimethylfluorene (75.0 g, 0.275 mol) in 250 mL THF was added dropwise and the mixture was stirred for 1 hour. Thereafter, tetrakis(triphenylphosphine)palladium (1.59 g, 1.38 mmol) was added and the mixture was refluxed at the boiling point for 2 hours to obtain Compound 1 at a yield of 82%.

Bromine (39.8 g, 0.249 mol) was added dropwise to a solution of Compound 1 (43.8 g, 0.113 mol) in 500 mL chloroform. Then, the mixture was stirred for 3 hours to synthesize Compound 2 at a yield of 78%. Compound 2 (1.10 g, 2.02 mmol), palladium acetate (22.7 mg, 0.101 mmol), tri(t-butyl)phosphine (61.3 mg, 0.303 mmol), cesium carbonate (2.63 g, 8.08 mmol) and Compound 3 (991 mg, 4.44 mmol) were dissolved in 11 mL of xylene and the solution was reacted under reflux at the boiling point for 4 hours in a nitrogen atmosphere. Ethyl acetate and water were added to the reaction mixture to separate the organic phase. The organic phase was washed with water and a saturated sodium chloride solution, and concentrated under reduced pressure. Thereafter, the resulting reaction mixture was recrystallized and purified by sublimation purification to obtain Illustrative Compound B-1 at a yield of 66%.

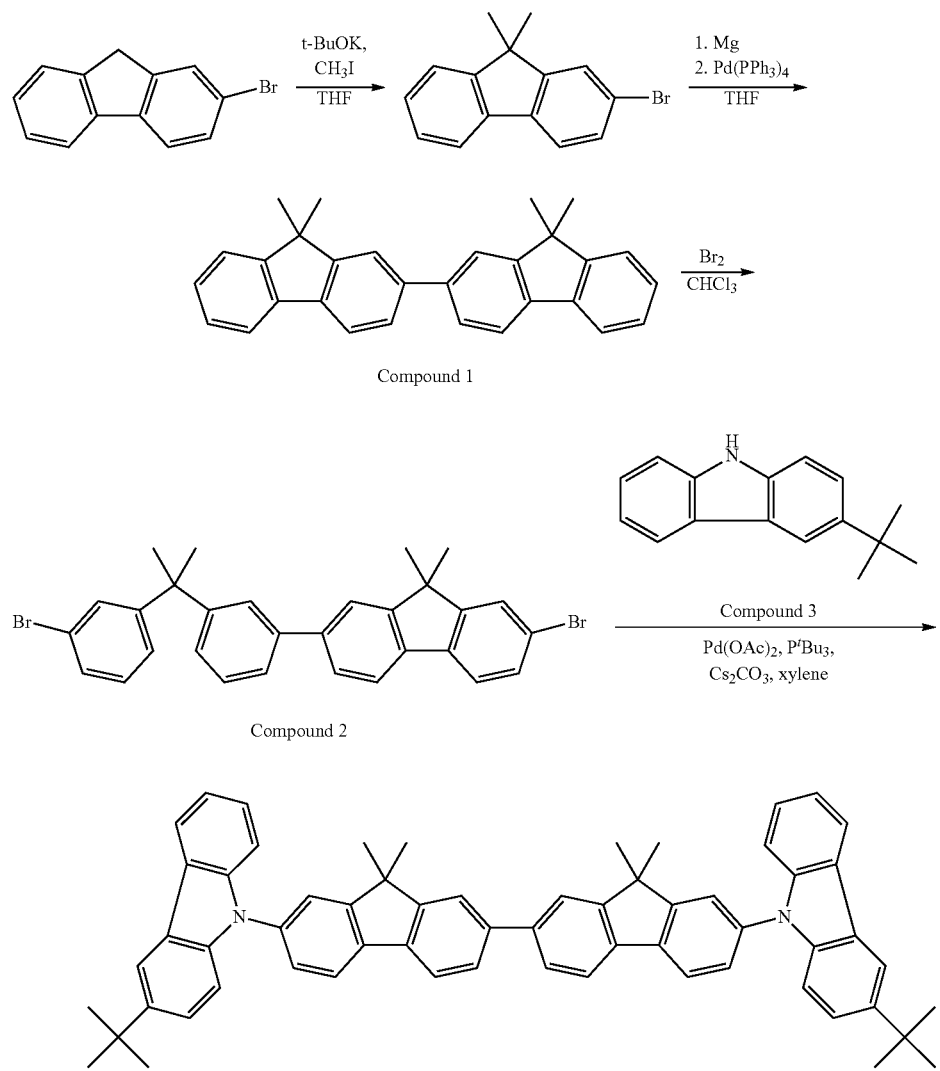

B-1

Synthesis of Illustrative Compound B-3

Compound 2 (1.10 g, 2.02 mmol), palladium acetate (22.7 mg, 0.101 mmol), tri(t-butyl)phosphine (61.3 mg, 0.303 mmol), cesium carbonate (2.63 g, 8.08 mmol) and Compound 6 (1.13 g, 4.24 mmol) were dissolved in 10 mL of xylene and the solution was reacted under reflux at the boiling point for 4 hours in a nitrogen atmosphere. Ethyl acetate and water were added to the reaction mixture to separate the organic phase. The organic phase was washed with water and a saturated sodium chloride solution, and concentrated under reduced pressure. Thereafter, the resulting reaction mixture was recrystallized and purified by sublimation purification to obtain Illustrative Compound B-3 at a yield of 44%.

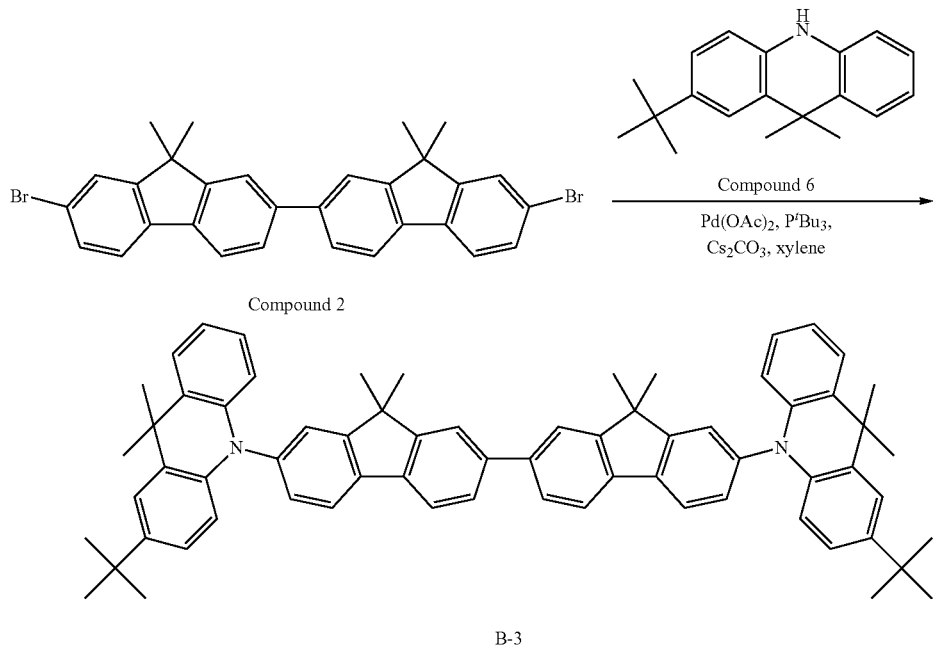

Synthesis of Illustrative Compound B-6

Compound 2 (1.10 g, 2.02 mmol), palladium acetate (22.7 mg, 0.101 mmol), tri(t-butyl)phosphine (61.3 mg, 0.303 mmol), cesium carbonate (2.63 g, 8.08 mmol) and Compound 5 (1.03 g, 4.24 mmol) were dissolved in 10 mL of xylene and the solution was reacted under reflux at the boiling point for 4 hours in a nitrogen atmosphere. Ethyl acetate and water were added to the reaction mixture to separate the organic phase. The organic phase was washed with water and a saturated sodium chloride solution, and concentrated under reduced pressure. Thereafter, the resulting reaction mixture was recrystallized and purified by sublimation purification to obtain Illustrative Compound B-6 at a yield of 48%.

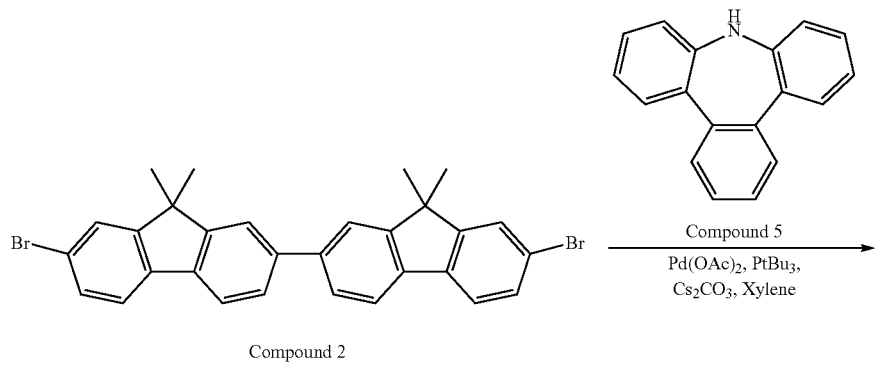

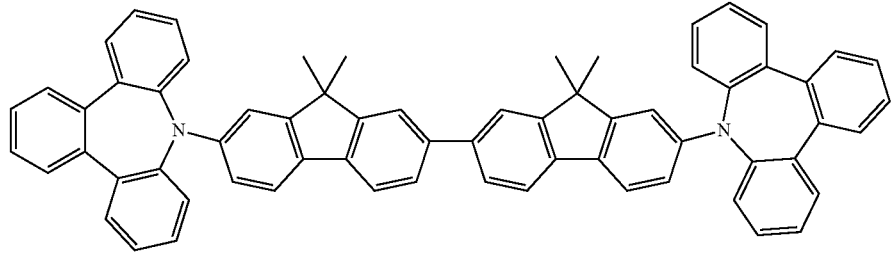

B-6

Synthesis of Illustrative Compound B-12

Compound 2 (1.10 g, 2.02 mmol), palladium acetate (22.7 mg, 0.101 mmol), tri(t-butyl)phosphine (61.3 mg, 0.303 mmol), cesium carbonate (2.63 g, 8.08 mmol) and Compound 4 (1.34 g, 4.24 mmol) were dissolved in 10 mL of xylene and the solution was reacted under reflux at the boiling point for 4 hours in a nitrogen atmosphere. Ethyl acetate and water were added to the reaction mixture to separate the organic phase. The organic phase was washed with water and a saturated sodium chloride solution, and concentrated under reduced pressure. Thereafter, the resulting reaction mixture was recrystallized and purified by sublimation purification to obtain Illustrative Compound B-12 at a yield of 41%.

butylcarbazole (12.0 g, 42.8 mmol) were dissolved in 50 mL of xylene and the solution was reacted under reflux at the boiling point for 4 hours in a nitrogen atmosphere to obtain 3,6-di-tert-butyl-9-[7-(3,6-di-tert-butylcarbazol-9-yl)-9H-carbazol-2-yl]carbazole at a yield of 60%.

The 3,6-di-tert-butyl-9-[7-(3,6-di-tert-butylcarbazol-9-yl)-9H-carbazol-2-yl]carbazole (4.64 g, 6.42 mmol), palladium acetate (72.1 mg, 0.321 mmol), tri(t-butyl)phosphine (194 mg, 963 mmol), cesium carbonate (4.17 g, 12.8 mmol) and 2-bromonaphthalene (12.0 g, 42.8 mmol) were dissolved in 35 mL of xylene and the solution was reacted under reflux at the boiling point for 6 hours in a nitrogen atmosphere to obtain Illustrative Compound B-2 at a yield of 73%.

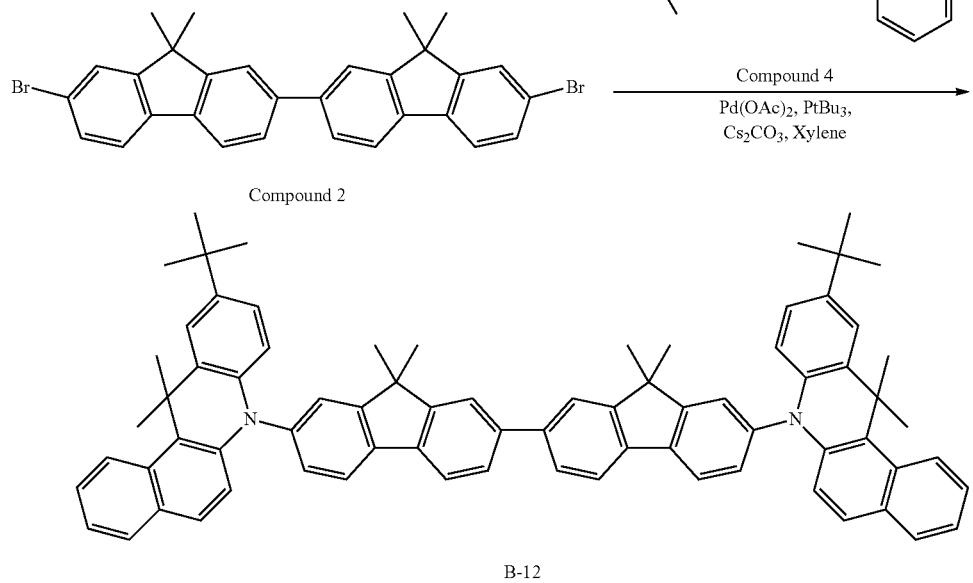

Synthesis of Illustrative Compound B-2

2,7-Dibromocarbazole was synthesized according to Journal of Organic Chemistry, 2005, vol. 70, 5014 to 5019. The 2,7-dibromocarbazole (3.5 g, 10.7 mmol), palladium acetate (120 mg, 0.535 mmol), tri(t-butyl)phosphine (325 mg, 1.61 mmol), cesium carbonate (6.97 g, 21.4 mmol) and 3,6-di-t-

Synthesis of Illustrative Compound B-7 t-Butoxy sodium (0.47 g), xylene (20 mL), palladium acetate (57 mg), tri(t-butyl)phosphonium hexafluoroborate (0.18 g) were heated with stirring under nitrogen at 65° C. for 20 minutes. 2,7-Dibromo-9,9'-spirobi[9H-fluorene] (0.6 g) and Compound 6 (0.83 g) used in the synthesis of Illustrative Compound (B-3) were added and the mixture was heated with stirring under nitrogen at 105° C. for 2 hours. The reaction solution was cooled to room temperature and then 40 mL of methanol was added. The resulting solid was filtered and washed with acetonitrile, water, acetone and isopropanol to obtain 0.6 g of Illustrative Compound (B-7).

Synthesis of Illustrative Compound B-8

3,6-Di-t-butylcarbazole (3.3 g), palladium acetate (0.2 g), cesium carbonate (9 g), tri-t-butylphosphine (1 g), xylene (50 mL) and 9-(2-anthryl)-3,6-dibromocarbazole (6.3 g) were refluxed under nitrogen for 5 hours. Thereafter, the mixture was cooled to room temperature. To the reaction solution was added 100 mL of water and the solution was extracted with 100 mL of toluene. The concentrated residue was purified by silica gel column chromatography using a solvent mixture of toluene and hexane. The crystals obtained by adding 50 mL of methanol to the residue were filtered and washed with acetonitrile to obtain Illustrative Compound (B-8) (6 g).

Synthesis of Illustrative Compound B-9

2,7,12-Tribromo-5,5,10,10,15,15-hexamethyltruxene (1.0 g), carbazole (0.87 g), t-butoxy sodium (0.54 g), xylene (20 mL) and $Pd[P(t-Bu)_3]_2$ (0.12 g) were heated under nitrogen at 95° C. for 3 hours. After cooling the reaction solution to room temperature, water was added and the solution was extracted with chloroform. Distillation of part of the chloroform under reduced pressure caused solid precipitation and hence 100 mL of methanol was added and the resulting solid was filtered and washed with acetonitrile, water and isopropanol to obtain Illustrative Compound (B-9) (0.5 g).

Synthesis of Illustrative Compound B-10

2,7-Dibromocarbazole (3.5 g, 10.7 mmol), palladium acetate (120 mg, 0.535 mmol), tri(t-butyl)phosphine (325 mg, 1.61 mmol), cesium carbonate (6.97 g, 21.4 mmol) and Compound 6 (11.3 g, 42.8 mmol) used in the synthesis of Illustrative Compound (B-3) were dissolved in 50 mL of xylene and the solution was reacted under reflux at the boiling point for 4 hours in a nitrogen atmosphere to obtain 2-tert-butyl-10-[7-(2-tert-butyl-9,9-dimethyl-acridin-10-yl)-9H-carbazol-2-yl]-9,9-dimethylacridine at a yield of 55%.

The 2-tert-butyl-10-[7-(2-tert-butyl-9,9-dimethyl-acridin-10-yl)-9H-carbazol-2-yl]-9,9-dimethylacridine (4.08 g, 5.89 mmol), palladium acetate (66.1 mg, 0.295 mmol), tri(t-butyl)phosphine (178 mg, 0.883 mmol), cesium carbonate (3.82 g, 11.7 mmol) and 1-bromo-3,5-di-tert-butylbenzene (10.6 g, 39.2 mmol) were dissolved in 35 mL of xylene and the solution was reacted under reflux at the boiling point for 6 hours in a nitrogen atmosphere to obtain Illustrative Compound B-10 at a yield of 66%.

Illustrative Compounds B-4, B-5, B-11 and B-13 were synthesized by combining the foregoing methods and known methods and by appropriately changing the materials and the reagents.

Illustrative Compounds C-1 to C-6

Compounds C-1 to C-6 were synthesized by reference to the methods described in JP 4699561 B, JP 5142611 B, Journal of Organic Chemistry, 2001, 66, 94-98, Chemistry—A European Journal, 2005, 11, 3959-3967 and Journal of Materials Chemistry, 2007, 17, 2088-2094, and known methods.

Compounds C-7 and C-8 were purchased from Tokyo Chemical Industry Co., Ltd.

Synthesis of Illustrative Compound D-1

Compound 2 (1.10 g, 2.02 mmol) used in the synthesis of Illustrative Compound B-1, tetrakis(triphenylphosphine)palladium (117 mg, 0.101 mmol), potassium carbonate (1.12 g, 8.08 mmol) and 9-anthraceneboronic acid (941 mg, 4.24 mmol) were dissolved in 10 mL of toluene, and 5 mL of ethanol and 5 mL of water were further added. The mixture was reacted under reflux at the boiling point for 4 hours in a nitrogen atmosphere to obtain Illustrative Compound (D-1) at a yield of 85%.

Synthesis of Illustrative Compound D-2

Illustrative Compound (D-2) was synthesized by reference to Journal of the American Chemical Society, 2002, 124, 11576-11577.

Synthesis of Illustrative Compound E-1

Illustrative Compound (E-1) was synthesized by reference to the methods described in Chemistry Letters, 2008, 37, 622-623, and Organic Letters, 2010, 12, 3438-3441, and known methods.

Synthesis of Illustrative Compound E-2

9,10-Dibromoanthracene (3.60 g, 10.7 mmol), palladium acetate (120 mg, 0.535 mmol), tri(t-butyl)phosphine (325 mg, 1.61 mmol), cesium carbonate (6.97 g, 21.4 mmol) and 2,7-di-tert-butyl-9,9-dimethyl-10H-acridine (7.22 g, 22.5 mmol) were dissolved in 50 mL of xylene and the solution was reacted under reflux at the boiling point for 4 hours in a nitrogen atmosphere to obtain Illustrative Compound (E-2) at a yield of 63%.

Preparation of Photoelectric Conversion Element

Example 1-1

A photoelectric conversion element having the form of FIG. 1A was prepared. The photoelectric conversion element includes the lower electrode 11, the electron-blocking layer 16A, the photoelectric conversion layer 12 and the upper electrode 15. In other words, an amorphous ITO film with a thickness of 30 nm was formed on a glass substrate by sputtering and used as the lower electrode, and Compound (B-1) was then deposited to a thickness of 100 nm by vacuum heating vapor deposition to form the electron-blocking layer. Compound (A-1) (photoelectric conversion dye) (vapor deposition rate: 0.4 angstrom/s ($0.4 \times 10^{-10}$ m/s) and fullerene ($C_{60}$) were further co-deposited on the electron-blocking layer by vacuum heating vapor deposition to thicknesses, in terms of the single layer, of 100 nm and 300 nm, respectively, while controlling the temperature of the substrate to 25° C., thereby forming the photoelectric conversion layer. Amorphous ITO was further deposited for the upper electrode to a thickness of 10 nm by sputtering to obtain the transparent electrode (upper electrode), thereby preparing a solid-state image sensor. An SiO film was formed on the upper electrode as the sealing layer by heating vapor deposition and an aluminum oxide layer was formed on the SiO film by atomic layer deposition (ALD). Vacuum deposition of the electron-blocking layer and the photoelectric conversion layer was all performed at a degree of vacuum of $4 \times 10^{-4}$ Pa or less.

Examples 1-2 to 1-143 and Comparative Examples 1-1 to 1-80

The procedure of Example 1-1 was repeated except that Compound (B-1) used for the electron-blocking layer and Compound (A-1) used for the photoelectric conversion layer which were used in Example 1-1 were changed as shown in Table 1, thereby preparing photoelectric conversion elements.

Examples 1-144 to 1-234 and Comparative Examples 1-81 to 1-95

The procedure of Example 1-1 was repeated except that the vapor deposition rate of the photoelectric conversion dye was set to 2.0 angstroms/s ($2.0 \times 10^{-10}$ m/s) and Compound (B-1) used for the electron-blocking layer and Compound (A-1) used for the photoelectric conversion layer which were used in Example 1-1 were changed as shown in Table 1, thereby preparing photoelectric conversion elements.

The structural formulae of Illustrative Compounds used in Examples (materials for forming the electron-blocking layer and materials for forming the photoelectric conversion layer) are shown below.

B-1

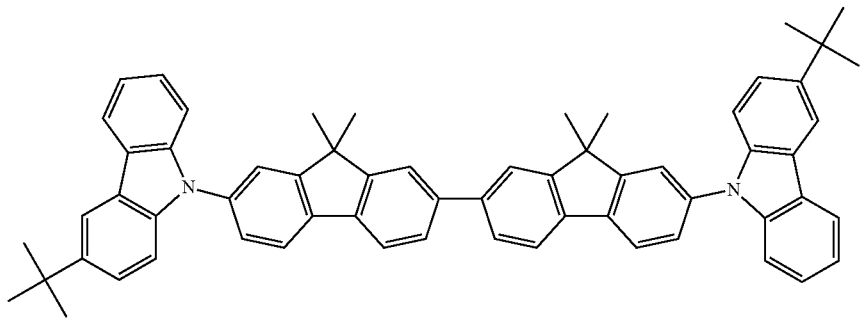

B-2

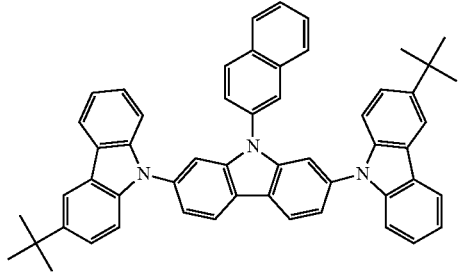

B-3

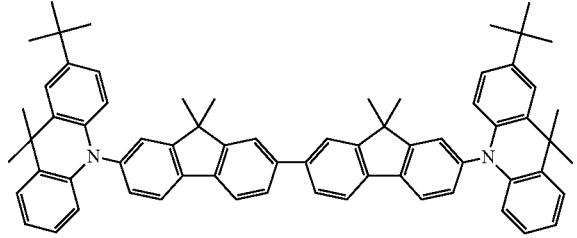

B-4

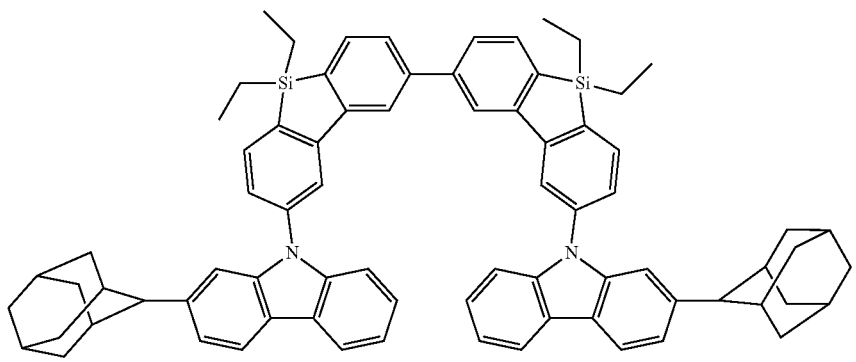

-continued
B-5
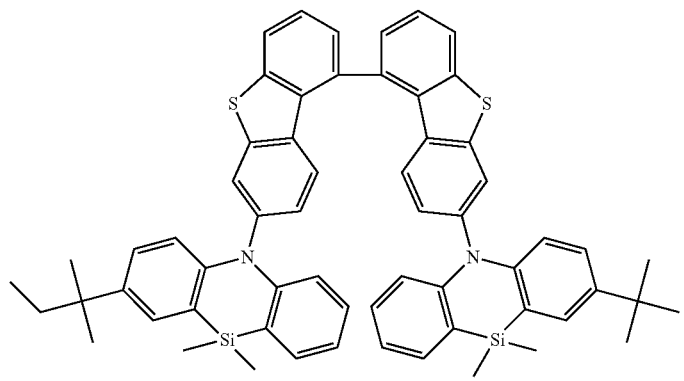
B-6
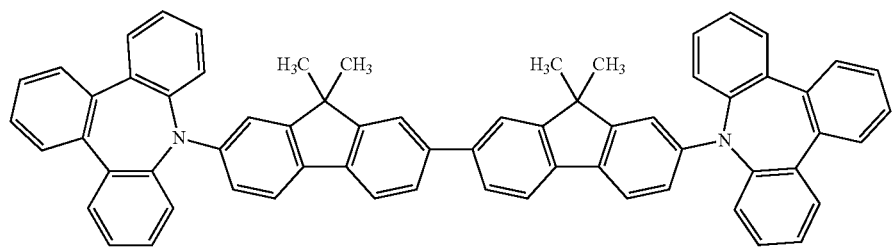
B-7
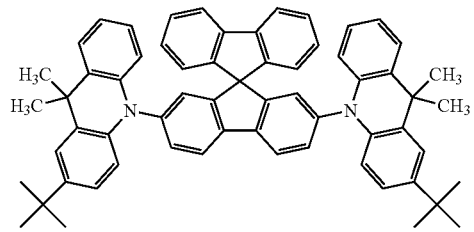
B-8
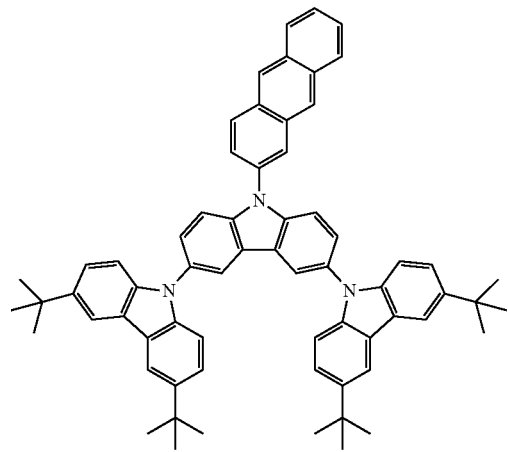
B-9
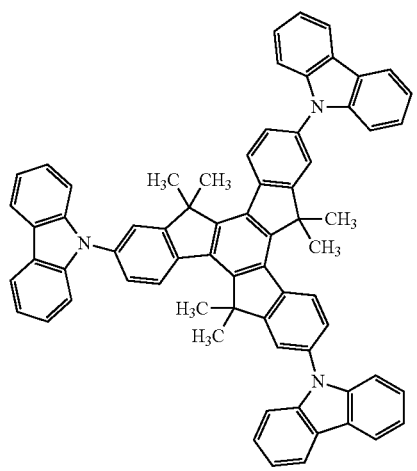
B-10
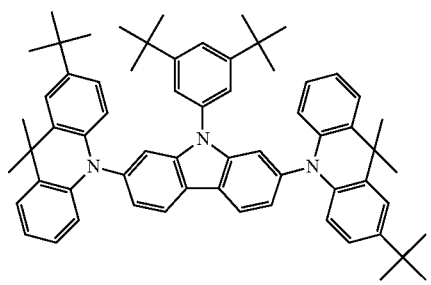

-continued
B-11
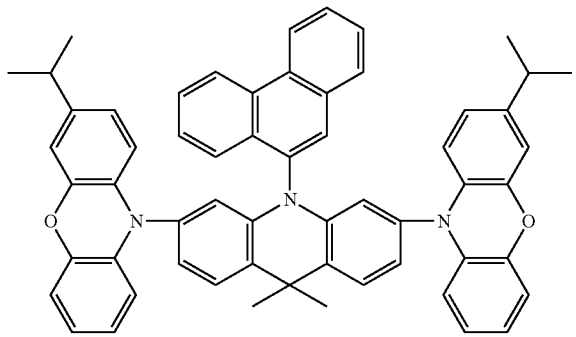
B-12
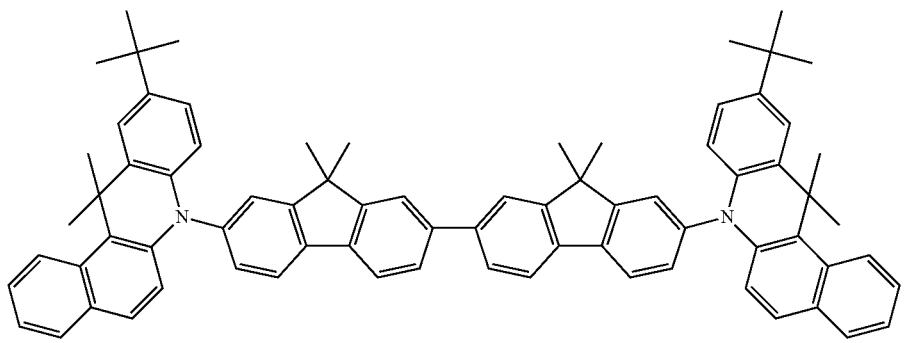
B-13
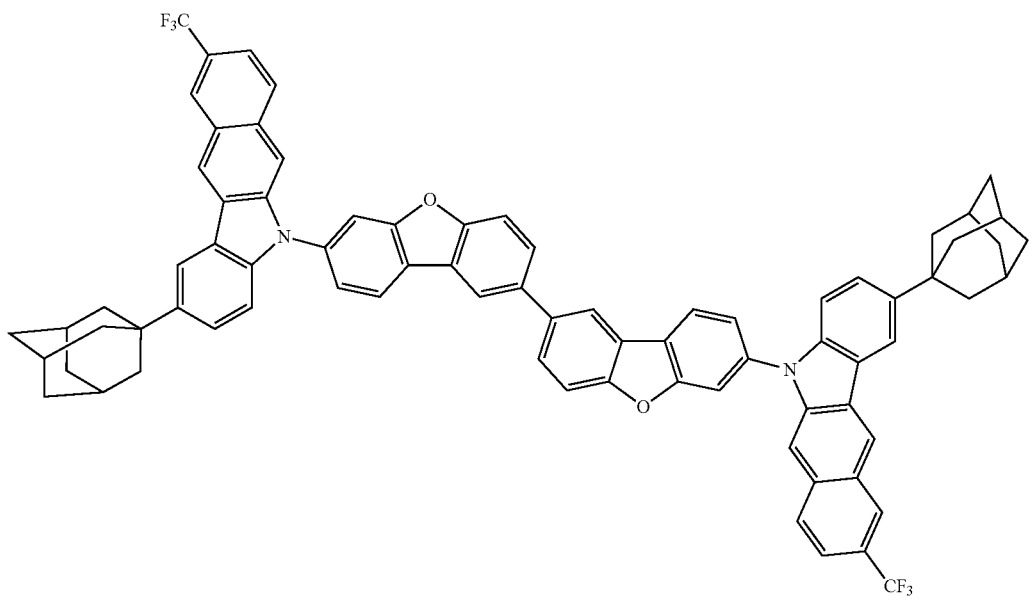
A-1
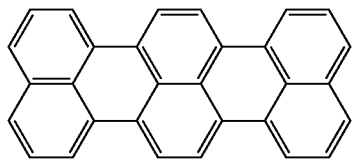
A-2
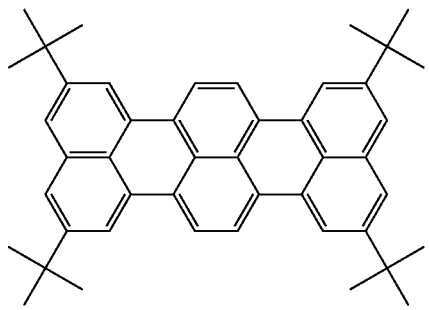

-continued
A-3 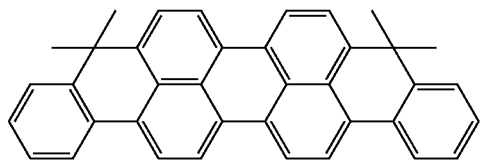
A-4
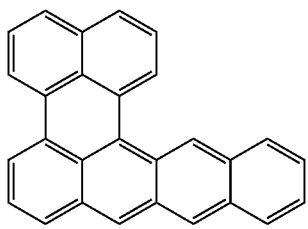
A-5 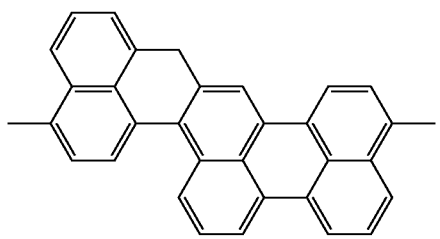
A-6 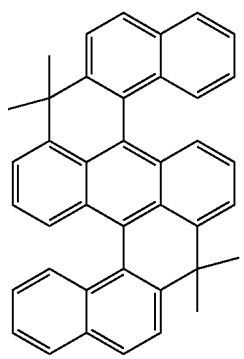
A-7 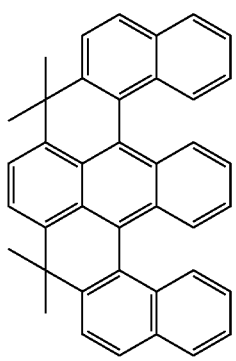
A-8 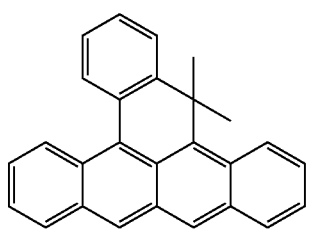
A-9 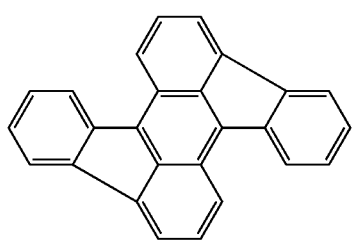
A-10 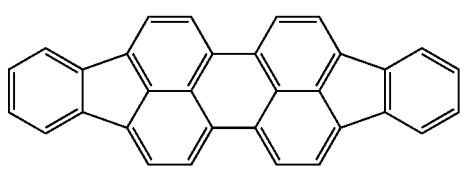
A-11 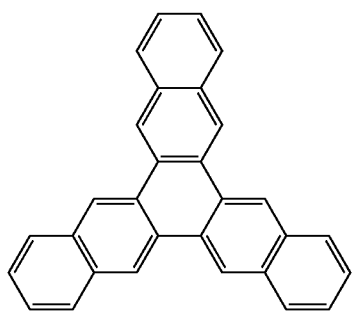
C-1 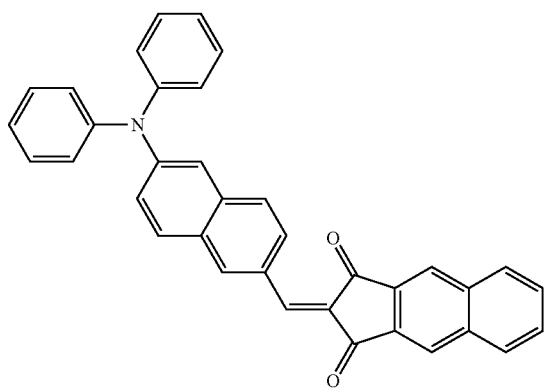

-continued
C-2
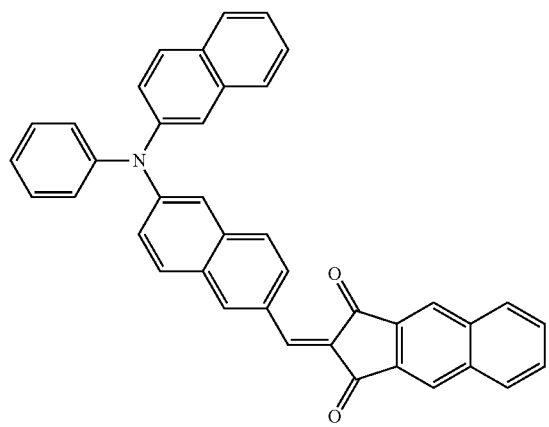
C-3
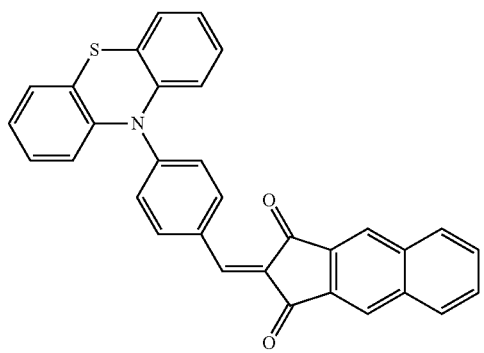
C-4
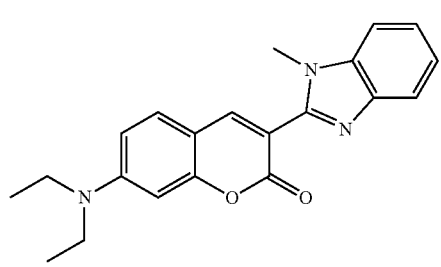
C-5
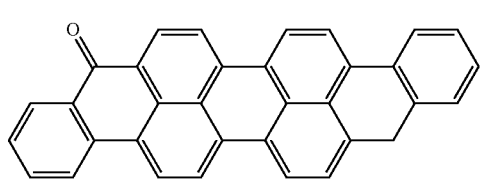
C-6
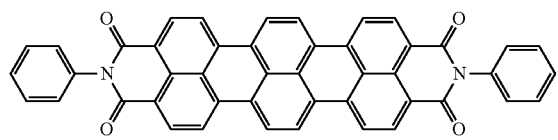
C-7
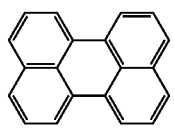
C-8
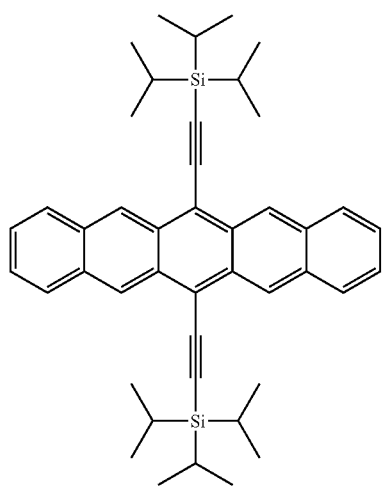
D-1
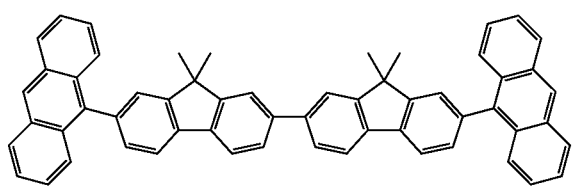
D-2
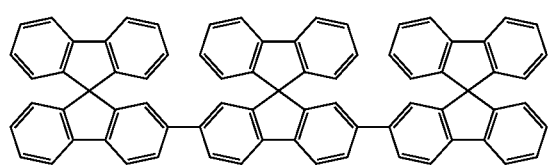
D-3
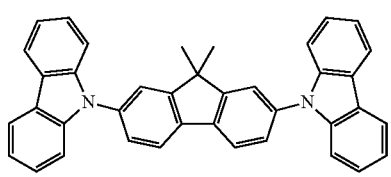

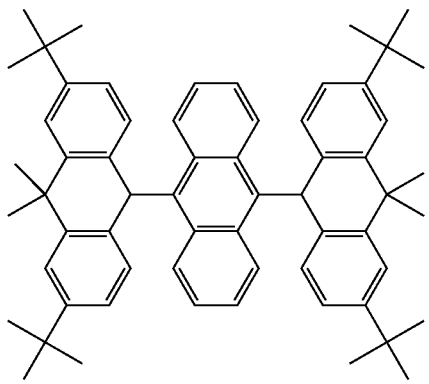

D-4

[Evaluation: Evaluation of Voltage Application]

It was confirmed that, as a result of application of a voltage to the lower electrode and the upper electrode of each of the resulting elements so that the electric field intensity reaches $2.5 \times 10^5$ V/cm, every element shows a dark current of 100 nA/cm$^2$ or less in a dark place but a current of 10 µA/cm$^2$ or more in a bright place, and hence the photoelectric conversion elements function well.

[Evaluation: Evaluation of Heat Resistance]

The photoelectric conversion efficiency at a wavelength of 520 nm upon application of an electric field of $2.5 \times 10^5$ V/cm to each of the photoelectric conversion elements obtained in Examples 1-1 to 1-234 and Comparative Examples 1-1 to 1-95 is shown as relative values with respect to the value of the element in Example 1-1 which is taken as "100." In measuring the photoelectric conversion performance of each element, light was allowed to enter from the side of the upper electrode (transparent conductive film).

(Photoelectric Conversion Efficiency)

As for the photoelectric conversion efficiency, an energy quantum efficiency measuring device manufactured by Optel Co., Ltd. (Keithley 6430 SouceMeter was used) was used to measure photocurrent upon light irradiation while applying an electric field of $2.5 \times 10^5$ V/cm and determine the external quantum efficiency. In order to eliminate the effect of light reflected on the surface of the element, the value obtained by dividing the external quantum efficiency at 520 nm by the optical absorptance at 520 nm was used as the quantum efficiency. The amount of light irradiation was 50 uW/cm$^2$.

(Dark Current Value)

As for the dark current, a voltage was applied to the lower electrode and the upper electrode of each element so that the electric field intensity reached $2.5 \times 10^5$ V/cm, the current was measured with Keithley 6430 in a dark place, and the current was divided by the electrode area to obtain the current density.

Table 1 shows the photoelectric conversion efficiency of each of the elements obtained in Examples and Comparative Examples and the photoelectric conversion efficiency of each of the elements measured after holding in an environment at 210° C. for 60 minutes and returning to room temperature, as relative values with respect to the photoelectric conversion efficiency of the element obtained in Example 1-1 which is taken as "100."

Table 1 also shows the dark current value of each of the elements obtained in Examples and Comparative Examples and the dark current value of each of the elements measured after holding in an environment at 210° C. for 60 minutes and returning to room temperature, as relative values with respect to the dark current value of the element obtained in Example 1-1 which is taken as "1.0."

[Evaluation: Evaluation of Thin-Film Absorption Maximum Wavelength]

As for the thin-film absorption maximum wavelength, the operation for preparing the photoelectric conversion layer in each of Examples and Comparative Examples was repeated to separately form a thin film with a thickness of about 100 nm on a glass substrate by vacuum heating vapor deposition of each of Compounds A-1 to A-11 and C-1 to C-6, and from the transmission spectrum of the formed thin film, the absorption maximum wavelength ($\lambda_{max}$) which is the longest wavelength was determined. Evaluation was made based on the criteria shown below. All the results are shown in Table 1.

$\lambda_{max} \geq 500$ nm [A]:

500 nm $> \lambda_{max} \geq 450$ nm [B]:

450 nm $> \lambda_{max}$ [C]:

[Evaluation: Evaluation of Glass Transition Point]

The glass transition point (Tg) of the compound used in the electron-blocking layer was measured with DSC6220 manufactured by SII NanoTechnology Inc. Five mg of a sample was placed on a pan and the temperature was increased and decreased in a range of 30° C. to 400° C. (temperature increase rate: 20° C./min; temperature decrease rate: 50° C./min; 2 cycles) to measure the heat capacity change. Two extension lines were drawn on a heat quantity change curve corresponding to glass transition and the glass transition point (Tg) was determined from the intersection between the straight line formed in the middle of the extension lines and the heat quantity curve. Evaluation was made based on the criteria shown below. All the results are shown in Table 1.

Tg $\geq$ 200° C. [A]:

200° C. $>$ Tg $\geq$ 180° C. [B]:

180° C. $>$ Tg [C]:

In Table 1, the column of "Material of electron-blocking layer" includes compounds used in preparing the electron-blocking layer, and the column of "Material of photoelectric conversion layer" includes compounds used in preparing the photoelectric conversion layer.

"Vapor deposition rate of photoelectric conversion dye (angstrom/s)" refers to the vapor deposition rate of a condensed polycyclic hydrocarbon used in preparing the photoelectric conversion layer.

TABLE 1

| | Material of electron-blocking layer | Material of photoelectric conversion layer | Vapor deposition rate of photo-electric conversion dye (Å/s) | Thin-film absorption maximum wavelength | Glass transition point of electron-blocking layer | Dark current value (relative value) | Dark current value after heating to 210° C. (relative value) | Photo-electric conversion efficiency (relative value) | Photoelectric conversion efficiency after heating to 210° C. (relative value) |
|---|---|---|---|---|---|---|---|---|---|
| EX 1-1 | B-1 | $C_{60}$/A-1 | 0.4 | A | A | 1.00 | 1.03 | 100 | 101 |
| EX 1-2 | B-2 | $C_{60}$/A-1 | 0.4 | A | A | 1.03 | 1.04 | 101 | 101 |
| EX 1-3 | B-3 | $C_{60}$/A-1 | 0.4 | A | A | 1.03 | 1.03 | 103 | 102 |
| EX 1-4 | B-4 | $C_{60}$/A-1 | 0.4 | A | A | 0.98 | 0.98 | 96 | 95 |
| EX 1-5 | B-5 | $C_{60}$/A-1 | 0.4 | A | A | 1.21 | 1.22 | 102 | 100 |
| EX 1-6 | B-6 | $C_{60}$/A-1 | 0.4 | A | A | 1.52 | 1.55 | 100 | 98 |
| EX 1-7 | B-7 | $C_{60}$/A-1 | 0.4 | A | A | 1.22 | 1.37 | 98 | 96 |
| EX 1-8 | B-8 | $C_{60}$/A-1 | 0.4 | A | A | 1.15 | 1.19 | 104 | 104 |
| EX 1-9 | B-9 | $C_{60}$/A-1 | 0.4 | A | A | 2.3 | 2.35 | 102 | 101 |
| EX 1-10 | B-10 | $C_{60}$/A-1 | 0.4 | A | A | 0.94 | 0.95 | 94 | 93 |
| EX 1-11 | B-11 | $C_{60}$/A-1 | 0.4 | A | A | 1.22 | 1.2 | 93 | 93 |
| EX 1-12 | B-12 | $C_{60}$/A-1 | 0.4 | A | A | 1.1 | 1.09 | 100 | 101 |
| EX 1-13 | B-13 | $C_{60}$/A-1 | 0.4 | A | A | 1.25 | 1.23 | 98 | 97 |
| EX 1-14 | B-1 | $C_{60}$/A-2 | 0.4 | A | A | 0.92 | 0.93 | 91 | 91 |
| EX 1-15 | B-2 | $C_{60}$/A-2 | 0.4 | A | A | 0.93 | 0.95 | 91 | 90 |
| EX 1-16 | B-3 | $C_{60}$/A-2 | 0.4 | A | A | 0.93 | 0.94 | 93 | 92 |
| EX 1-17 | B-4 | $C_{60}$/A-2 | 0.4 | A | A | 0.9 | 0.89 | 88 | 88 |
| EX 1-18 | B-5 | $C_{60}$/A-2 | 0.4 | A | A | 0.99 | 1.01 | 92 | 93 |
| EX 1-19 | B-6 | $C_{60}$/A-2 | 0.4 | A | A | 0.98 | 1 | 94 | 90 |
| EX 1-20 | B-7 | $C_{60}$/A-2 | 0.4 | A | A | 0.91 | 1.08 | 93 | 90 |
| EX 1-21 | B-8 | $C_{60}$/A-2 | 0.4 | A | A | 0.97 | 0.96 | 94 | 94 |
| EX 1-22 | B-9 | $C_{60}$/A-2 | 0.4 | A | A | 1.1 | 1.21 | 93 | 92 |
| EX 1-23 | B-10 | $C_{60}$/A-2 | 0.4 | A | A | 0.95 | 0.96 | 89 | 89 |
| EX 1-24 | B-11 | $C_{60}$/A-2 | 0.4 | A | A | 0.99 | 1.01 | 92 | 91 |
| EX 1-25 | B-12 | $C_{60}$/A-2 | 0.4 | A | A | 0.92 | 0.92 | 93 | 93 |
| EX 1-26 | B-13 | $C_{60}$/A-2 | 0.4 | A | A | 0.96 | 0.96 | 90 | 89 |
| EX 1-27 | B-1 | $C_{60}$/A-3 | 0.4 | A | A | 0.99 | 0.98 | 97 | 97 |
| EX 1-28 | B-2 | $C_{60}$/A-3 | 0.4 | A | A | 0.98 | 0.98 | 97 | 98 |
| EX 1-29 | B-3 | $C_{60}$/A-3 | 0.4 | A | A | 0.99 | 0.99 | 97 | 97 |
| EX 1-30 | B-4 | $C_{60}$/A-3 | 0.4 | A | A | 0.95 | 0.92 | 91 | 90 |
| EX 1-31 | B-5 | $C_{60}$/A-3 | 0.4 | A | A | 1.12 | 1.11 | 97 | 95 |
| EX 1-32 | B-6 | $C_{60}$/A-3 | 0.4 | A | A | 1.05 | 1.06 | 97 | 96 |
| EX 1-33 | B-7 | $C_{60}$/A-3 | 0.4 | A | A | 1.13 | 1.29 | 95 | 92 |
| EX 1-34 | B-8 | $C_{60}$/A-3 | 0.4 | A | A | 1.15 | 1.15 | 96 | 95 |
| EX 1-35 | B-9 | $C_{60}$/A-3 | 0.4 | A | A | 2.01 | 2.23 | 97 | 96 |
| EX 1-36 | B-10 | $C_{60}$/A-3 | 0.4 | A | A | 1.03 | 1.03 | 95 | 93 |
| EX 1-37 | B-11 | $C_{60}$/A-3 | 0.4 | A | A | 1.25 | 1.28 | 96 | 96 |
| EX 1-38 | B-12 | $C_{60}$/A-3 | 0.4 | A | A | 1.03 | 1.04 | 97 | 96 |
| EX 1-39 | B-13 | $C_{60}$/A-3 | 0.4 | A | A | 1.02 | 1.03 | 90 | 90 |
| EX 1-40 | B-1 | $C_{60}$/A-4 | 0.4 | A | A | 0.89 | 0.88 | 109 | 108 |
| EX 1-41 | B-2 | $C_{60}$/A-4 | 0.4 | A | A | 0.91 | 0.9 | 110 | 110 |
| EX 1-42 | B-3 | $C_{60}$/A-4 | 0.4 | A | A | 0.91 | 0.91 | 111 | 111 |
| EX 1-43 | B-4 | $C_{60}$/A-4 | 0.4 | A | A | 0.89 | 0.89 | 102 | 103 |
| EX 1-44 | B-5 | $C_{60}$/A-4 | 0.4 | A | A | 1.05 | 1.05 | 108 | 109 |
| EX 1-45 | B-6 | $C_{60}$/A-4 | 0.4 | A | A | 1.11 | 1.13 | 108 | 107 |
| EX 1-46 | B-7 | $C_{60}$/A-4 | 0.4 | A | A | 1.24 | 1.42 | 109 | 104 |
| EX 1-47 | B-8 | $C_{60}$/A-4 | 0.4 | A | A | 1.58 | 1.56 | 107 | 109 |
| EX 1-48 | B-9 | $C_{60}$/A-4 | 0.4 | A | A | 2.57 | 2.62 | 109 | 109 |
| EX 1-49 | B-10 | $C_{60}$/A-4 | 0.4 | A | A | 0.92 | 0.92 | 103 | 102 |
| EX 1-50 | B-11 | $C_{60}$/A-4 | 0.4 | A | A | 1.33 | 1.46 | 105 | 106 |
| EX 1-51 | B-12 | $C_{60}$/A-4 | 0.4 | A | A | 1.03 | 1.03 | 110 | 110 |
| EX 1-52 | B-13 | $C_{60}$/A-4 | 0.4 | A | A | 0.92 | 0.91 | 102 | 103 |
| EX 1-53 | B-1 | $C_{60}$/A-5 | 0.4 | A | A | 1.36 | 1.38 | 95 | 95 |
| EX 1-54 | B-2 | $C_{60}$/A-5 | 0.4 | A | A | 1.38 | 1.38 | 95 | 94 |
| EX 1-55 | B-3 | $C_{60}$/A-5 | 0.4 | A | A | 1.39 | 1.4 | 96 | 95 |
| EX 1-56 | B-4 | $C_{60}$/A-5 | 0.4 | A | A | 1.43 | 1.45 | 90 | 89 |
| EX 1-57 | B-5 | $C_{60}$/A-5 | 0.4 | A | A | 1.66 | 1.7 | 92 | 92 |
| EX 1-58 | B-6 | $C_{60}$/A-5 | 0.4 | A | A | 1.73 | 1.73 | 95 | 94 |
| EX 1-59 | B-7 | $C_{60}$/A-5 | 0.4 | A | A | 1.52 | 1.76 | 93 | 89 |
| EX 1-60 | B-8 | $C_{60}$/A-5 | 0.4 | A | A | 1.62 | 1.6 | 95 | 95 |
| EX 1-61 | B-9 | $C_{60}$/A-5 | 0.4 | A | A | 2.98 | 3.02 | 97 | 97 |
| EX 1-62 | B-10 | $C_{60}$/A-5 | 0.4 | A | A | 1.6 | 1.58 | 91 | 90 |
| EX 1-63 | B-11 | $C_{60}$/A-5 | 0.4 | A | A | 1.7 | 1.73 | 93 | 93 |
| EX 1-64 | B-12 | $C_{60}$/A-5 | 0.4 | A | A | 1.45 | 1.46 | 96 | 95 |
| EX 1-65 | B-13 | $C_{60}$/A-5 | 0.4 | A | A | 1.4 | 1.43 | 90 | 90 |
| EX 1-66 | B-1 | $C_{60}$/A-6 | 0.4 | A | A | 0.93 | 0.93 | 108 | 109 |
| EX 1-67 | B-2 | $C_{60}$/A-6 | 0.4 | A | A | 0.94 | 0.93 | 109 | 108 |
| EX 1-68 | B-3 | $C_{60}$/A-6 | 0.4 | A | A | 0.95 | 0.96 | 108 | 109 |
| EX 1-69 | B-4 | $C_{60}$/A-6 | 0.4 | A | A | 1.18 | 1.19 | 102 | 100 |
| EX 1-70 | B-5 | $C_{60}$/A-6 | 0.4 | A | A | 1.35 | 1.34 | 104 | 105 |
| EX 1-71 | B-6 | $C_{60}$/A-6 | 0.4 | A | A | 1.38 | 1.34 | 105 | 105 |
| EX 1-72 | B-7 | $C_{60}$/A-6 | 0.4 | A | A | 1.27 | 1.44 | 103 | 100 |

TABLE 1-continued

| | Material of electron-blocking layer | Material of photoelectric conversion layer | Vapor deposition rate of photo-electric conversion dye (Å/s) | Thin-film absorption maximum wavelength | Glass transition point of electron-blocking layer | Dark current value (relative value) | Dark current value after heating to 210° C. (relative value) | Photo-electric conversion efficiency (relative value) | Photoelectric conversion efficiency after heating to 210° C. (relative value) |
|---|---|---|---|---|---|---|---|---|---|
| EX 1-73 | B-8 | $C_{60}$/A-6 | 0.4 | A | A | 1.54 | 1.58 | 106 | 106 |
| EX 1-74 | B-9 | $C_{60}$/A-6 | 0.4 | A | A | 2.77 | 2.67 | 108 | 109 |
| EX 1-75 | B-10 | $C_{60}$/A-6 | 0.4 | A | A | 1.03 | 1.05 | 100 | 101 |
| EX 1-76 | B-11 | $C_{60}$/A-6 | 0.4 | A | A | 1.6 | 1.58 | 104 | 106 |
| EX 1-77 | B-12 | $C_{60}$/A-6 | 0.4 | A | A | 1.13 | 1.1 | 108 | 107 |
| EX 1-78 | B-13 | $C_{60}$/A-6 | 0.4 | A | A | 1.05 | 1.05 | 101 | 100 |
| EX 1-79 | B-1 | $C_{60}$/A-7 | 0.4 | A | A | 0.94 | 0.94 | 104 | 105 |
| EX 1-80 | B-2 | $C_{60}$/A-7 | 0.4 | A | A | 0.93 | 0.95 | 103 | 104 |
| EX 1-81 | B-3 | $C_{60}$/A-7 | 0.4 | A | A | 0.96 | 0.95 | 104 | 104 |
| EX 1-82 | B-4 | $C_{60}$/A-7 | 0.4 | A | A | 1.05 | 1.08 | 99 | 100 |
| EX 1-83 | B-5 | $C_{60}$/A-7 | 0.4 | A | A | 1.2 | 1.23 | 100 | 101 |
| EX 1-84 | B-6 | $C_{60}$/A-7 | 0.4 | A | A | 1.25 | 1.27 | 103 | 104 |
| EX 1-85 | B-7 | $C_{60}$/A-7 | 0.4 | A | A | 1.53 | 1.7 | 104 | 101 |
| EX 1-86 | B-8 | $C_{60}$/A-7 | 0.4 | A | A | 1.55 | 1.58 | 104 | 103 |
| EX 1-87 | B-9 | $C_{60}$/A-7 | 0.4 | A | A | 3.06 | 3.22 | 105 | 105 |
| EX 1-88 | B-10 | $C_{60}$/A-7 | 0.4 | A | A | 1.32 | 1.41 | 96 | 94 |
| EX 1-89 | B-11 | $C_{60}$/A-7 | 0.4 | A | A | 1.56 | 1.58 | 98 | 99 |
| EX 1-90 | B-12 | $C_{60}$/A-7 | 0.4 | A | A | 1.19 | 1.16 | 103 | 103 |
| EX 1-91 | B-13 | $C_{60}$/A-7 | 0.4 | A | A | 1.15 | 1.16 | 99 | 98 |
| EX 1-92 | B-1 | $C_{60}$/A-8 | 0.4 | A | A | 0.95 | 1.13 | 105 | 102 |
| EX 1-93 | B-2 | $C_{60}$/A-8 | 0.4 | A | A | 0.96 | 1.15 | 104 | 102 |
| EX 1-94 | B-3 | $C_{60}$/A-8 | 0.4 | A | A | 0.99 | 1.21 | 105 | 103 |
| EX 1-95 | B-4 | $C_{60}$/A-8 | 0.4 | A | A | 1.02 | 1.26 | 99 | 96 |
| EX 1-96 | B-5 | $C_{60}$/A-8 | 0.4 | A | A | 1.32 | 1.59 | 101 | 97 |
| EX 1-97 | B-6 | $C_{60}$/A-8 | 0.4 | A | A | 1.33 | 1.61 | 99 | 96 |
| EX 1-98 | B-7 | $C_{60}$/A-8 | 0.4 | A | A | 1.38 | 1.75 | 101 | 96 |
| EX 1-99 | B-8 | $C_{60}$/A-8 | 0.4 | A | A | 1.58 | 1.93 | 100 | 97 |
| EX 1-100 | B-9 | $C_{60}$/A-8 | 0.4 | A | A | 3.5 | 4.12 | 102 | 99 |
| EX 1-101 | B-10 | $C_{60}$/A-8 | 0.4 | A | A | 1.43 | 1.66 | 97 | 95 |
| EX 1-102 | B-11 | $C_{60}$/A-8 | 0.4 | A | A | 1.58 | 1.83 | 99 | 96 |
| EX 1-103 | B-12 | $C_{60}$/A-8 | 0.4 | A | A | 1.2 | 1.44 | 104 | 101 |
| EX 1-104 | B-13 | $C_{60}$/A-8 | 0.4 | A | A | 1.11 | 1.37 | 101 | 98 |
| EX 1-105 | B-1 | $C_{60}$/A-9 | 0.4 | B | A | 1.17 | 1.15 | 82 | 82 |
| EX 1-106 | B-2 | $C_{60}$/A-9 | 0.4 | B | A | 1.18 | 1.18 | 83 | 83 |
| EX 1-107 | B-3 | $C_{60}$/A-9 | 0.4 | B | A | 1.23 | 1.24 | 84 | 83 |
| EX 1-108 | B-4 | $C_{60}$/A-9 | 0.4 | B | A | 1.23 | 1.23 | 78 | 78 |
| EX 1-109 | B-5 | $C_{60}$/A-9 | 0.4 | B | A | 1.53 | 1.52 | 81 | 80 |
| EX 1-110 | B-6 | $C_{60}$/A-9 | 0.4 | B | A | 1.7 | 1.72 | 82 | 80 |
| EX 1-111 | B-7 | $C_{60}$/A-9 | 0.4 | B | A | 1.83 | 2.02 | 80 | 78 |
| EX 1-112 | B-8 | $C_{60}$/A-9 | 0.4 | B | A | 1.79 | 1.75 | 81 | 81 |
| EX 1-113 | B-9 | $C_{60}$/A-9 | 0.4 | B | A | 3.99 | 4.02 | 83 | 84 |
| EX 1-114 | B-10 | $C_{60}$/A-9 | 0.4 | B | A | 1.72 | 1.7 | 77 | 78 |
| EX 1-115 | B-11 | $C_{60}$/A-9 | 0.4 | B | A | 1.86 | 1.86 | 80 | 80 |
| EX 1-116 | B-12 | $C_{60}$/A-9 | 0.4 | B | A | 1.24 | 1.26 | 82 | 82 |
| EX 1-117 | B-13 | $C_{60}$/A-9 | 0.4 | B | A | 1.17 | 1.19 | 80 | 79 |
| EX 1-118 | B-1 | $C_{60}$/A-10 | 0.4 | A | A | 1.52 | 1.55 | 108 | 108 |
| EX 1-119 | B-2 | $C_{60}$/A-10 | 0.4 | A | A | 1.62 | 1.63 | 109 | 108 |
| EX 1-120 | B-3 | $C_{60}$/A-10 | 0.4 | A | A | 1.76 | 1.76 | 109 | 109 |
| EX 1-121 | B-4 | $C_{60}$/A-10 | 0.4 | A | A | 1.54 | 1.56 | 102 | 101 |
| EX 1-122 | B-5 | $C_{60}$/A-10 | 0.4 | A | A | 1.78 | 1.79 | 104 | 104 |
| EX 1-123 | B-6 | $C_{60}$/A-10 | 0.4 | A | A | 1.88 | 1.9 | 108 | 109 |
| EX 1-124 | B-7 | $C_{60}$/A-10 | 0.4 | A | A | 1.72 | 1.95 | 103 | 99 |
| EX 1-125 | B-8 | $C_{60}$/A-10 | 0.4 | A | A | 2.03 | 2.1 | 107 | 106 |
| EX 1-126 | B-9 | $C_{60}$/A-10 | 0.4 | A | A | 5.21 | 5.09 | 108 | 109 |
| EX 1-127 | B-10 | $C_{60}$/A-10 | 0.4 | A | A | 1.77 | 1.8 | 101 | 100 |
| EX 1-128 | B-11 | $C_{60}$/A-10 | 0.4 | A | A | 1.9 | 1.92 | 104 | 104 |
| EX 1-129 | B-12 | $C_{60}$/A-10 | 0.4 | A | A | 1.99 | 1.89 | 108 | 109 |
| EX 1-130 | B-13 | $C_{60}$/A-10 | 0.4 | A | A | 1.76 | 1.79 | 105 | 106 |
| EX 1-131 | B-1 | $C_{60}$/A-11 | 0.4 | C | A | 1.19 | 1.21 | 75 | 75 |
| EX 1-132 | B-2 | $C_{60}$/A-11 | 0.4 | C | A | 1.23 | 1.25 | 75 | 76 |
| EX 1-133 | B-3 | $C_{60}$/A-11 | 0.4 | C | A | 1.33 | 1.3 | 76 | 76 |
| EX 1-134 | B-4 | $C_{60}$/A-11 | 0.4 | C | A | 1.23 | 1.26 | 70 | 71 |
| EX 1-135 | B-5 | $C_{60}$/A-11 | 0.4 | C | A | 1.42 | 1.44 | 73 | 72 |
| EX 1-136 | B-6 | $C_{60}$/A-11 | 0.4 | C | A | 1.4 | 1.38 | 73 | 73 |
| EX 1-137 | B-7 | $C_{60}$/A-11 | 0.4 | C | A | 1.35 | 1.52 | 72 | 68 |
| EX 1-138 | B-8 | $C_{60}$/A-11 | 0.4 | C | A | 1.62 | 1.66 | 75 | 74 |
| EX 1-139 | B-9 | $C_{60}$/A-11 | 0.4 | C | A | 4.98 | 5.32 | 76 | 77 |
| EX 1-140 | B-10 | $C_{60}$/A-11 | 0.4 | C | A | 1.55 | 1.58 | 72 | 71 |
| EX 1-141 | B-11 | $C_{60}$/A-11 | 0.4 | C | A | 1.76 | 1.77 | 73 | 72 |
| EX 1-142 | B-12 | $C_{60}$/A-11 | 0.4 | C | A | 1.63 | 1.65 | 76 | 75 |
| EX 1-143 | B-13 | $C_{60}$/A-11 | 0.4 | C | A | 1.59 | 1.57 | 72 | 72 |
| EX 1-144 | B-1 | $C_{60}$/A-1 | 2 | A | A | 0.87 | 0.88 | 108 | 109 |

TABLE 1-continued

| | Material of electron-blocking layer | Material of photoelectric conversion layer | Vapor deposition rate of photo-electric conversion dye (Å/s) | Thin-film absorption maximum wavelength | Glass transition point of electron-blocking layer | Dark current value (relative value) | Dark current value after heating to 210° C. (relative value) | Photo-electric conversion efficiency (relative value) | Photoelectric conversion efficiency after heating to 210° C. (relative value) |
|---|---|---|---|---|---|---|---|---|---|
| EX 1-145 | B-2 | $C_{60}$/A-1 | 2 | A | A | 0.88 | 0.88 | 109 | 109 |
| EX 1-146 | B-3 | $C_{60}$/A-1 | 2 | A | A | 0.9 | 0.89 | 109 | 108 |
| EX 1-147 | B-4 | $C_{60}$/A-1 | 2 | A | A | 0.92 | 0.92 | 104 | 105 |
| EX 1-148 | B-5 | $C_{60}$/A-1 | 2 | A | A | 1.03 | 1.06 | 105 | 106 |
| EX 1-149 | B-6 | $C_{60}$/A-1 | 2 | A | A | 1.41 | 1.38 | 109 | 109 |
| EX 1-150 | B-7 | $C_{60}$/A-1 | 2 | A | A | 1.2 | 1.43 | 105 | 102 |
| EX 1-151 | B-8 | $C_{60}$/A-1 | 2 | A | A | 1.45 | 1.42 | 107 | 106 |
| EX 1-152 | B-9 | $C_{60}$/A-1 | 2 | A | A | 2.25 | 2.29 | 108 | 109 |
| EX 1-153 | B-10 | $C_{60}$/A-1 | 2 | A | A | 0.95 | 0.96 | 103 | 102 |
| EX 1-154 | B-11 | $C_{60}$/A-1 | 2 | A | A | 1.1 | 1.11 | 105 | 104 |
| EX 1-155 | B-12 | $C_{60}$/A-1 | 2 | A | A | 0.97 | 0.95 | 108 | 109 |
| EX 1-156 | B-13 | $C_{60}$/A-1 | 2 | A | A | 0.9 | 0.92 | 102 | 104 |
| EX 1-157 | B-1 | $C_{60}$/A-4 | 2 | A | A | 0.75 | 0.76 | 118 | 117 |
| EX 1-158 | B-2 | $C_{60}$/A-4 | 2 | A | A | 0.77 | 0.77 | 117 | 117 |
| EX 1-159 | B-3 | $C_{60}$/A-4 | 2 | A | A | 0.8 | 0.8 | 118 | 118 |
| EX 1-160 | B-4 | $C_{60}$/A-4 | 2 | A | A | 0.75 | 0.76 | 112 | 114 |
| EX 1-161 | B-5 | $C_{60}$/A-4 | 2 | A | A | 0.94 | 0.95 | 115 | 116 |
| EX 1-162 | B-6 | $C_{60}$/A-4 | 2 | A | A | 0.98 | 0.97 | 118 | 117 |
| EX 1-163 | B-7 | $C_{60}$/A-4 | 2 | A | A | 0.88 | 1.01 | 113 | 108 |
| EX 1-164 | B-8 | $C_{60}$/A-4 | 2 | A | A | 1.35 | 1.37 | 117 | 116 |
| EX 1-165 | B-9 | $C_{60}$/A-4 | 2 | A | A | 2.3 | 2.33 | 118 | 119 |
| EX 1-166 | B-10 | $C_{60}$/A-4 | 2 | A | A | 0.95 | 0.95 | 113 | 114 |
| EX 1-167 | B-11 | $C_{60}$/A-4 | 2 | A | A | 1.25 | 1.23 | 112 | 112 |
| EX 1-168 | B-12 | $C_{60}$/A-4 | 2 | A | A | 0.95 | 0.96 | 118 | 118 |
| EX 1-169 | B-13 | $C_{60}$/A-4 | 2 | A | A | 0.88 | 0.89 | 113 | 114 |
| EX 1-170 | B-1 | $C_{60}$/A-5 | 2 | A | A | 1.13 | 1.15 | 103 | 102 |
| EX 1-171 | B-2 | $C_{60}$/A-5 | 2 | A | A | 1.15 | 1.16 | 102 | 102 |
| EX 1-172 | B-3 | $C_{60}$/A-5 | 2 | A | A | 1.16 | 1.18 | 102 | 103 |
| EX 1-173 | B-4 | $C_{60}$/A-5 | 2 | A | A | 1.19 | 1.19 | 96 | 96 |
| EX 1-174 | B-5 | $C_{60}$/A-5 | 2 | A | A | 1.38 | 1.4 | 98 | 97 |
| EX 1-175 | B-6 | $C_{60}$/A-5 | 2 | A | A | 1.45 | 1.46 | 102 | 101 |
| EX 1-176 | B-7 | $C_{60}$/A-5 | 2 | A | A | 1.23 | 1.43 | 97 | 95 |
| EX 1-177 | B-8 | $C_{60}$/A-5 | 2 | A | A | 1.5 | 1.5 | 101 | 100 |
| EX 1-178 | B-9 | $C_{60}$/A-5 | 2 | A | A | 2.55 | 2.49 | 102 | 101 |
| EX 1-179 | B-10 | $C_{60}$/A-5 | 2 | A | A | 1.48 | 1.46 | 98 | 97 |
| EX 1-180 | B-11 | $C_{60}$/A-5 | 2 | A | A | 1.62 | 1.63 | 99 | 99 |
| EX 1-181 | B-12 | $C_{60}$/A-5 | 2 | A | A | 1.25 | 1.23 | 102 | 101 |
| EX 1-182 | B-13 | $C_{60}$/A-5 | 2 | A | A | 1.19 | 1.21 | 100 | 99 |
| EX 1-183 | B-1 | $C_{60}$/A-6 | 2 | A | A | 0.85 | 0.86 | 119 | 120 |
| EX 1-184 | B-2 | $C_{60}$/A-6 | 2 | A | A | 0.86 | 0.87 | 119 | 119 |
| EX 1-185 | B-3 | $C_{60}$/A-6 | 2 | A | A | 0.88 | 0.88 | 120 | 120 |
| EX 1-186 | B-4 | $C_{60}$/A-6 | 2 | A | A | 0.99 | 0.98 | 110 | 109 |
| EX 1-187 | B-5 | $C_{60}$/A-6 | 2 | A | A | 1.18 | 1.17 | 111 | 112 |
| EX 1-188 | B-6 | $C_{60}$/A-6 | 2 | A | A | 1.13 | 1.12 | 118 | 119 |
| EX 1-189 | B-7 | $C_{60}$/A-6 | 2 | A | A | 1.09 | 1.29 | 113 | 110 |
| EX 1-190 | B-8 | $C_{60}$/A-6 | 2 | A | A | 1.39 | 1.37 | 118 | 117 |
| EX 1-191 | B-9 | $C_{60}$/A-6 | 2 | A | A | 2.5 | 2.45 | 120 | 121 |
| EX 1-192 | B-10 | $C_{60}$/A-6 | 2 | A | A | 0.94 | 0.93 | 107 | 108 |
| EX 1-193 | B-11 | $C_{60}$/A-6 | 2 | A | A | 1.5 | 1.52 | 112 | 113 |
| EX 1-194 | B-12 | $C_{60}$/A-6 | 2 | A | A | 0.96 | 0.96 | 118 | 119 |
| EX 1-195 | B-13 | $C_{60}$/A-6 | 2 | A | A | 0.89 | 0.88 | 106 | 107 |
| EX 1-196 | B-1 | $C_{60}$/A-8 | 2 | A | A | 0.88 | 1.05 | 117 | 113 |
| EX 1-197 | B-2 | $C_{60}$/A-8 | 2 | A | A | 0.89 | 1.08 | 117 | 112 |
| EX 1-198 | B-3 | $C_{60}$/A-8 | 2 | A | A | 0.9 | 1.11 | 118 | 115 |
| EX 1-199 | B-4 | $C_{60}$/A-8 | 2 | A | A | 0.95 | 1.16 | 108 | 105 |
| EX 1-200 | B-5 | $C_{60}$/A-8 | 2 | A | A | 1.2 | 1.42 | 109 | 105 |
| EX 1-201 | B-6 | $C_{60}$/A-8 | 2 | A | A | 1.22 | 1.43 | 116 | 112 |
| EX 1-202 | B-7 | $C_{60}$/A-8 | 2 | A | A | 1.23 | 1.52 | 115 | 112 |
| EX 1-203 | B-8 | $C_{60}$/A-8 | 2 | A | A | 1.29 | 1.5 | 115 | 113 |
| EX 1-204 | B-9 | $C_{60}$/A-8 | 2 | A | A | 3.11 | 3.65 | 118 | 114 |
| EX 1-205 | B-10 | $C_{60}$/A-8 | 2 | A | A | 1.22 | 1.45 | 106 | 104 |
| EX 1-206 | B-11 | $C_{60}$/A-8 | 2 | A | A | 1.38 | 1.59 | 108 | 107 |
| EX 1-207 | B-12 | $C_{60}$/A-8 | 2 | A | A | 1.1 | 1.32 | 116 | 113 |
| EX 1-208 | B-13 | $C_{60}$/A-8 | 2 | A | A | 0.99 | 1.2 | 113 | 111 |
| EX 1-209 | B-1 | $C_{60}$/A-10 | 2 | A | A | 1.38 | 1.47 | 115 | 115 |
| EX 1-210 | B-2 | $C_{60}$/A-10 | 2 | A | A | 1.42 | 1.44 | 114 | 115 |
| EX 1-211 | B-3 | $C_{60}$/A-10 | 2 | A | A | 1.44 | 1.45 | 115 | 115 |
| EX 1-212 | B-4 | $C_{60}$/A-10 | 2 | A | A | 1.4 | 1.41 | 107 | 107 |
| EX 1-213 | B-5 | $C_{60}$/A-10 | 2 | A | A | 1.62 | 1.63 | 109 | 109 |
| EX 1-214 | B-6 | $C_{60}$/A-10 | 2 | A | A | 1.69 | 1.7 | 114 | 114 |
| EX 1-215 | B-7 | $C_{60}$/A-10 | 2 | A | A | 1.59 | 1.77 | 107 | 103 |
| EX 1-216 | B-8 | $C_{60}$/A-10 | 2 | A | A | 1.79 | 1.76 | 113 | 114 |

TABLE 1-continued

| | Material of electron-blocking layer | Material of photoelectric conversion layer | Vapor deposition rate of photo-electric conversion dye (Å/s) | Thin-film absorption maximum wavelength | Glass transition point of electron-blocking layer | Dark current value (relative value) | Dark current value after heating to 210° C. (relative value) | Photo-electric conversion efficiency (relative value) | Photoelectric conversion efficiency after heating to 210° C. (relative value) |
|---|---|---|---|---|---|---|---|---|---|
| EX 1-217 | B-9 | C$_{60}$/A-10 | 2 | A | A | 3.89 | 3.94 | 117 | 116 |
| EX 1-218 | B-10 | C$_{60}$/A-10 | 2 | A | A | 1.58 | 1.56 | 108 | 107 |
| EX 1-219 | B-11 | C$_{60}$/A-10 | 2 | A | A | 1.77 | 1.75 | 112 | 113 |
| EX 1-220 | B-12 | C$_{60}$/A-10 | 2 | A | A | 1.85 | 1.82 | 114 | 115 |
| EX 1-221 | B-13 | C$_{60}$/A-10 | 2 | A | A | 1.44 | 1.45 | 110 | 111 |
| EX 1-222 | B-1 | C$_{60}$/A-11 | 2 | C | A | 1 | 1.01 | 80 | 81 |
| EX 1-223 | B-2 | C$_{60}$/A-11 | 2 | C | A | 1.03 | 1.03 | 80 | 80 |
| EX 1-224 | B-3 | C$_{60}$/A-11 | 2 | C | A | 1.11 | 1.14 | 80 | 80 |
| EX 1-225 | B-4 | C$_{60}$/A-11 | 2 | C | A | 1.05 | 1.06 | 76 | 74 |
| EX 1-226 | B-5 | C$_{60}$/A-11 | 2 | C | A | 1.25 | 1.26 | 76 | 77 |
| EX 1-227 | B-6 | C$_{60}$/A-11 | 2 | C | A | 1.25 | 1.25 | 77 | 78 |
| EX 1-228 | B-7 | C$_{60}$/A-11 | 2 | C | A | 1.21 | 1.43 | 74 | 72 |
| EX 1-229 | B-8 | C$_{60}$/A-11 | 2 | C | A | 1.44 | 1.44 | 79 | 78 |
| EX 1-230 | B-9 | C$_{60}$/A-11 | 2 | C | A | 3.33 | 3.58 | 80 | 80 |
| EX 1-231 | B-10 | C$_{60}$/A-11 | 2 | C | A | 1.34 | 1.36 | 75 | 76 |
| EX 1-232 | B-11 | C$_{60}$/A-11 | 2 | C | A | 1.54 | 1.53 | 76 | 76 |
| EX 1-233 | B-12 | C$_{60}$/A-11 | 2 | C | A | 1.5 | 1.52 | 79 | 79 |
| EX 1-234 | B-13 | C$_{60}$/A-11 | 2 | C | A | 1.38 | 1.41 | 75 | 74 |
| CE 1-1 | B-1 | C$_{60}$/C-1 | 0.4 | A | A | 1.35 | 2.56 | 102 | 78 |
| CE 1-2 | B-2 | C$_{60}$/C-1 | 0.4 | A | A | 1.38 | 2.66 | 102 | 75 |
| CE 1-3 | B-3 | C$_{60}$/C-1 | 0.4 | A | A | 1.4 | 2.69 | 103 | 81 |
| CE 1-4 | B-4 | C$_{60}$/C-1 | 0.4 | A | A | 1.41 | 2.8 | 94 | 72 |
| CE 1-5 | B-5 | C$_{60}$/C-1 | 0.4 | A | A | 1.75 | 3.63 | 98 | 77 |
| CE 1-6 | B-6 | C$_{60}$/C-1 | 0.4 | A | A | 1.73 | 3.17 | 100 | 78 |
| CE 1-7 | B-7 | C$_{60}$/C-1 | 0.4 | A | A | 1.7 | 4.2 | 96 | 69 |
| CE 1-8 | B-8 | C$_{60}$/C-1 | 0.4 | A | A | 1.93 | 4.02 | 101 | 80 |
| CE 1-9 | B-9 | C$_{60}$/C-1 | 0.4 | A | A | 5.24 | 13.9 | 102 | 93 |
| CE 1-10 | B-10 | C$_{60}$/C-1 | 0.4 | A | A | 1.77 | 4.14 | 93 | 74 |
| CE 1-11 | B-11 | C$_{60}$/C-1 | 0.4 | A | A | 2.01 | 4.22 | 95 | 74 |
| CE 1-12 | B-12 | C$_{60}$/C-1 | 0.4 | A | A | 1.55 | 2.88 | 101 | 83 |
| CE 1-13 | B-13 | C$_{60}$/C-1 | 0.4 | A | A | 1.49 | 2.32 | 99 | 79 |
| CE 1-14 | B-1 | C$_{60}$/C-2 | 0.4 | A | A | 1.39 | 2.88 | 109 | 83 |
| CE 1-15 | B-2 | C$_{60}$/C-2 | 0.4 | A | A | 1.4 | 2.69 | 109 | 80 |
| CE 1-16 | B-3 | C$_{60}$/C-2 | 0.4 | A | A | 1.56 | 2.98 | 110 | 86 |
| CE 1-17 | B-4 | C$_{60}$/C-2 | 0.4 | A | A | 1.43 | 3.04 | 99 | 73 |
| CE 1-18 | B-5 | C$_{60}$/C-2 | 0.4 | A | A | 1.78 | 3.85 | 106 | 81 |
| CE 1-19 | B-6 | C$_{60}$/C-2 | 0.4 | A | A | 1.85 | 3.92 | 107 | 85 |
| CE 1-20 | B-7 | C$_{60}$/C-2 | 0.4 | A | A | 1.78 | 4.35 | 102 | 71 |
| CE 1-21 | B-8 | C$_{60}$/C-2 | 0.4 | A | A | 1.99 | 4.17 | 104 | 76 |
| CE 1-22 | B-9 | C$_{60}$/C-2 | 0.4 | A | A | 5.18 | 12 | 109 | 86 |
| CE 1-23 | B-10 | C$_{60}$/C-2 | 0.4 | A | A | 1.84 | 4.08 | 102 | 78 |
| CE 1-24 | B-11 | C$_{60}$/C-2 | 0.4 | A | A | 2.25 | 4.85 | 100 | 76 |
| CE 1-25 | B-12 | C$_{60}$/C-2 | 0.4 | A | A | 1.56 | 3.2 | 108 | 85 |
| CE 1-26 | B-13 | C$_{60}$/C-2 | 0.4 | A | A | 1.5 | 3.32 | 105 | 83 |
| CE 1-27 | B-1 | C$_{60}$/C-3 | 0.4 | B | A | 5.33 | 30.3 | 102 | 56 |
| CE 1-28 | B-4 | C$_{60}$/C-3 | 0.4 | B | A | 5.02 | 29.8 | 86 | 50 |
| CE 1-29 | B-6 | C$_{60}$/C-3 | 0.4 | B | A | 7.46 | 46.3 | 89 | 55 |
| CE 1-30 | B-8 | C$_{60}$/C-3 | 0.4 | B | A | 10.3 | 76.8 | 91 | 46 |
| CE 1-31 | B-10 | C$_{60}$/C-3 | 0.4 | B | A | 7.6 | 43.5 | 90 | 46 |
| CE 1-32 | B-1 | C$_{60}$/C-4 | 0.4 | C | A | 6.9 | 25.3 | 43 | 20 |
| CE 1-33 | B-2 | C$_{60}$/C-4 | 0.4 | C | A | 6.24 | 38.7 | 40 | 18 |
| CE 1-34 | B-5 | C$_{60}$/C-4 | 0.4 | C | A | 5.37 | 38.3 | 44 | 17 |
| CE 1-35 | B-7 | C$_{60}$/C-4 | 0.4 | C | A | 7.65 | 51.7 | 39 | 17 |
| CE 1-36 | B-9 | C$_{60}$/C-4 | 0.4 | C | A | 16.3 | 135 | 46 | 32 |
| CE 1-37 | B-11 | C$_{60}$/C-4 | 0.4 | C | A | 6.92 | 58 | 39 | 19 |
| CE 1-38 | B-1 | C$_{60}$/C-5 | 0.4 | A | A | 10.5 | 18.6 | 22 | 18 |
| CE 1-39 | B-3 | C$_{60}$/C-5 | 0.4 | A | A | 9.8 | 17.6 | 20 | 17 |
| CE 1-40 | B-4 | C$_{60}$/C-5 | 0.4 | A | A | 8.9 | 19 | 19 | 15 |
| CE 1-41 | B-6 | C$_{60}$/C-5 | 0.4 | A | A | 13.2 | 19.1 | 20 | 16 |
| CE 1-42 | B-9 | C$_{60}$/C-5 | 0.4 | A | A | 26.2 | 38.4 | 21 | 18 |
| CE 1-43 | B-12 | C$_{60}$/C-5 | 0.4 | A | A | 10 | 17.6 | 20 | 16 |
| CE 1-44 | B-1 | C$_{60}$/C-6 | 0.4 | A | A | 5.9 | 8.22 | 46 | 42 |
| CE 1-45 | B-2 | C$_{60}$/C-6 | 0.4 | A | A | 5.32 | 7.68 | 45 | 40 |
| CE 1-46 | B-5 | C$_{60}$/C-6 | 0.4 | A | A | 8.33 | 11.7 | 44 | 40 |
| CE 1-47 | B-8 | C$_{60}$/C-6 | 0.4 | A | A | 7.78 | 10.6 | 42 | 37 |
| CE 1-48 | B-13 | C$_{60}$/C-6 | 0.4 | A | A | 6.35 | 11.1 | 40 | 35 |
| CE 1-49 | B-1 | C$_{60}$/C-7 | 0.4 | B | A | 0.86 | 2.32 | 89 | 73 |
| CE 1-50 | B-2 | C$_{60}$/C-7 | 0.4 | B | A | 0.88 | 2.43 | 88 | 70 |
| CE 1-51 | B-5 | C$_{60}$/C-7 | 0.4 | B | A | 1.12 | 2.99 | 91 | 70 |
| CE 1-52 | B-7 | C$_{60}$/C-7 | 0.4 | B | A | 1.13 | 3.11 | 88 | 72 |
| CE 1-53 | B-9 | C$_{60}$/C-7 | 0.4 | B | A | 2.14 | 5.76 | 92 | 73 |
| CE 1-54 | B-1 | C$_{60}$/C-8 | 0.4 | A | A | 0.99 | 5.09 | 96 | 63 |

TABLE 1-continued

| | Material of electron-blocking layer | Material of photoelectric conversion layer | Vapor deposition rate of photoelectric conversion dye (Å/s) | Thin-film absorption maximum wavelength | Glass transition point of electron-blocking layer | Dark current value (relative value) | Dark current value after heating to 210° C. (relative value) | Photoelectric conversion efficiency (relative value) | Photoelectric conversion efficiency after heating to 210° C. (relative value) |
|---|---|---|---|---|---|---|---|---|---|
| CE 1-55 | B-3 | $C_{60}/C$-8 | 0.4 | A | A | 0.99 | 5.38 | 95 | 60 |
| CE 1-56 | B-6 | $C_{60}/C$-8 | 0.4 | A | A | 1.63 | 8.67 | 93 | 61 |
| CE 1-57 | B-11 | $C_{60}/C$-8 | 0.4 | A | A | 1.3 | 7.34 | 88 | 56 |
| CE 1-58 | B-13 | $C_{60}/C$-8 | 0.4 | A | A | 1.28 | 7.33 | 90 | 58 |
| CE 1-59 | D-1 | $C_{60}/A$-1 | 0.4 | A | A | 2.3 | 4.62 | 44 | 38 |
| CE 1-60 | D-2 | $C_{60}/A$-1 | 0.4 | A | A | 0.89 | 2.21 | 39 | 30 |
| CE 1-61 | D-1 | $C_{60}/A$-4 | 0.4 | A | A | 2.52 | 4.88 | 49 | 40 |
| CE 1-62 | D-2 | $C_{60}/A$-4 | 0.4 | A | A | 1.22 | 2.35 | 42 | 38 |
| CE 1-63 | D-1 | $C_{60}/A$-5 | 0.4 | A | A | 3.57 | 5.94 | 38 | 34 |
| CE 1-64 | D-2 | $C_{60}/A$-5 | 0.4 | A | A | 1.68 | 2.76 | 35 | 31 |
| CE 1-65 | D-1 | $C_{60}/A$-6 | 0.4 | A | A | 2.66 | 4.03 | 45 | 35 |
| CE 1-66 | D-2 | $C_{60}/A$-6 | 0.4 | A | A | 1.35 | 2.63 | 40 | 33 |
| CE 1-67 | D-1 | $C_{60}/A$-10 | 0.4 | A | A | 3.99 | 6.87 | 42 | 31 |
| CE 1-68 | D-2 | $C_{60}/A$-10 | 0.4 | A | A | 3.2 | 5.87 | 39 | 33 |
| CE 1-69 | D-1 | $C_{60}/A$-11 | 0.4 | C | A | 3.87 | 6.53 | 31 | 28 |
| CE 1-70 | D-2 | $C_{60}/A$-11 | 0.4 | C | A | 1.63 | 5.64 | 30 | 28 |
| CE 1-71 | E-1 | $C_{60}/A$-1 | 0.4 | A | C | 0.98 | 6.68 | 91 | 58 |
| CE 1-72 | E-2 | $C_{60}/A$-1 | 0.4 | A | B | 5.84 | 12.6 | 89 | 55 |
| CE 1-73 | E-1 | $C_{60}/A$-3 | 0.4 | A | C | 2.85 | 7.68 | 87 | 52 |
| CE 1-74 | E-2 | $C_{60}/A$-3 | 0.4 | A | B | 7.84 | 15.9 | 85 | 48 |
| CE 1-75 | E-1 | $C_{60}/A$-4 | 0.4 | A | C | 1.35 | 5.88 | 88 | 51 |
| CE 1-76 | E-2 | $C_{60}/A$-4 | 0.4 | A | B | 4.61 | 12.7 | 83 | 43 |
| CE 1-77 | E-1 | $C_{60}/A$-7 | 0.4 | A | C | 1.62 | 6.37 | 85 | 53 |
| CE 1-78 | E-2 | $C_{60}/A$-7 | 0.4 | A | B | 5.07 | 10.3 | 82 | 50 |
| CE 1-79 | E-1 | $C_{60}/A$-9 | 0.4 | B | C | 1.63 | 8.33 | 80 | 43 |
| CE 1-80 | E-2 | $C_{60}/A$-9 | 0.4 | B | B | 8.35 | 25.7 | 80 | 49 |
| CE 1-81 | B-3 | $C_{60}/C$-1 | 2 | A | A | 1.52 | 3.07 | 101 | 80 |
| CE 1-82 | B-4 | $C_{60}/C$-1 | 2 | A | A | 1.67 | 3.22 | 94 | 70 |
| CE 1-83 | B-1 | $C_{60}/C$-2 | 2 | A | A | 1.6 | 3.31 | 108 | 82 |
| CE 1-84 | B-2 | $C_{60}/C$-2 | 2 | A | A | 1.59 | 2.97 | 109 | 80 |
| CE 1-85 | B-6 | $C_{60}/C$-3 | 2 | B | A | 8.65 | 60.5 | 88 | 53 |
| CE 1-86 | B-8 | $C_{60}/C$-3 | 2 | B | A | 11.3 | 86 | 91 | 44 |
| CE 1-87 | B-11 | $C_{60}/C$-4 | 2 | C | A | 7.92 | 76 | 38 | 16 |
| CE 1-88 | B-12 | $C_{60}/C$-5 | 2 | A | A | 11.3 | 24.2 | 19 | 14 |
| CE 1-89 | B-13 | $C_{60}/C$-6 | 2 | A | A | 7.32 | 12.8 | 40 | 33 |
| CE 1-90 | B-9 | $C_{60}/C$-7 | 2 | B | A | 2.97 | 7.65 | 90 | 71 |
| CE 1-91 | B-1 | $C_{60}/C$-8 | 2 | A | A | 1.38 | 6.76 | 93 | 61 |
| CE 1-92 | D-1 | $C_{60}/A$-4 | 2 | A | A | 2.87 | 5.36 | 47 | 38 |
| CE 1-93 | D-2 | $C_{60}/A$-4 | 2 | A | A | 1.49 | 2.63 | 40 | 38 |
| CE 1-94 | E-1 | $C_{60}/A$-9 | 2 | B | C | 1.88 | 9.85 | 78 | 42 |
| CE 1-95 | E-2 | $C_{60}/A$-9 | 2 | B | B | 9.34 | 28.3 | 78 | 45 |

As is clear from Table 1, it was confirmed that, as compared to Comparative Examples 1-1 to 1-58 in which dyes other than the condensed polycyclic hydrocarbons (e.g., arylamine dyes) were used as the photoelectric conversion dyes, in Examples 1-1 to 1-143, the photoelectric conversion elements themselves have excellent photoelectric conversion efficiency and dark current characteristics, the increase in dark current and the decrease in photoelectric conversion efficiency after heating the elements are suppressed, and the photoelectric conversion elements have high heat resistance.

As shown in Comparative Examples 1-59 to 1-80, the photoelectric conversion elements each including the electron-blocking layer in which the predetermined compound A was not used were inferior in the photoelectric conversion efficiency or dark current characteristics of the photoelectric conversion elements themselves, or in heat resistance.

It was confirmed that, as compared to Examples 1-1 to 1-143, in Examples 1-144 to 1-234 in which the vapor deposition rate to form the photoelectric conversion layer was increased, the dark current decreases, the photoelectric conversion efficiency increases, and the elements themselves have improved performance.

On the other hand, in Comparative Examples 1-81 to 1-95 in which the photoelectric conversion layer was formed at the same vapor deposition rate as that in Examples 1-144 to 1-234, the photoelectric conversion elements showed poorer characteristics (photoelectric conversion efficiency, dark current characteristics) at higher vapor deposition rates.

The comparison between Examples 1-92 to 1-104 in which the total number of rings of each condensed polycyclic hydrocarbon was 6 and the other Examples in which the total number of rings of each condensed polycyclic hydrocarbon was 7 showed that the dark current characteristics and photoelectric conversion characteristics were less deteriorated after heating in the other Examples compared to before heating. In view of this, it was confirmed that the effects of the invention are more excellent in cases where the total number of rings of the condensed polycyclic hydrocarbon is 7 or more.

The comparison between Examples 1-1 to 1-143 showed that the photoelectric conversion elements had more excellent characteristics (photoelectric conversion efficiency, dark current characteristics) in the embodiments in which B-1 to B-6, B-8 and B-10 to B-13 were used. In view of this, it was confirmed that the photoelectric conversion elements have more excellent characteristics when the compound represented by general formula (F-1), general formula (F-2) or general formula (F-5) is used as the compound A.

The comparison between Examples 1-1 to 1-143 confirmed that the photoelectric conversion elements have more excellent photoelectric conversion efficiency when the thin-film absorption maximum wavelength is a predetermined value or more.

An image sensor of the same form as shown in FIG. 2 was further prepared. More specifically, amorphous TiN was deposited on a CMOS substrate to a thickness of 30 nm by sputtering to form a film, and the film was patterned by photolithography so that one pixel may exist on each photodiode (PD) on the CMOS substrate to form the lower electrode. Examples 1-1 to 1-234 were repeated to form the electron-blocking layer and its overlying films. The evaluation was made in the same manner and the same results as shown in Table 1 were obtained. It was also shown that the image sensor is suitable to manufacture and has excellent performance.

What is claimed is:

1. A photoelectric conversion element comprising: a transparent conductive film, a conductive film, and a photoelectric conversion layer and an electron-blocking layer disposed between the transparent conductive film and the conductive film, wherein the photoelectric conversion layer comprises a condensed polycyclic hydrocarbon which contains at least 5 benzene rings, of which a total number of rings is 6 or more and which contains no carbonyl group, and wherein the condensed polycyclic hydrocarbon comprises a condensed polycyclic hydrocarbon represented by any one of general formulae (1) to (8), (13), (14), (16), and (17):

General formula (1)

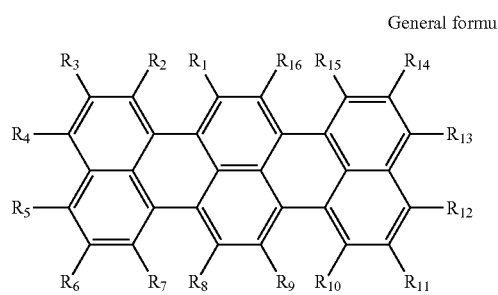

General formula (2)

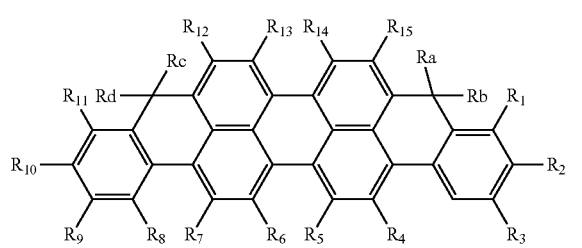

General formula (3)

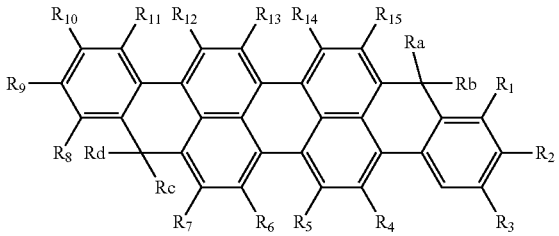

General formula (4)

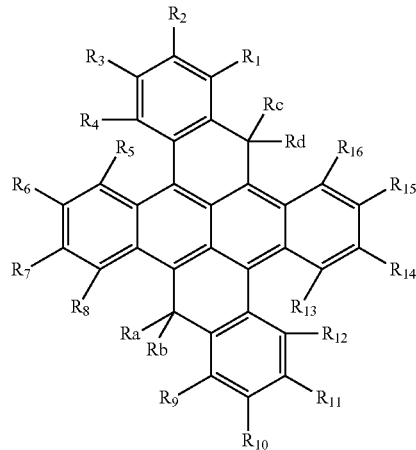

General formula (5)

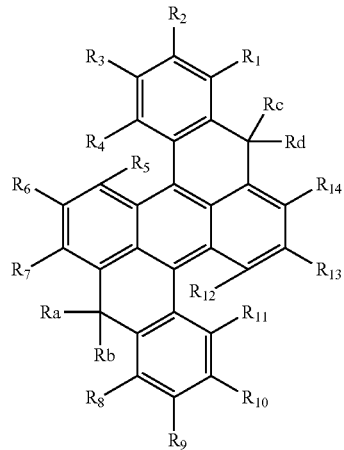

General formula (6)

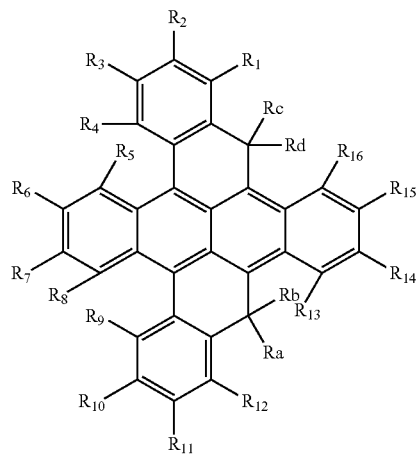

General formula (7)

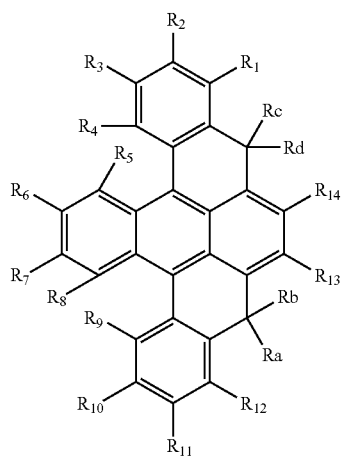

General formula (8)

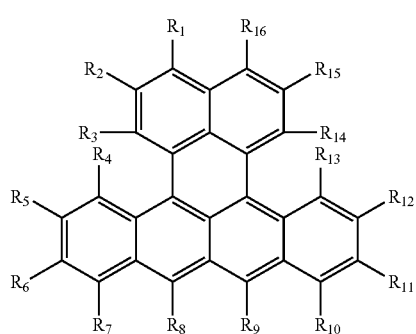

General formula (13)

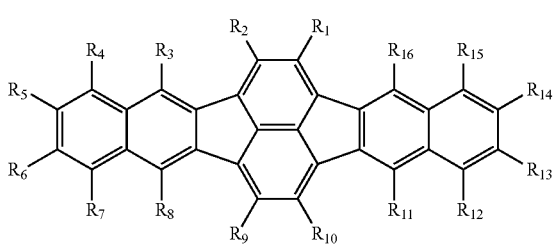

General formula (14)

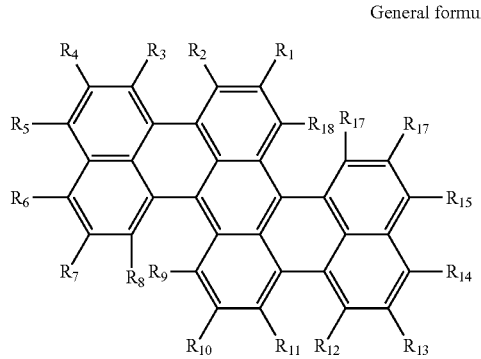

General formula (16)

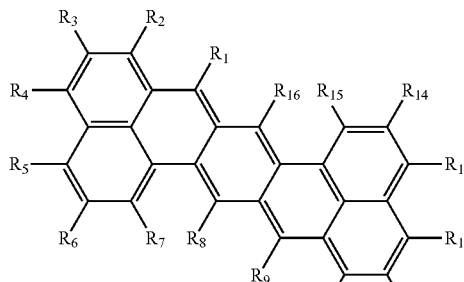

General formula (17)

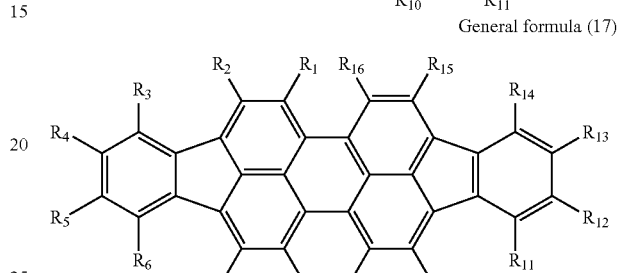

(in general formulae (1), (8), (13), (16) and (17), $R_1$ to $R_{16}$ each independently represent a hydrogen atom or a substituent;
in general formulae (2) and (3), $R_1$ to $R_{15}$ and $R_a$ to $R_d$ each independently represent a hydrogen atom or a substituent;
in general formulae (4) and (6), $R_1$ to $R_{16}$ and $R_a$ to $R_d$ each independently represent a hydrogen atom or a substituent;
in general formulae (5) and (7), $R_1$ to $R_{14}$ and $R_a$ to $R_d$ each independently represent a hydrogen atom or a substituent;
in general formula (14), $R_1$ to $R_{18}$ each independently represent a hydrogen atom or a substituent), and
wherein the electron-blocking layer comprises a compound A including a residue after removal of at least one group of $Ra_1$ to $Ra_9$ from a compound represented by general formula (A):

General formula (A)

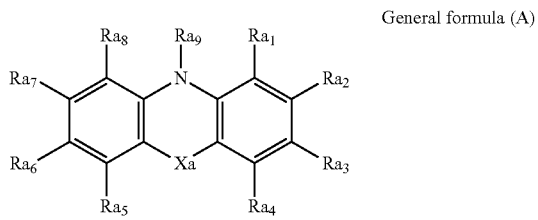

(in general formula (A), $Ra_1$ to $Ra_8$ each independently represent a hydrogen atom, a halogen atom, an alkyl group, an aryl group or a heterocyclic group, which may further have a substituent; $R_{a9}$ represents an alkyl group, an aryl group or a heterocyclic group, which may further have a substituent; and Xa represents a single bond, an oxygen atom, a sulfur atom, an alkylene group, a dialkylsilylene group, an alkenylene group, a cycloalkylene group, a cycloalkenylene group, an arylene group, a divalent heterocyclic group or an imino group, which may further have a substituent) and having a glass transition point (Tg) of 200° C. or more.

2. The photoelectric conversion element according to claim 1, wherein the compound A comprises a compound represented by general formula (F-1), general formula (F-2) or general formula (F-5):

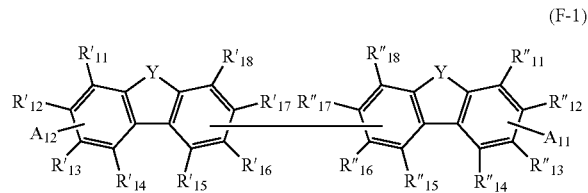

(F-1)

(in general formula (F-1), $R''_{11}$ to $R''_{18}$ and $R'_{11}$ to $R'_{18}$ each independently represent a hydrogen atom, a halogen atom, an alkyl group, an aryl group, a heterocyclic group, a hydroxyl group, an amino group or a mercapto group, which may further have a substituent; any one of $R''_{15}$ to $R''_{18}$ is combined with any one of $R'_{15}$ to $R'_{18}$ to form a single bond; $A_{11}$ and $A_{12}$ each independently represent a group represented by general formula (A-1) and are substituted for any one of $R''_{11}$ to $R''_{14}$ and any one of $R'_{11}$ to $R'_{14}$, respectively; and each Y independently represents a carbon atom, a nitrogen atom, an oxygen atom, a sulfur atom or a silicon atom, which may further have a substituent);

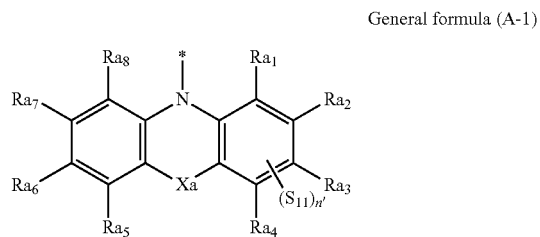

General formula (A-1)

(in general formula (A-1), $Ra_1$ to $Ra_8$ each independently represent a hydrogen atom, a halogen atom, an alkyl group, an aryl group or a heterocyclic group, which may further have a substituent; * represents a bonding position; Xa represents a single bond, an oxygen atom, a sulfur atom, an alkylene group, a dialkylsilylene group, an alkenylene group, a cycloalkylene group, a cycloalkenylene group, an arylene group, a divalent heterocyclic group or an imino group, which may further have a substituent; each $S_{11}$ independently represents a substituent ($S_{11}$) shown below and is substituted for any one of $Ra_1$ to $Ra_8$; and n' represents an integer of 0 to 4;

Substituent ($S_{11}$)

$R'_1$ to $R'_3$ each independently represent a hydrogen atom or an alkyl group);

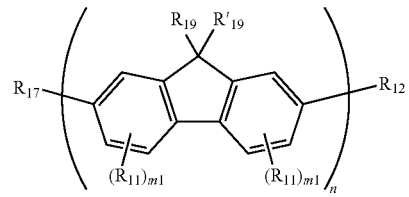

General formula (F-2)

(in general formula (F-2), each $R_{11}$ independently represents a halogen atom, an alkyl group, an aryl group, a heterocyclic group, a hydroxyl group, an amino group or a mercapto group; $R_{12}$, $R_{17}$, $R_{19}$ and $R'_{19}$ each independently represent a hydrogen atom, a halogen atom, an alkyl group, an aryl group, a heterocyclic group, a hydroxyl group, an amino group or a mercapto group, provided that at least one of $R_{12}$ and $R_{17}$ represents the group represented by general formula (A-1); $m_1$ represents an integer of 0 to 3; in cases where there are a plurality of $R_{11}$ groups, the $R_{11}$ groups may be different from each other;

n represents a number of recurring units in the parentheses; and n represents an integer of 1 to 4);

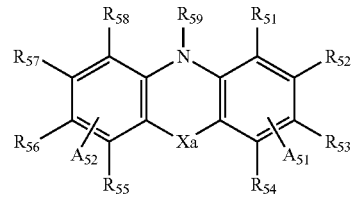

General formula (F-5)

(in general formula (F-5), $R_{51}$ to $R_{58}$ each independently represent a hydrogen atom, a halogen atom, an alkyl group, an aryl group, a heterocyclic group, a hydroxyl group, an amino group or a mercapto group; $R_{59}$ represents an alkyl group, an aryl group or a heterocyclic group; Xa represents a single bond, an oxygen atom, a sulfur atom, an alkylene group, a dialkylsilylene group, an alkenylene group, a cycloalkylene group, a cycloalkenylene group, an arylene group, a divalent heterocyclic group or an imino group; and $A_{51}$ and $A_{52}$ each independently represent the group represented by general formula (A-1) and are substituted for any one of $R_{51}$ to $R_{54}$ and any one of $R_{55}$ to $R_{58}$, respectively).

3. The photoelectric conversion element according to claim 1, wherein the photoelectric conversion layer further comprises a fullerene or a fullerene derivative.

4. The photoelectric conversion element according to claim 1, wherein the photoelectric conversion layer is formed by vacuum deposition.

5. The photoelectric conversion element according to claim 4, wherein a vapor deposition rate of the condensed polycyclic hydrocarbon is 1.0 angstrom/s or more.

6. The photoelectric conversion element according to claim 1, wherein the transparent conductive film comprises a transparent conductive metal oxide.

7. The photoelectric conversion element according to claim 1, wherein light is allowed to enter the photoelectric conversion layer through the transparent conductive film.

8. An image sensor comprising the photoelectric conversion element according to claim 1.

9. An optical sensor comprising the photoelectric conversion element according to claim 1.

10. A method of using the photoelectric conversion element according to claim 1, wherein the conductive film and the transparent conductive film form an electrode pair and an electric field of $1\times10^{-4}$ to $1\times10^{7}$ V/cm is applied across the electrode pair.

11. The photoelectric conversion element according to claim 2, wherein the photoelectric conversion layer further comprises a fullerene or a fullerene derivative.

* * * * *